(12) United States Patent
Otaguro et al.

(10) Patent No.: US 6,388,879 B1
(45) Date of Patent: May 14, 2002

(54) CIRCUIT BOARD PACKAGING STRUCTURE

(75) Inventors: Hiroyuki Otaguro; Takayuki Ashida; Hitoshi Yokemura; Hidenao Nakajima; Yoshimi Watanabe; Shuuhei Fujita, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 08/387,046

(22) Filed: Feb. 9, 1995

(30) Foreign Application Priority Data

Mar. 17, 1994 (JP) .............................................. 6-047436
Dec. 15, 1994 (JP) .............................................. 6-311414

(51) Int. Cl.⁷ ................................................ H05K 7/20
(52) U.S. Cl. ........................ 361/695; 62/259.2; 454/184
(58) Field of Search ........................ 62/259.2; 361/688, 361/690, 694–695, 715, 719–721, 736, 796; 454/184

(56) References Cited

U.S. PATENT DOCUMENTS

| | | | | |
|---|---|---|---|---|
| 4,931,904 A | * | 6/1990 | Yiu | 361/695 |
| 5,402,312 A | * | 3/1995 | Kinjo et al. | 361/695 |

FOREIGN PATENT DOCUMENTS

| | | | | |
|---|---|---|---|---|
| DE | 37 04 560 | | 8/1988 | |
| EP | 0 236 799 | | 9/1987 | |
| EP | 0 494 759 | | 7/1992 | |
| GB | 2 262 008 | | 11/1992 | |
| JP | 58012451 | | 1/1983 | |
| JP | 401089599 | * | 4/1989 | 361/695 |
| JP | 405090776 | * | 4/1993 | 361/721 |
| JP | 6216857 | | 8/1994 | |

OTHER PUBLICATIONS

H. Tomonaga et al., "High–Speed Switching Module for a large Capacity ATM System", IEEE, Dec., 1992, pp. 123–127.
Y. Doi et al., "A 160 Gbit/s Large–Capacity ATM Switching System using a Dynamic Link Speed Controlled Switch Architecture", IEEE, 1993, pp 24–28.
Y. Doi et al., "An ATM Switch using Multichip Module Technology", SSE, Nov. 22, 1991.
K. Endo et al., "A Full–matrix Large ATM Switch constructed by Small Size Switch Elements with Control Point Switching Scheme", SSE, 1993 Spring, Intro.
S. Sasaki et al., "Multi–chip Module Packaging Technology for Communication Switching Systems", SSE, Nov. 22, 1991, Abstract.
H. Tomonaga et al., "A Structure of Ultrahigh–Speed ATM Switch", SSE, Nov., 1993, Abstract.
A. Day, "International Standardization of BISDN", IEEE LTS, Aug. 1991, pp. 7, 13–20.

(List continued on next page.)

Primary Examiner—Gregory Thompson
(74) Attorney, Agent, or Firm—Rosenman & Colin LLP

(57) ABSTRACT

A circuit board packaging structure comprises a plurality of circuit boards disposed in parallel to each other and each packaged with electric circuit parts. The circuit board packaged with electric circuit parts exhibiting a larger exothermic quantity than those of the electric circuit parts packaged on the other circuit boards is disposed outermost among the plurality of circuit boards. The surface of the circuit board packed with the electric circuit parts exhibiting the larger exothermic quantity is directed outside the structure.

9 Claims, 38 Drawing Sheets

OTHER PUBLICATIONS

B. E. Basch et al., "VISTAnet: A BISDN Field Trail", IEEE ITS, Aug. 1991, pp. 22, 25–30.

A. Takahashi et al. "A Broadband Switching System for Public Network" ISS, May 1990, vol. V, pp. 103–109.

K. Hajikano et al., "Asynchronous Transfer Mode Switching Architecture for Broadband ISDN", LCC, Jun. 1988, pp 0911–0915.

Y. Kato et al, "A VLSIC for the ATM Switching System", ISS, May 1990, vol. 111, pp 27–32.

K. Chipman et al., "High Performance Applications Development for B–LSDN", ISS, Oct., 1992, pp 22–26.

H. Tomonaga et al., "A Line Interface Structure for a Large Capacity ATM Switching System", SSE, Apr. 4, 1994, pp. 1–13, cover sheet, 1–6.

* cited by examiner

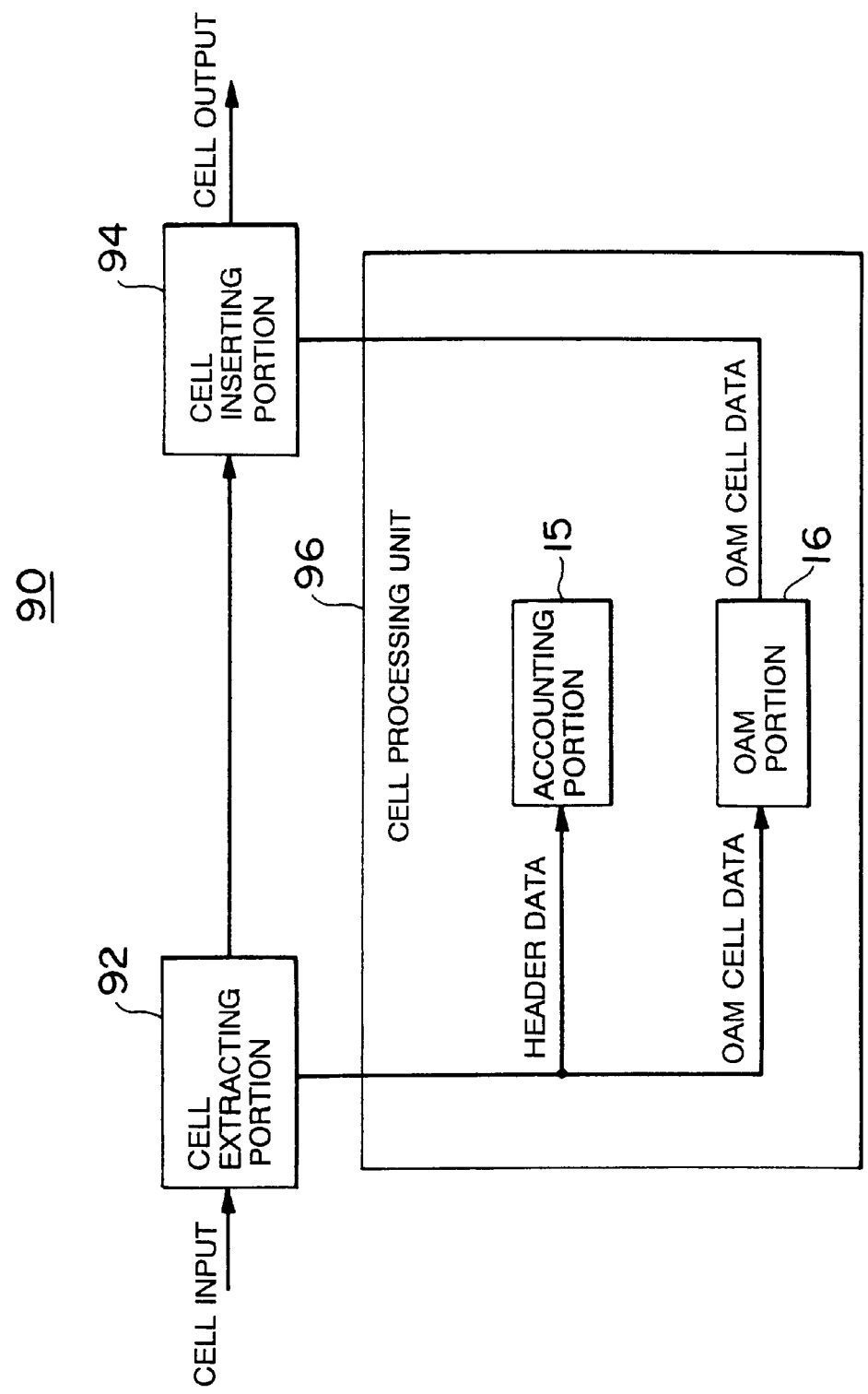

CIRCUIT BOARD PACKAGING STRUCTURE

BACKGROUND OF THE INVENTION

1. Field of the Invention

The present invention relates to a circuit board packaging structure and, more particularly to a circuit board packaging structure in switching equipment.

2. Description of the Related Art

In recent years, there has been offered a variety of communications systems utilizing optical cables each composed of an optical fiber exhibiting a high transmission efficiency. For example, a circuit transmission line may be formed by use of the optical cables in Broadband-ISDN system, such as asynchronous transfer mode (ATM) switching equipment and also in an integrated services digital network (ISDN) network. Accordingly, the ATM switching equipment includes a photoelectric converting portion for converting a transmitted optical signal into an electrical signal and converting the electrical signal into the optical signal when transmitting the electrical signal to a circuit transmission line. Then, the optical cable is connected via an optical connector to the photoelectric converting portion. Hereinafter, a configuration having the above optical connector and the photoelectric converting portion is termed as an optical module.

When the thus structured optical modules are mounted in a box body of the switching equipment, according to the prior art construction, the optical connectors are disposed together with the photoelectric converting portions inwardly of the board in the box body. With this arrangement, the optical cables have to be connected to the optical connectors by perforating the board and guiding the optical cables therethrough. That is, the connector normally has a male connector connected to the end of the optical cable and a female connector connected to the photoelectric converting portion. These male and female connectors are disposed together inwardly of the board, and hence the optical cable has to penetrate the board.

Further, according to a packaging structure of a circuit in an electric mechanical apparatus, there may be a case in which packaging involves dividing one circuit into a plurality of modules, individually mounting these modules on separate circuit boards and, at the same time, connecting these circuit boards to each other. In this case, a plurality of circuit boards are connected perpendicularly to one sheet of circuit board (Back Wiring Board (hereinafter abbreviated to [BWB]) so that the plurality of circuit boards are parallel to each other. This construction is known as a bookshelf construction.

A transmission line corresponding unit of the switching equipment needs one optical module per subscriber's transmission line. It is necessary for the board to be perforated by two holes because photoelectric connections must be made to two lines of optical cables within one optical module. Then, normally in the switching equipment, the board has to be perforated with a total of sixteen holes in order to accommodate eight subscriber transmission lines.

Thus, when the number of holes increases, the strength of the board decreases, possibly resulting in the board becoming warped. Further, a large plurality of wires must be arranged on the board. Problems may arise due to the presence of the holes which hinder the degree of freedom in the wiring design. In addition, this contributes to a reduction in the area capable of accommodating wires and to a decline in wire accommodatability.

It is a first object of the present invention to provide a circuit board packaging structure that does not require perforating a board with holes, that provides a degree of freedom for wiring design on the board and prevents a decline in wire accommodatability in equipment using such optical modules.

Further, in the case of adopting the above-mentioned bookshelf construction, a problem arises as to how to apply cooling air for cooling circuit elements on each circuit board in order to improve a cooling efficiency. In particular, if high exothermic elements (e.g., LSIs, etc.) are contained in the circuit elements, a decision must be made as to which circuit board should be used for mounting these high exothermic elements and how to expose them to the cooling air.

It is a second object of the present invention to provide a circuit board packaging structure capable of obviating the above problem, when packaging an electric circuit on a circuit board based on the bookshelf construction, and positively cooling off circuit elements exhibiting a comparatively high exothermic quality.

Also, in the case of using the above bookshelf construction, if an element requiring maintenance and inspection is contained in the circuit elements, there are problems which follow. That is, when opening a door of the electric mechanical apparatus and exposing the circuit board to the outside, maintenance and inspection purposes, a large quantity of cooling air will flow out of this opened door so that not enough cooling air will circulate along the peripheries of the circuit elements except for this element. Thus, during the maintenance and inspection of some elements, other circuit elements will not be sufficiently cooled off. Hence, even if some circuit elements are usable, this electric mechanical apparatus as a whole may be brought into an inoperable state.

It is a third object of the present invention to provide a circuit board packaging structure that is capable of obviating the above problem and performing the maintenance and inspection of some circuit elements without influencing the cooling air flowing to other elements.

Moreover, up until now the above bookshelf construction has not been proposed for ATM switching equipment. Accordingly, in the conventional switching equipment, the circuits are packaged on a single circuit board or on a plurality of circuit boards arranged in parallel. By the way, in ATM switching equipment, a transmission line corresponding unit for accommodating transmission lines extending from subscriber's terminals or junction transmission lines from other switching equipment includes firmware exhibiting a function only selectively utilized. In the case of the conventional circuit board, however, it is impossible to eliminate the firmware having the function which is not utilized. Hence, with respect to all the transmission line corresponding units, all kinds of firmware have to be packaged irrespective of whether or not the functions thereof are utilized. For this reason, the equipment increases in size on the whole, and, at the same time, the dissipation of electric power unnecessarily increases.

It is a fourth object of the present invention to provide a circuit board packaging structure that is capable of obviating the above problem and easily eliminating the firmware having the non-utilized function out of the transmission line corresponding unit of the ATM switching equipment.

SUMMARY OF THE INVENTION

According to the present invention, the following constructions and elements are taken for obviating the respective problems given above.

According to a first aspect of the present invention, there is provided a construction for obviating the first problem described above. That is, there is provided a circuit board packaging structure, comprising: an optical cable; an optical module having a photoelectric converting portion connected to the optical cable; and a circuit board including an electric circuit unit in an internal portion thereof. The optical cable and the optical module are disposed on an external portion of the circuit board. The electric circuit unit provided on the internal portion of the circuit board and the optical module are electrically connected to each other through an electric conductor traversing the circuit board.

According to a second aspect of the present invention, there is provided a construction for obviating the second problem given above. That is, there is provided a circuit board packaging structure, comprising: a plurality of circuit boards each packaged with electric circuit parts and disposed parallel to each other. The circuit board packaged with the electric circuit parts exhibiting a larger exothermic quantity than those of the electric circuit parts packaged on the other circuit boards is disposed outermost among the plurality of circuit boards and, at the same time, disposed so that the surface packaged with the electric circuit parts exhibiting the larger exothermic quantity is directed outside.

According to a third aspect of the present invention, there is provided a construction for obviating the third problem given above. That is, there is provided a circuit board packaging structure, comprising: first circuit boards each packaged with electric circuit parts and disposed parallel to each other; a second circuit board connected perpendicularly to the plurality of first circuit boards and packaged with the electric circuit parts; a first air duct for flowing cooling air for the electric circuit parts along the first circuit boards; a second air duct for flowing cooling air for the electric circuit parts along the surface of the second circuit board; and a diverting element for diverting some cooling air flowing within the first air duct into the second air duct by making the first air duct communicate with the second air duct in an adjustable manner.

According to a fourth aspect of the present invention, there is provided a construction for obviating the fourth problem given above. That is, there is provided a packaging structure of a circuit board for packaging a transmission line corresponding unit, of an ATM switching equipment, for accommodating a plurality of transmission lines and, at the same time, processing the data from each transmission line on a cell-basis, the packaging structure comprising: a first circuit board packaged with electric circuit parts for executing an indispensable service among the respective electric circuit parts constituting the transmission line corresponding unit; and a second circuit board adapted to be attached to the first circuit board when desired and, at the same time, packaged with electric circuit parts for executing an arbitrary additional service among the respective electric circuit parts.

According to the first aspect of the present invention, it is enough to make electric connections only by use of the electric conductors in portions where the upper and lower surfaces of the board are connected to each other, and hence there is eliminated the necessity for perforating the board with through-holes for the optical cables.

Also according to the first aspect of the present invention, the packaging structure of the circuit board is widely utilizable in a variety of equipments using the optical cables. This is especially useful in a switching equipment employed in a communications network utilizing the optical cables.

For example, when the present invention is applied to an ATM switching equipment, it follows that the above electric circuit unit is a transmission line corresponding unit for accommodating a plurality of transmission lines and, at the same time, processing the data from each transmission line on the cell-basis.

Herein, the board is provided with a connector to which the optical module can be removably attached. With this arrangement, the optical module can be readily replaced.

This connector may involve the use of a penetration type connector penetrating the board and a non-penetration type connector which does not penetrate the board. When using the non-penetration type connector, it is possible to prevent a decrease in the strength of the board.

Further, the above-stated connector is constructed including a holding wall surrounding a part of the optical module. This construction makes it possible to enhance the connecting strength of the optical module.

When a shield film is provided in at least one of the interior and the exterior of the connector, electric disturbance to the optical module can be prevented.

Also, the board normally has a ground. An electric potential of this ground is, however, preferably equalized to an electric potential of the above connector and a ground potential of the electric circuit packaged on the board. This can prevent a mistake in terms of logic of a digital circuit.

The transmission line corresponding unit is separated into individual units, individually connected to the plurality of transmission lines accommodated therein, for individually processing the cells and the common unit, connected to each of the individual units, for batch-processing the cells processed by the respective individual units. The individual units and the common unit can be thereby separately packaged, and, therefore, the packaging can be rationalized, resulting in a more desirable mode for the packaging structure.

Herein, there can be considered a mode which follows. The common unit is packaged on the board, and the individual units are packaged on the plurality of individual unit oriented boards prepared corresponding to the individual units. These individual unit oriented boards are attached to the above circuit board. The individual units are connected to the respective terminals via the optical cables by means of the optical modules provided on the external portion of the circuit board and, at the same time, electrically connected to the common unit. In this mode, the plurality of individual unit oriented boards packaged with the individual units are connected perpendicularly to the circuit board but arranged parallel to each other. This arrangement makes for neat packaging and facilitates assembly.

Moreover, the common unit oriented connector is provided on the circuit board, and, simultaneously, the auxiliary board is adapted to be attached to this common unit oriented connector. The auxiliary board is thereby parallel to and spaced at a fixed distance from the circuit board. It can also be considered packaged with the common unit. Based on such a structure, the auxiliary board is simply removed, and the common unit can be easily replaced and repaired. Furthermore, the auxiliary board is separated from the circuit board by means of the connector, and it is therefore feasible to increase the cooling efficiency of the common unit mounted on the auxiliary board.

In this case, the common unit is provided on the inner side of the auxiliary board, i.e., on the side of the circuit board. In addition, the radiating fins for radiating the heat from the common unit are provided on the outer side of the auxiliary board, thereby further enhancing the cooling efficiency.

Also, two connectors of the type described above are mounted in parallel on the circuit board. When forming a heat radiating path defined by the two connectors, the circuit board and the auxiliary board, this heat radiating path serves as a path for air flow, whereby the cooling efficiency can be increased.

Moreover, when the circuit board is equipped with an air blow guide constituting an air blow path with respect to the circuit board so as to externally surround the auxiliary board, the air flows through this air blow path, whereby the cooling efficiency can be increased. In this arrangement, cooling fans may be provided for forcibly blowing air to the air blow path.

Note that the ATM switching equipment includes a switch connected to the common unit of the transmission line corresponding unit. Then, when having the switch-side optical module as an interface for connecting the common unit to the switch, the transmission line-side optical module is packaged on the central proton of the circuit board, while the switch-side optical module is packaged on the peripheral portion of the circuit board. The packaging structure can be thus rationalized.

By the way, the common unit is not packaged on the circuit board but on the common unit oriented board. The individual units are packaged on the plurality of individual unit oriented boards prepared according to the individual units. This common unit oriented board and the individual unit oriented boards can also be mounted on the circuit board. In such case, the individual units are connected to the respective terminals via the optical cables through an intermediary of the optical modules provided on the external portion of the circuit board and, at the same time electrically connected to the common unit.

In this arrangement, the common unit oriented board packaged with the common unit and the plurality of individual unit oriented boards packaged with the individual units are connected perpendicularly to the circuit board and arranged parallel to each other. This arrangement is preferable in terms of facilitating assembly.

Note that the common unit may be, when packaging the common unit, divided into a plurality of common subunits and then packaged. This is, however, done only if the number of the subunits is smaller than the number of individual units.

Further, according to the second aspect of the present invention, the electric circuit parts generating more heat than those of the electric circuit parts packaged on other circuit boards can be disposed on the outer surface of the circuit board. Hence, these electric circuit parts can be subjected to more concentrated cooling.

For instance, the electric circuit parts can be cooled off by providing cooling fans for blowing the cooling air against the electric circuit parts having the larger exothermic quantity.

Particularly, for cooling off the electric circuit parts packaged on the plurality of circuit boards, first cooling fans are provided for blowing the cooling air along the plurality of circuit boards. The cooling air from the first cooling fans acts to cool off the electric circuit parts having the larger exothermic quantity. Second cooling fans are provided for blowing cooling air against the outwardly disposed circuit boards from the perpendicular direction. Thereby, the electric circuit parts exhibiting the larger exothermic quantity can be cooled off, even though the cooling air is brought in from outside through a common inlet.

The above electric circuit parts may be those constituting the transmission line corresponding unit, of the ATM switching equipment, for accommodating the plurality of transmission lines and, at the same time, processing the data from each transmission line. This electric circuit unit is separated into a plurality of individual units, individually connected to the plurality of transmission lines, for individually processing the cells and the common unit for batch-processing the cells processed by the individual units. Simultaneously, when the thus separated individual units or common unit are packaged on the separate circuit board, cooling can be attained corresponding to the difference in the exothermic quantity caused by the difference in the air throughput. An example of this packet is an ATM cell which is a fixed length cell.

That is, if the electric circuit parts having the larger exothermic quantity are those constituting the common unit, cooling of this common unit can be concentrated thereon.

There may be prepared two such common units having the same configuration for the active and standby systems. If constructed in this way, the common unit can be maintained and replaced during the operation of the transmission line corresponding unit.

When constructed to respectively package these two common units on separate circuit boards, the circuit boards packaged with the common units may be disposed at both ends of the plurality of circuit boards. Even if thus arranged, since there are two circuit boards facing outside, among the plurality of circuit boards, effective cooling can be attained.

The plurality of such circuit boards are connected to the same connecting board, and the wires for connecting the common units to the individual units are arranged on the outer surface of this connecting board. With this arrangement, the plurality of individual units can be easily connected to the plurality of common units.

The circuit boards packaged with the common units are connected to the connecting board in a symmetrical manner about the axis orthogonal to the connecting board. At the same time, the wires for connecting the respective common units to the plurality of individual units are provided on the outer surface of the connecting board in a rotationally symmetrical manner about the axis, corresponding to the respective common units. Thus, the two sheets of circuit boards packaged with the common units can be identical to each other.

Further, a circuit board packaging structure, comprises a plurality of first rectangular circuit boards each packaged with electric circuit parts and disposed parallel to each other. This packaging structure also comprises a second circuit board packaged with the electric circuit parts and disposed in a direction orthogonal to respective sides of the plurality of first circuit boards. The plurality of first circuit boards are electrically connected to the second circuit board. With this arrangement, the respective circuit boards can be connected to each other while avoiding complicated wiring.

In this case, the packaging structure further comprising a cooling fan for flowing cooling air along the second circuit board. Even when the second circuit board is packaged with the electric circuit parts exhibiting the larger exothermic quantity, the electric circuit parts can thereby be cooled off with a high efficiency.

In this case, the electric circuit parts constituting the individual unit are packaged on the first circuit board for every individual unit. The electric circuit parts constituting the common unit can be packaged on the second circuit board. If constructed in this way, the common unit can be easily electrically connected to the plurality of individual units.

A plurality of second circuit boards are provided, and the two active and standby system common units each having the same construction are respectively packaged on these second circuit boards. It is therefore possible to carry out the connections between the respective common units and the plurality of individual units with a simple construction even when the two common units are prepared.

The packaging structure further comprises a partitioning plate for partitioning the second circuit board packaged with the active system common unit and the second circuit board packaged with the standby system common unit. Cooling fans are provided for two systems and independently cool off the second circuit boards partitioned by the partitioning plate. With this construction, when one common unit is maintained and inspected, cooling of the other common unit can continue. Hence, there is no necessity for stopping all of the transmission line corresponding units.

According to the third aspect of the present invention, the cooling air flowing through a first air duct cools off the electric circuit parts packaged on the first circuit boards. At the same time, this cooling air can be diverted to a second air duct by a diverting element. Therefore, the electric circuit parts package on the surface of the second circuit board can be cooled off. Further, when maintaining and inspecting the electric circuit parts packaged on the second circuit board, the diverting element can shut off a portion between the first and second air ducts, whereby the electric circuit parts on the second circuit board can be exposed to the outside without preventing the electric circuit parts on the first circuit boards from being cooled off by the cooling air flowing through the first air duct.

In this case, the diverting element opens and closes an opening formed in the first air duct using hinges. At the same time, the diverting element has a movable plate which is brought into contact with a proximal edge portion of the second air duct when opening the first air duct and a bellows for covering an area between the movable plate and a portion exclusive of locations in which the hinges are provided in the periphery of the opening. The diverting element can be thereby simply constructed.

Further, the second air duct is formed with an adjustable opening for exposing the electric circuit parts packaged on the second circuit board to the outside. When constructed in this way, the electric circuit parts can easily be maintained and inspected.

This opening of the second air duct is constructed to be opened and closed by a cover in the form of a transparent plate. The electric circuit parts can thereby be visually inspected even when the opening is closed.

According to the fourth aspect of the present invention, the first circuit board is packaged with only the electric circuit parts for executing an indispensable service among the electric circuit parts constituting the transmission line corresponding units of an ATM switching equipment. The second circuit board adapted to be attached to the first circuit board is packaged with the electric circuit parts for executing other arbitrary additional services. Hence, when the service of the electric circuit parts packaged on this second circuit board is not needed, this second circuit board can be eliminated. That is, the transmission line corresponding unit can be constructed of only the irreducible minimum number of electric circuit parts by removing the unnecessary electric circuit parts per individual transmission line.

BRIEF DESCRIPTION OF THE DRAWINGS

Other objects and advantages of the present invention will become apparent during the following discussion in conjunction with the accompanying drawings, in which:

FIG. 42 is a block diagram illustrating a detailed configuration of the block portion in FIG. 40.

DESCRIPTION OF THE PREFERRED EMBODIMENTS

Preferred embodiments of the present invention will hereinafter be discussed with reference to the drawings.

In each of embodiments which follow, the present invention is applied to a packaging structure in an ATM switching equipment employed for a wide band ISDN network.

To start with, in advance of a discussion on each embodiment, there will be explained a construction of the ATM switching equipment to which the respective embodiments are applied. The ATM switching equipment to which the embodiments of the present invention are applied is roughly classified into a first type of ATM switching equipment (corresponding to first through tenth embodiments) and a second type of ATM switching equipment (corresponding to an eleventh embodiment). In the first type ATM switching equipment, a transmission line corresponding unit accommodates a subscriber's transmission line connected to a subscriber's terminal or a junction circuit connected to other switching equipment. The transmission line corresponding unit is separated into individual units and a common unit, and, at the same time, only the individual unit is provided for every circuit. In the second type ATM switching equipment, all the elements of the transmission line corresponding unit are provided per circuit.

Figure 28:
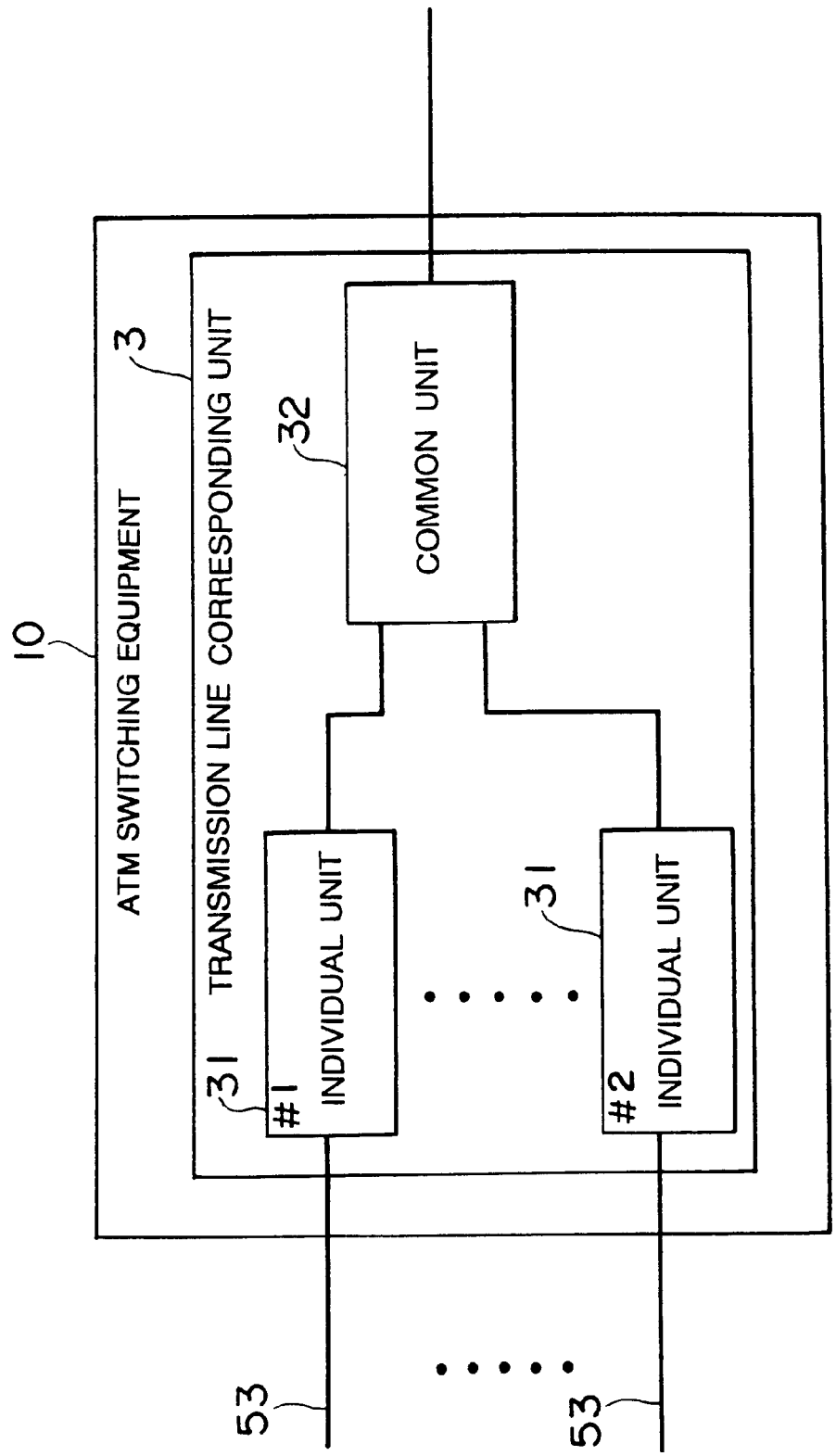
FIG. 28 is a block diagram illustrating a transmission line corresponding unit of an ATM switching equipment by way of a configuration example of an electric circuit unit.

FIG. 28 is a schematic diagram schematically illustrating an ATM switching equipment 10 in which a transmission line corresponding unit 3 is separated into individual units 31 and a common unit 32. This ATM switching equipment 10 accommodates a plurality of transmission lines (subscriber's transmission lines or junction transmission lines) and includes a plurality of transmission line corresponding units 3 (only one transmission line corresponding unit 3 is illustrated in FIG. 28) for processing data from each transmission line 53 on a cell-basis.

This transmission line corresponding unit 3 includes individual units 31 and a common unit 32. The individual units are individually connected respectively to a plurality of transmission lines 53 to be accommodated therein and individually perform cell processing. The common unit 32 is connected to each of the individual units 31 and, at the same time, batch-processes the cells processed in the individual units 31.

Figure 29:
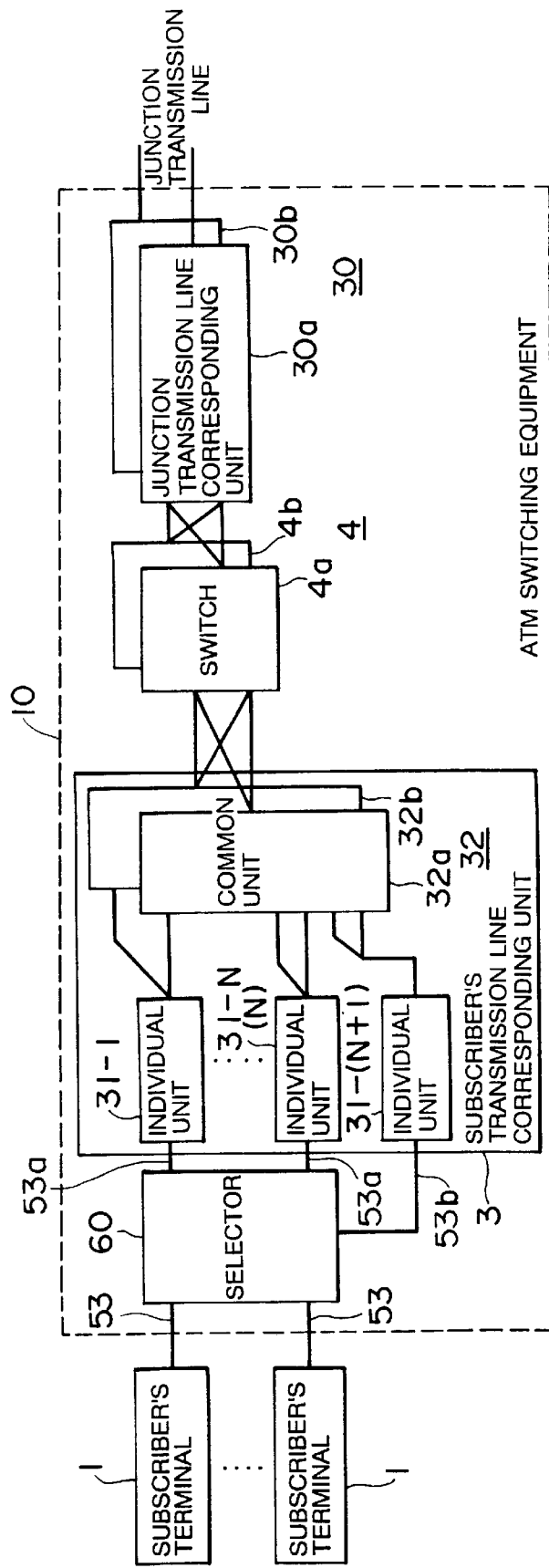
FIG. 29 is a block diagram showing a specific configuration of the transmission line corresponding unit in FIG. 28.

FIG. 29 illustrates a more specific construction of the ATM switching equipment 10 shown in FIG. 28. The ATM switching equipment 10 illustrated in FIG. 29 includes a selector 60 connected to a plurality of subscriber's terminals 1 and a subscriber's transmission line corresponding unit 3 connected to the selector 60. The ATM switching equipment 10 further includes an ATM cell switch 4 connected to the subscriber's transmission line corresponding unit 3 and a junction transmission line corresponding unit 30 connected to the ATM cell switch 4.

The subscriber's transmission line corresponding unit 3 is an interface for converting a signal transmitted with a synchronous digital hierarchy (SDH) from the subscriber's terminal 1 into an ATM format and transmitting this signal to the ATM cell switch 4. Further, the subscriber's transmission line corresponding unit 3, when receiving a cell from the ATM cell switch 4, maps this cell in a frame of the synchronous digital hierarchy (SDH) and transmits it to the subscriber's transmission line 53.

The subscriber's transmission line corresponding unit 3 is connected via the subscriber's transmission lines individually to each of the plurality of the subscriber's terminals. The subscriber's transmission line corresponding unit 3, at the same time, comprises a plurality of individual units 31 for individually effecting cell processing and one common unit 32 for batch-processing the cells processed in the individual units 31.

Note that there are provided, as the individual units 31, a plurality of 0-system (active system) individual units 31-1 through 31-N each bearing an active status while being connected to the subscriber's terminals 1 at a normal time and one 1-system (standby system) individual unit 31-(N+1) which substitutes, if one of these 0-system individual units 31-1 through 31-N breaks down, for this fault individual unit.

Also, there are provided, as the common units 32, a single 0-system (active system) common subunit 32a and a single 1-system (standby system) common subunit 32b. Each individual unit 31 is connected to both the 0-system common subunit 32a and the 1-system common subunit 32b. Accordingly, if the 0-system (active system) common subunit 32a breaks down, the 1-system (standby system) common subunit 32b is employed in place of the 0-system common unit.

The selector 60 is interposed between the plurality of subscriber's terminals 1 and the plurality of individual units 31. The selector 60 selectively connects a subscriber's transmission line 53 corresponding to one of the subscriber's terminal 1 to one of the individual units 31. That is, the selector 60, when all the 0-system individual units 31-1 through 31-n are normal, sets the respective subscriber's transmission lines 53 to the 0-system corresponding individual units 31-1 to 31-N. At the same time, if a fault occurs in one of the 0-system individual units, the selector 60 switches over the subscriber's transmission line connected to this in-trouble 0-system individual unit and reconnects it to the 1-system individual unit 31-(N+1).

The ATM cell switch 4 switches over an internal signal path in order to transmit the cell to one of the junction transmission lines. The ATM cell switch 4 is constructed of a 0-system (active system) ATM cell switch element 4a and a 1-system (standby system) ATM cell switch element 4b. Each of these 0- and 1-system ATM cell switch elements 4a, 4b is connected to both of the 0-system common subunit 32a and the 1-system common subunit 32b. Accordingly, if a fault occurs in the 0-system (active system) ATM cell switch element 4a, the 1-system ATM cell switch element 4b is employed in place of the 0-system switch element.

The junction transmission line corresponding unit 30 effects mapping of the cells transmitted from the ATM cell switch 4 in the synchronous digital hierarchy (SDH) frame and transmits them to the junction transmission lines connected to other ATM switching equipment. Note that if a full-ATM is utilized, the junction transmission line corresponding unit 30 transmits the cells sent from the ATM cell switch 4 to the junction transmission lines in the ATM cell format. Further, the junction transmission line corresponding unit 30, when receiving the SDH frame or the cell from the junction transmission line, performs a necessary cell conversion and transmits it to the ATM cell switch 4. An internal configuration of this junction transmission line corresponding unit 30 is substantially the same as that of the subscriber's transmission line corresponding unit 3. Hence, the junction transmission line corresponding unit 30 is constructed of a 0-system (active system) junction transmission line corresponding subunit 30a and a 1-system (standby system) junction transmission line corresponding subunit 30b. Each of these subunits is connected to both of the 0-system ATM cell switch element 4a and the 1-system ATM cell switch element 4b.

Thus, the whole ATM switching equipment is duplicated, and, therefore, if a fault occurs, each element is switched over from the 0-system to the 1-system, thereby making it possible to avoid communications troubles. In particular, the common unit 32 processes the cells transmitted from the respective individual units 31, and hence the switchover to the 1-system common subunit 32b in the case of the occurrence of a fault in the 0-system common subunit 32a exhibits a large effect.

Given hereinbelow is an explanation of a separate configuration example of the individual unit and the common unit. Note that the subscriber's transmission line corresponding unit 3 and the junction transmission line corresponding unit 30 have the same configuration, and, therefore, only the subscriber's transmission line corresponding unit 3 will be described in the following separate configuration example while omitting the discussion on the junction transmission line corresponding unit 30.

Figure 30:
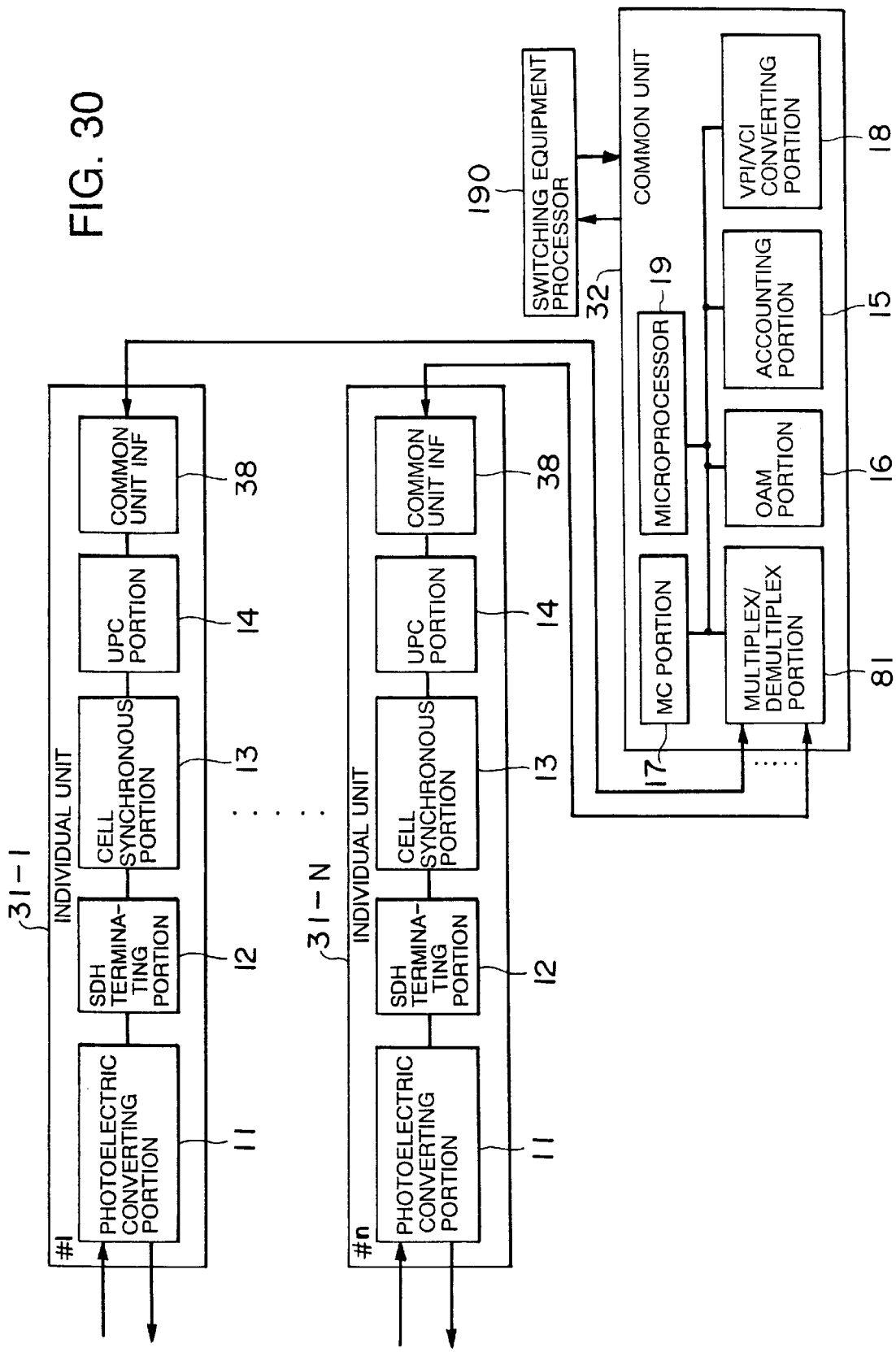
FIG. 30 is a block diagram showing a separate configuration example 1 of the transmission line corresponding unit.

FIG. 30 is a block diagram showing a separate configuration example 1 of the individual units 31 and the common unit 32 in the subscriber's transmission line corresponding unit 3. Referring to FIG. 30, the subscriber's transmission line corresponding unit 3 comprises a plurality of individual units 31-1 to 31-N and the common unit 32, connected to a plurality of individual units 31, for batch-processing the cells processed respectively in the individual units.

Each of the individual units 31-1 through 31-N is a circuit for converting the data transmitted from the subscriber's terminal 1 on the cell-basis and transfers the converted data to the common unit 32. Each of the individual units 31-1 to 31-N includes of a photoelectric conversion portion 11, an SDH terminating portion 12, a cell synchronous portion 13, a UPC portion 14 and a common unit interface (INF) 38 connected to the common unit 32 as well.

The photoelectric conversion portion 11 has a function to convert optical signals from the subscriber's transmission lines 53 each composed of an optical cable into electric signals or inversely convert the electric signals into optical signals.

The SDH terminating portion 12 terminates the SDH format sent from the subscriber's terminal 1. That is, the SDH terminating portion 12 converts the data transmitted in the SDH format from the subscriber's terminal 1 into data in a cell format and, inversely converts the data transmitted in the cell format from the common unit 32 into the data in the SDH format.

The cell synchronous portion 13 performs cell error control on the basis of header error control data written to a cell header and effects a cell synchronous detection.

The UPC portion 14 manages a band to be used by the subscriber by monitoring a traffic density.

The common unit INF 38 is an interface for transferring the cell data to the common unit 32.

The common unit 32 is a circuit for transferring the cells from the plurality of individual units 31-1 through 31-N to the switch 4. This common unit 32 is constructed of a multiplex/demultiplex portion 81, an OAM portion 16, an MC portion 17, an accounting portion 15, a VPI/VCI conversion portion 18 and a microprocessor 19.

The multiplex/demultiplex portion 81 multiplexes the cells sent from the individual units 31-1 to 31-N and, inversely transmits, after demultiplexing the as-multiplexed cells sent from the ATM cell switch 4, the demultiplexed cells to the individual units 31.

The accounting portion 15 collects pieces of accounting data by counting the number of the cells inputted.

The OAM portion 16 manages an OAM cell (alarm cell). The MC portion 17 monitors cell quality by measuring a cell error characteristic, a cell loss characteristic and a cell delay characteristic by use of MC cells.

The VPI/VCI conversion portion 18 reads a VPI/VCI from the cells inputted, converts this VPI/VCI into a new output destination VPI/VCI corresponding to the former VPI/VCI and rewrites the header with the output destination VPI/VCI.

The microprocessor 19 controls the multiplex/demultiplex portion 81, the accounting portion 15, the OAM portion 16, the MC portion 17 and the VPI/VCI conversion portion 18.

A switching equipment processor 190 notifies the individual units 31-1 through 31-N of a control command for controlling the individual units 31-1 to 31-N and a fault monitoring command for monitoring a fault in each of the individual units 31-1 through 31-N. This switching equipment processor 190 is connected to the microprocessor 19.

The discussion given above has dealt with the transfer of the cell from the subscriber's terminal 1 via the transmission line corresponding unit 3 to the switch 4. In the reverse order to this, the cell may be transferred from the switch 4 via the transmission line corresponding unit 3 to the subscriber's terminal 1.

According to such a construction, the multiplex/demultiplex portion 81, the OAM portion 16, the MC portion 17 and the VPI/VCI conversion portion 18 that are provided in the common unit 32 are utilized in common by the individual units 31-1 through 31-N. Therefore, downsizing of the transmission line corresponding unit 3 can be achieved.

Further, the operation of the switching equipment processor 190 is carried out in the following manner. To start with, the switching equipment processor 190 transmits the control command and the trouble monitoring command to the microprocessor 19. The microprocessor 19 analyzes to which individual unit 31 the received command corresponds and transmits the control command or the trouble monitoring command to the corresponding individual unit.

Next, when the individual unit 31 receiving the command transmits a reply (status) to this command to the processor 19, the microprocessor 19 sends this replay back to the switching equipment processor 190.

That is, the switching equipment processor 190 is capable of controlling the individual units 31-1 through 31-N through the microprocessor 19.

Figure 31:
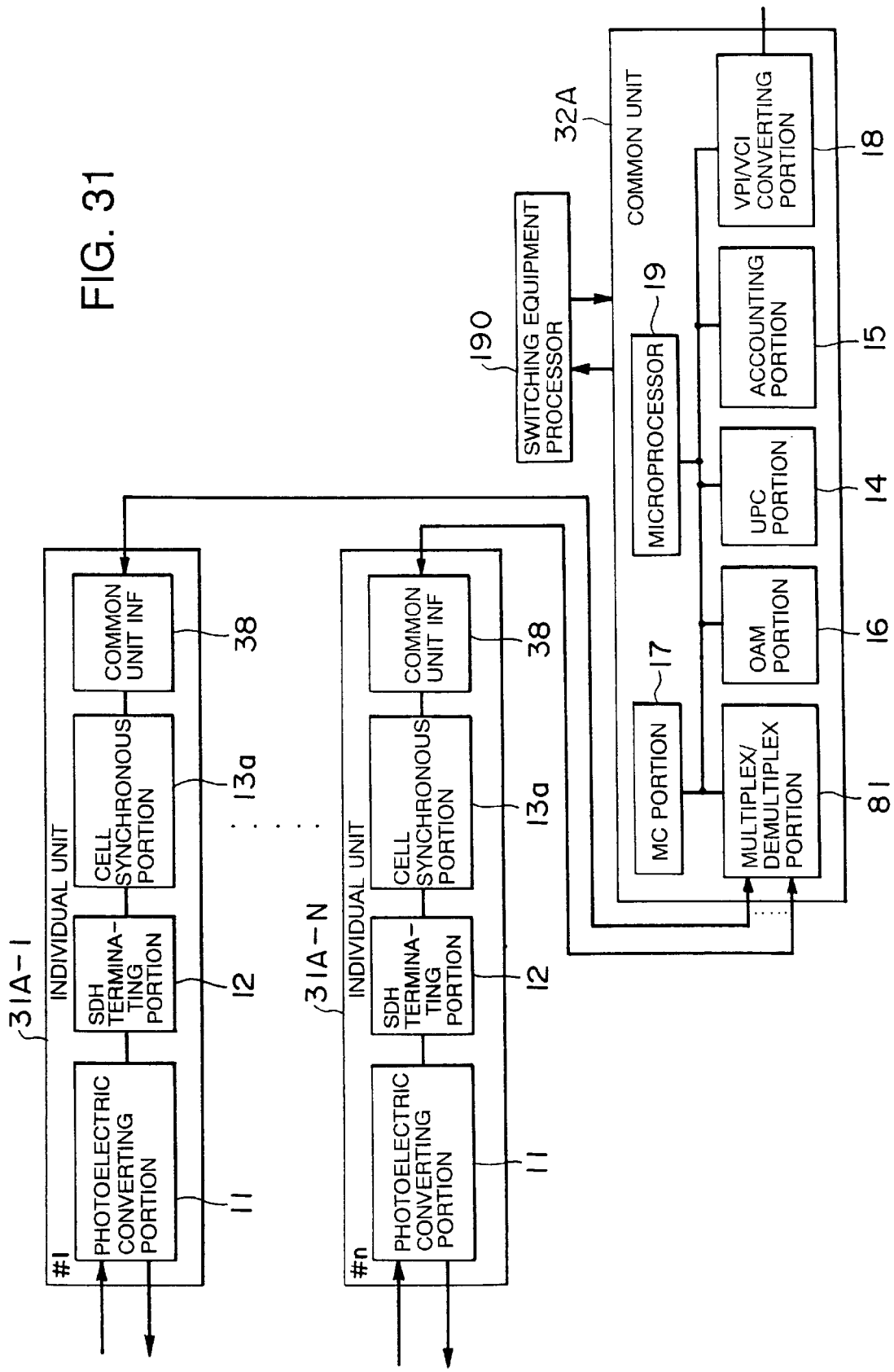
FIG. 31 is a block diagram showing a separate configuration example 2 of the transmission line corresponding unit.

FIG. 31 is a block diagram illustrating a separate configuration example 2 of the individual unit 31 and the common unit 32 in the subscriber's transmission line corresponding unit 3. In contrast with the separate configuration example 1 given above, the separate configuration example 2 is characterized by including the UPC portion 14 in the common unit 32 and removing the UPC portion 14 from each of the individual units 31-1 through 31-N.

More specifically, each of the individual units 31A-1 through 31A-N concludes the photoelectric conversion portion 11, the SDH terminating portion 12, a cell synchronous portion 13a and a common unit INF 38. The common unit 32A includes the multiplex/demultiplex portion 81, the accounting portion 15, the UPC portion 14, the OAM portion 16, the MC portion 17, the VPI/VCI conversion portion 18 and the microprocessor 19.

The cell in each of the individual units 31A-1 to 31A-N consists of a data cell in which the data is decomposed to a fixed length, a clock pulse synchronized with the data cell, a cell enable signal indicating whether the data cell is valid or not and a cell frame signal having a bit indicating a heading of the data cell.

Further, three signal lines 54 (only one signal line 54 is illustrated in FIG. 31 for simplicity) are connected between each of the individual units 31A-1 through 31A-N and the common unit 32A. As illustrated in FIG. 32(b), the data cell is transferred in the form of a 16-bit serial signal (serial data) to the common unit via one of these three signal lines 54. The remaining two signal lines serve to transfer a cell frame signal (FRM) defined as an identifier indicating a heading of the cell ("H" (high) is outputted by only one bit in synchronism with the cell heading, but an "L" (low) status is kept during a period other than the above-mentioned.) and a clock pulse CLK synchronizing with the data cell to the common unit 32.

The cell synchronous portion 13a performs the processing shown in the separate configuration example 1 and at the same time writes, to within the header, the cell enable signal (ENB) defined as an identifier indicating whether the cell is valid or not. (If the cell is valid, "H" is outputted by only one bit, but the "L" status is kept during the period other than this.) Note that remaining features are the same as those in the separate configuration example 1, and hence their details will be omitted.

Accordingly such construction, more down-sizing is attained of the individual units 31A-1 through 31A-N than in the separate configuration example 1, since UPC portions 14 have been removed from the individual units.

Figure 32A:
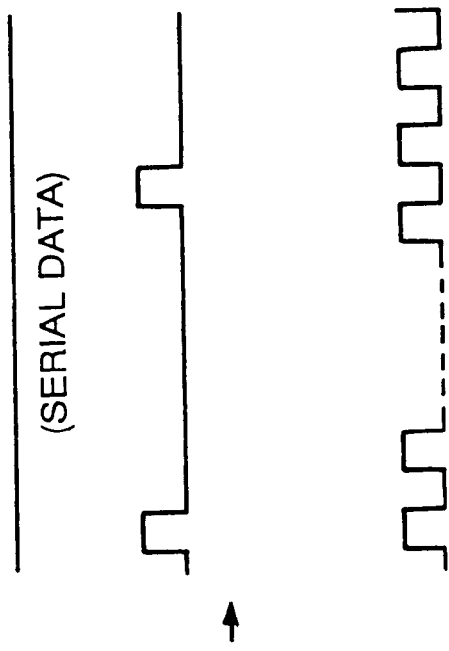
FIGS. 32a, 32b are shows waveforms of a serial transfer example 1 of a data cell.
Figure 32B:
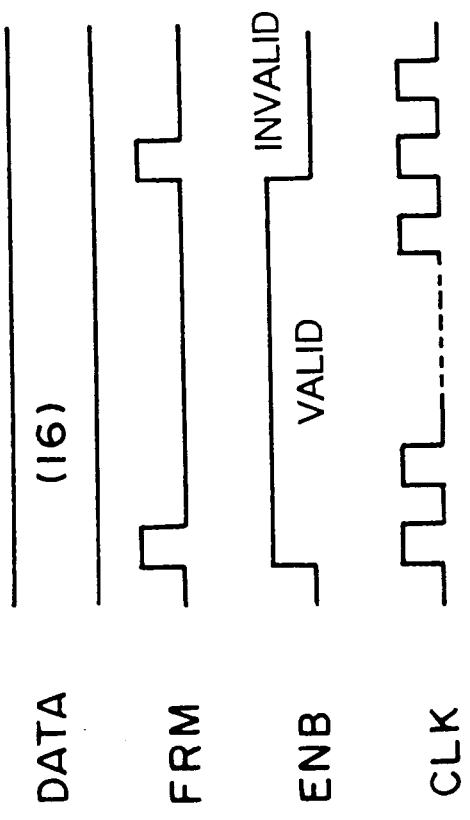

Further, the 16-bit data cell is serially transferred via the single signal line 54, and, therefore, the number of signal lines is less by 15 than the number of the signal lines in the conventional parallel transfer shown in FIG. 32(a). Further, as the cell enable signal is written to the header, the signal lines 54 therefor may be removed.

That is, the data cell, the clock pulse and the cell frame signal are transferred through three signal lines 54, and hence the number of the signals lines can be less by sixteen than the nineteen signal lines 54 employed in the conventional parallel transfer.

Accordingly, when a plurality of circuits are accommodated, the number of signal lines therefor is remarkably reduced, and its effect is large.

Figure 33:
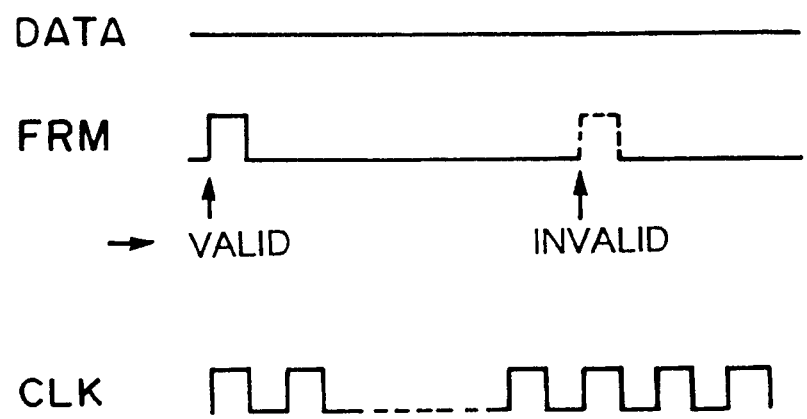
FIG. 33 shows waveforms of a serial transfer example 2 of the data cell.

Note that the cell enable signal written to the header works to distinguish whether the data cell is valid or invalid in the example given above. For instance, as illustrated in FIG. 33, whether the data cell is valid or not may be distinguished depending on an existence or non-existence ("H" indicating the validity of the frame or "L" indicating the invalidity of the frame) of the frame signal indicating the heading of the data cell.

Figure 34:
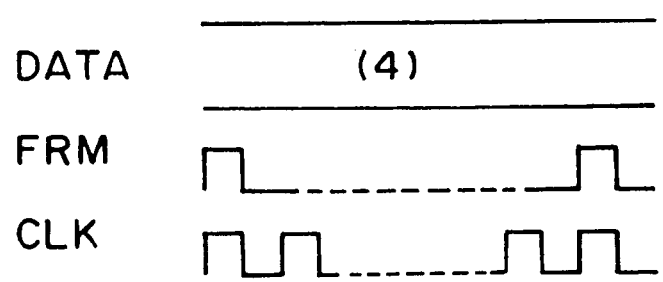
FIG. 34 shows waveforms of a serial transfer example 3 of the data cell.

Furthermore, if circuit speed increases, the data cell can not be serially transferred via the single signal line as the case may be. In this case, a plurality of signal lines are prepared corresponding to the circuit speeds, and the data cells may be transferred in parallel through the respective signal lines. For instance, the data cell has hitherto been serially transferred via the single signal line at a circuit speed of 156 Mbps. In a case where the circuit speed thereafter increases up to 600 Mbps, as illustrated in FIG. 34, the data cells can be transferred in parallel via four signal lines.

Figure 35:
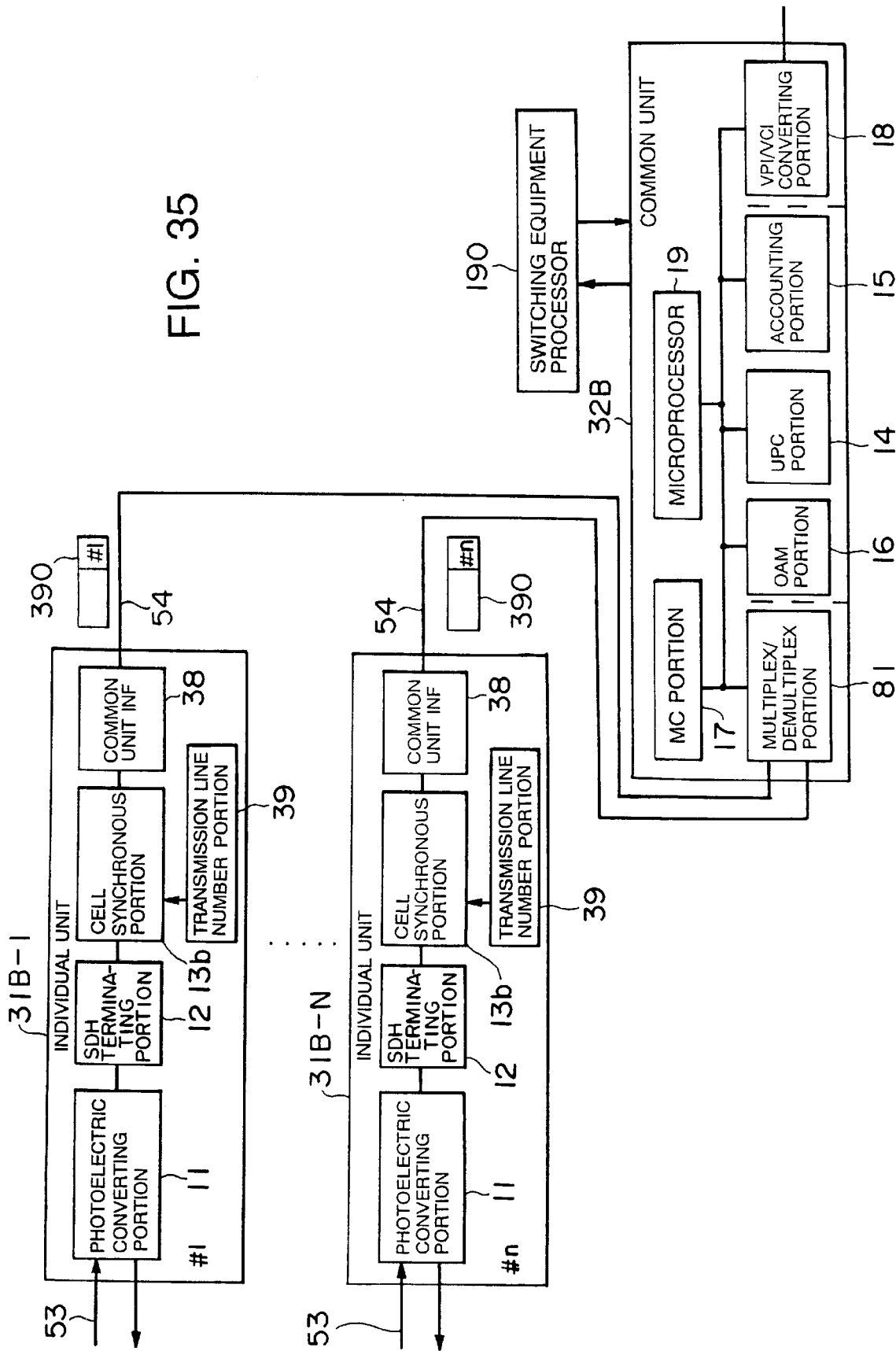
FIG. 35 is a block diagram showing a separate configuration example 3 of the transmission line corresponding unit.

FIG. 35 is a block diagram illustrating a separate configuration example 3 of the individual unit 31 and the common unit 32 in the subscriber's transmission line corresponding unit 3. In the separate configuration example 3, each of the individual units 31B-1 through 31B-N includes the photoelectric conversion portion 11, the SDH terminating portion 12, a cell synchronous portion 13b, a transmission line number portion 39 for generating transmission line numbers of the subscriber's transmission lines 53 connected to the self individual units and the common unit INF 38.

The transmission line number portion 39 is connected to the cell synchronous portion 13b. Then, this cell synchronous portion 13b adds a transmission line number 390 generated by the transmission line number portion 39 to the cell header in the form of an identification flag.

The common unit 32B performs the cell processing per transmission line on the basis of the transmission line number 390 added to the cell header within the cell sent from each of the individual units 31B-1 through 31B-N.

According to such an arrangement, the transmission line number portion 39 provided in each individual unit adds the transmission line number 390 to the cell header and transfers it to the common unit 32B. The common unit 32B is therefore capable, by referring to the respective transmission line numbers, of distinguishing to which transmission line to transfer each of the data cells inputted.

Figure 36:
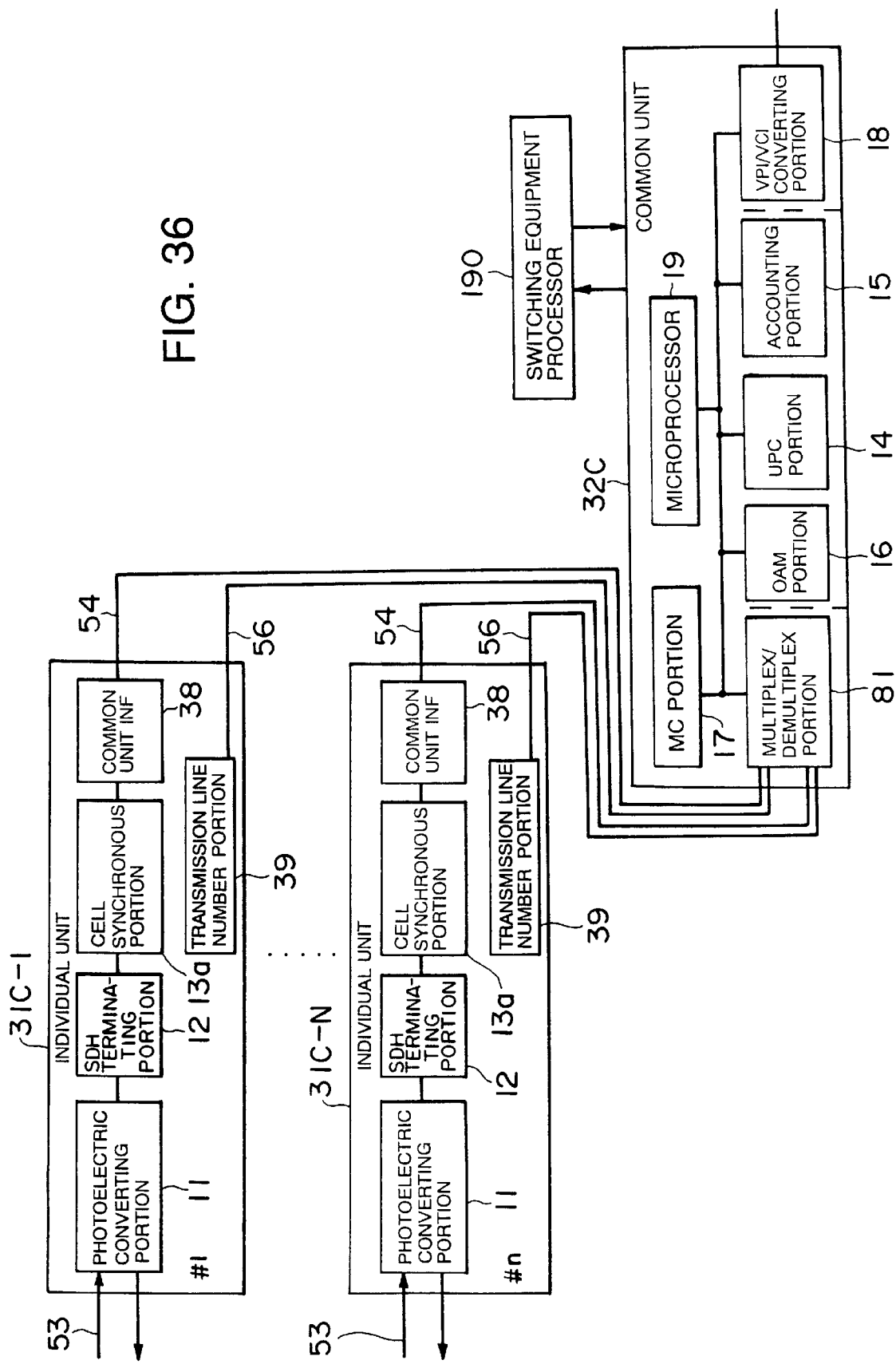
FIG. 36 is a block diagram showing a separate configuration example 4 of the transmission line corresponding unit.

FIG. 36 is a block diagram illustrating a separate configuration example 4 of the individual unit 31 and the common unit 32 in the subscriber's transmission line corresponding unit 3. In the separate configuration example 4, each of the individual units 31C-1 through 31C-N includes the photoelectric conversion portion 11, the SDH terminating portion 12, the cell synchronous portion 13a, the transmission line number portion 39 for generating transmission line numbers of the subscriber's transmission lines 53 connected to the self individual units and the common unit INF 38.

The transmission line number portion 39 provided in each individual unit is connected via a signal line 56 to the multiplex/demultiplex portion 81 of the common unit 32C. The common unit 32C effects the cell processing per transmission line on the basis of the transmission line number sent from the transmission line number portion 39 provided in each of the individual units 31C-1 through 31C-N. Accordingly, even if the transmission line number generated in the transmission line number portion 39 is transferred as an identification flag directly to the common unit 32C, the same effect is obtained as that in the above-discussed separate configuration example 3.

Figure 38:
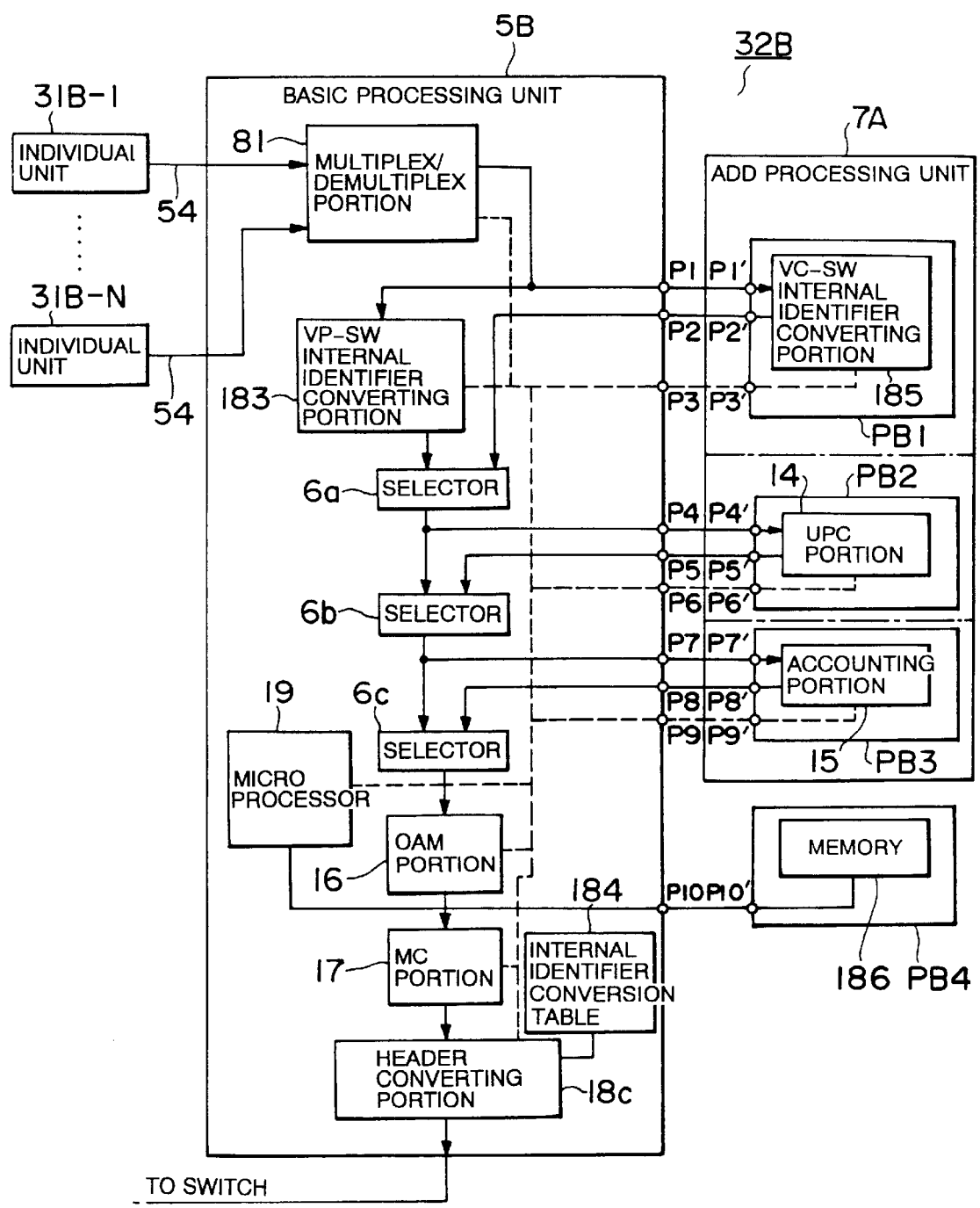
FIG. 38 is a block diagram showing a separate configuration example 5 of the transmission line corresponding unit.

FIG. 38 is a block diagram illustrating a separate configuration example 5 of the individual unit 31 and the common unit 32 in the subscriber's transmission line corresponding unit 3. In the separate configuration example 5, the common unit 32B is separated into a basic processing unit 5B for performing essential cell processing and an add processing unit 7A, detachably attached to this basic processing unit 5B, for effecting additional cell processing.

As shown in FIG. 38, the basic processing unit 5B comprises the multiplex/demultiplex portion 81 connected to each of the individual units 31B-1 through 31B-N and a VP-SW internal identifier conversion portion 183 connected to the multiplex/demultiplex portion 81. The basic processing unit 5B further comprises a selector 6a connected to the VP-SW internal identifier conversion portion 183, a selector 6b connected to the selector 6a, a selector 6c connected to the selector 6b, the OAM portion 16 connected to the selector 6c and the MC portion 17 connected to the OAM portion 16. The basic processing unit 5B also comprises a header conversion portion 18c connected to the MC portion 17, the microprocessor 19 connected to the multiplex/demultiplex portion 81, the VP-SW internal identifier conversion portion 183, the OAM portion 16, the MC portion 17 and the header conversion portion 18c. The basic processing unit 5B still further comprises an internal identifier converting table 184 connected to the header conversion portion 18c.

On the other hand, the add processing unit 7A comprises a VC-SW internal identifier conversion portion 185, the UPC portion 14 and the accounting portion 15. The VC-SW internal identifier conversion portion 185 is connected in parallel to the VP-SW internal identifier conversion portion 183 between the multiplex/demultiplex portion 81 and the selector 6a. The UPC portion 14 is so connected between the selectors 6a and 6b as to be parallel to a direct-connection wire of these selectors. The accounting portion 15 is so connected between the selectors 6b and 6c as to be parallel to a direct-connection wire of these selectors.

Among the above elements, the functions of the multiplex/demultiplex portion 81, the UPC portion 14, the accounting portion 15, the OAM portion 16 and the MC portion 17 are the same as those in each of the separate configuration examples given above, and hence their repetitive explanations will be omitted.

The VP-SW internal identifier conversion portion 183 incorporates a function to convert a 3-bit VPI and a 1-bit UVP (data indicating whether or not only a UVP service is conducted without effecting a VC conversion) into 6-bit internal identifiers. On the other hand, VC-SW internal identifier conversion portion 185 converts a 5-bit VCI into the 6-bit internal identifier.

The selector 6a switches processing to permit passage of the cells processed by the VP-SW internal identifier conversion portion 183 or permit passage of the cell processed by the VC-SW internal identifier conversion portion 185. The selector 6b switches processing to permit the cell processed by the UPC portion 14 or to permit passage of the unprocessed cell. Further, the selector 6c switches processing to permit passage of the cell processed by the accounting portion 15 or to permit passage of the unprocessed cell.

The header conversion portion 18c converts the cell internal identifier converted by the VP-SW internal identifier conversion portion 183 or the VC-SW internal identifier conversion portion 185 into an output destination VPI through the internal identifier converting table 184.

The microprocessor 19 controls the VP-SW internal identifier conversion portion 183, the VC-SW internal identifier conversion portion 185, the UPC portion 14, the accounting portion 15, the OAM portion 16, the MC portion 17 and the VPI conversion portion 18c.

The discussion given above has dealt with the cell transfer from the subscriber's terminal 1 via the transmission line corresponding unit 3B to the switch 4. Conversely to this, the cell can be transferred from the switch 4 via the transmission line corresponding unit 3B to the subscriber's terminal 1.

According to such a construction, the respective cells processed by the individual units 31B-1 to 31B-N are batch-processed by the basic processing unit 5B provided in the common unit 32B. The basic processing unit 5B identifies each cell on the basis of the identification flag added to the cell header in order to distinguish the cells sent from the individual units 31B-1 to 31B-N and thus processes the cells. As described above, the OAM portion 16, the MC portion 17, the header conversion portion 18c within the basic processing unit 5B are connected in common to the individual units 31-B through 31B-N, and the transmission line corresponding unit 3B can be down-sized.

Figure 40:
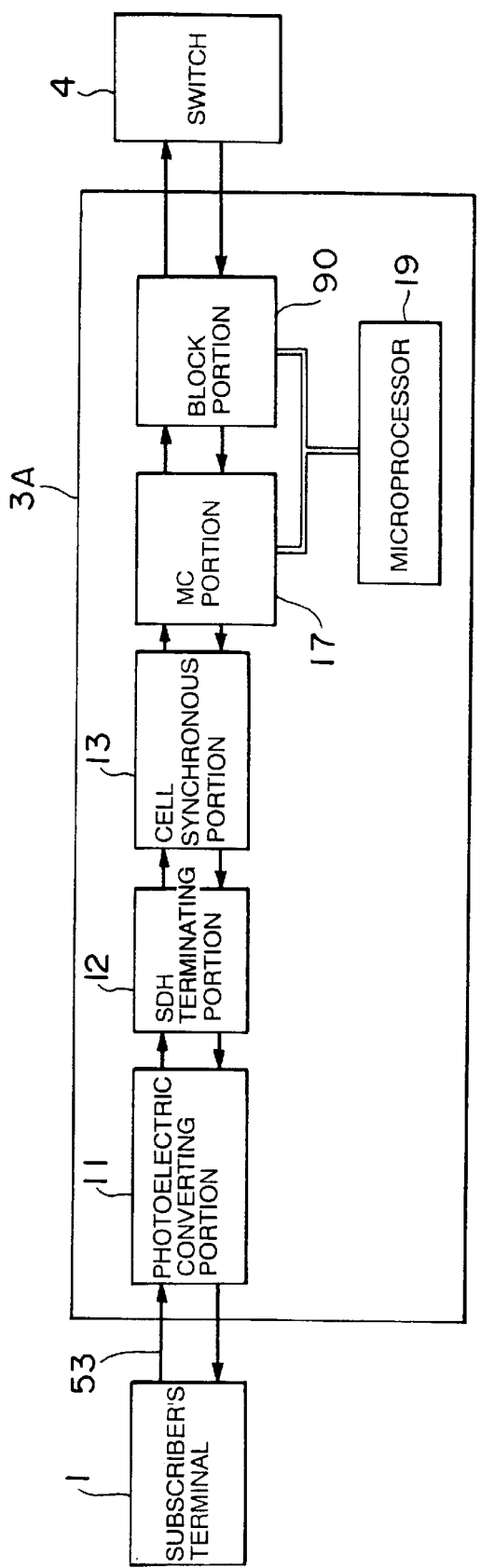
FIG. 40 is a block diagram illustrating a configuration of the transmission line corresponding unit in a second type of switching equipment.

FIG. 40 is a schematic diagram schematically illustrating an ATM switching equipment including all the circuits of the transmission line corresponding unit 3 for every transmission line. This ATM switching equipment has much the same configuration as that of the first type ATM switching equipment shown in FIG. 29, excluding a difference of the internal configuration of the transmission line corresponding unit 3. Accordingly, the explanation is herein centered on only a transmission line corresponding unit 3A, and hence the repetitive explanations of other configurations will be omitted.

One subscriber's terminal 1 is connected via the subscriber's transmission line 53 to an I/O terminal of this transmission line corresponding unit 3A. The ATM cell switch 4 is connected to the other I/O terminal of the transmission line corresponding unit 3A. That is, this transmission line corresponding unit 3A is provided corresponding to one subscriber's terminal 1.

The transmission line corresponding unit 3A includes the photoelectric conversion portion 11, the SDH terminating portion 12, the cell synchronous portion 13, the MC portion 17, a block portion 90 and the microprocessor 19. That is, this second type ATM switching equipment is characterized by separating the OAM portion 16, the UPC portion 14, the accounting portion 15 and the VPI/VCI conversion portion 18 in the first type ATM switching equipment 10 into a processing portion 17 for processing the cells in real time and a processing portion 90 for processing the cells while allowing a time-delay. Note that the photoelectric converting portion 11, the SDH terminating portion 12 and the cell synchronous portion 13 have the same functions as those in the first type ATM switching equipment 10, and hence their repetitive explanations will be omitted. Further, the microprocessor 19 incorporates controls the MC portion 17 and the block portion 90.

The MC portion 17 is a portion for monitoring the cell quality by measuring the cell error characteristic, the cell loss characteristic and the cell delay characteristics by use of the MC cells. For this reason, the MC portion 17 is required to make an extraction timing and an insertion timing of the MC cell coincident with each other. That is, the MC portion 17 processes the MC cells in real time.

The block portion 90 provides blocked processes permissible even when there is a deviation between the extraction and insertion timings of an item of header data and an OAM cell. That is, the block portion 90 blocks, e.g., the UPC portion 14, the accounting portion 15, the OAM portion 16 and the header conversion portion 18.

Figure 41:
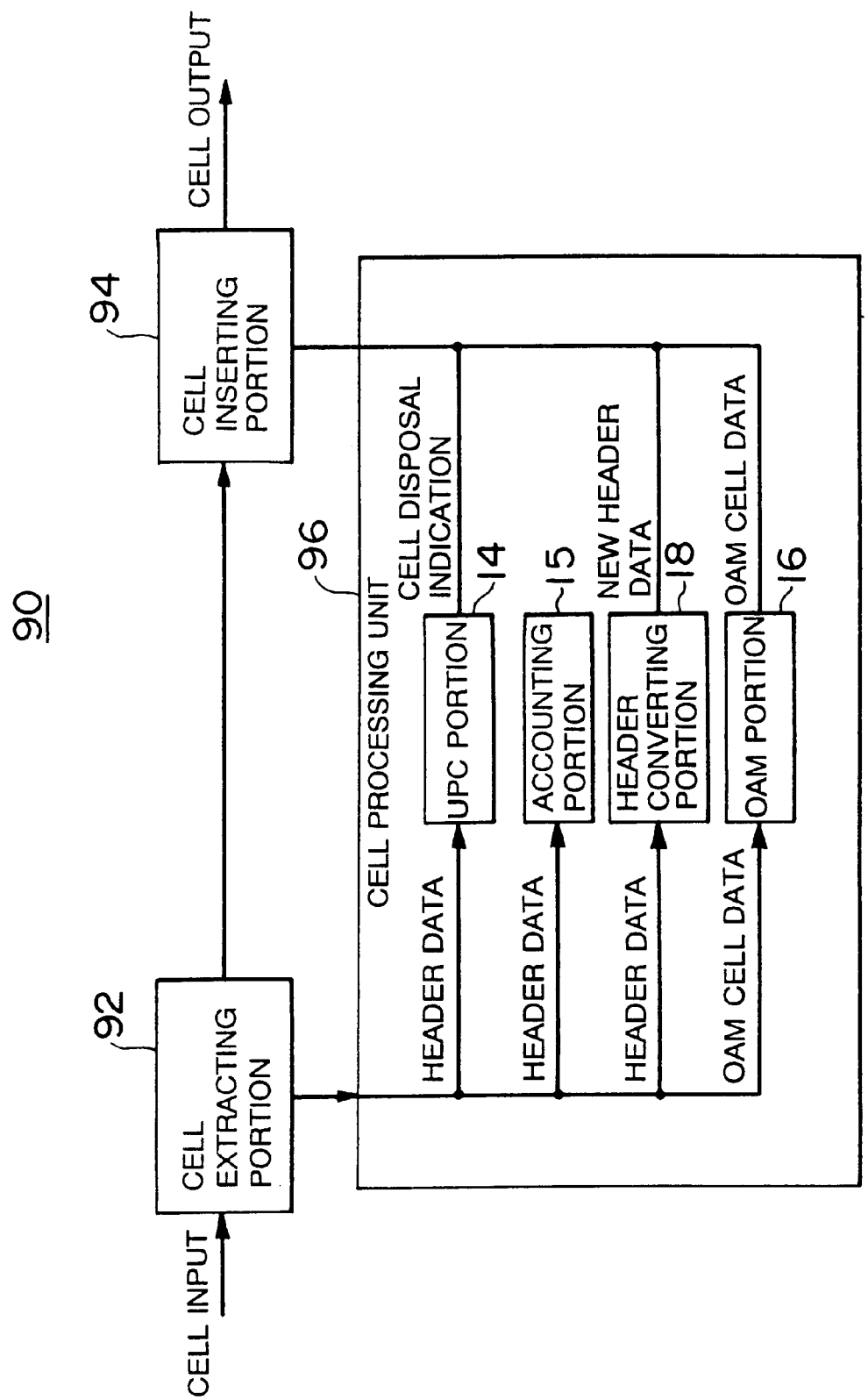
FIG. 41 is a block diagram illustrating a detailed configuration of a block portion in FIG. 40.

FIG. 41 illustrates a specific configuration of the block portion 90. The block portion 90 includes a cell extracting portion 92, a cell inserting portion 94 and a cell processing portion 96. The cell extracting portion 92 extracts the header data from the cells inputted and, at the same time, outputs these items of data to the cell processing portion 96.

The cell processing portion 96 is constructed of the UPC portion 14, the accounting portion 15, the header conversion portion 18 and the OAM portion 16, which are connected in parallel to each other. This cell processing portion 96 is constructed so that each element of the cell processing portion 96 uses the cell extracting portion 92 and the cell inserting portion 94 in common.

The UPC portion 14 inputs the header data extracted by the cell extracting portion 92 and determines whether or not an inflow of the cells is permitted on the basis of this item of header data. The UPC portion 14, if the cell inflow should not be permitted, indicates to the cell inserting portion 94 to dispose of the cells.

The accounting portion 15 inputs the header data extracted by the cell extracting portion 92 and increments the number of cells on the basis of this item of header data, thus performing the accounting in accordance with the number of cells.

The header conversion portion 18 inputs the header data extracted by the cell extracting portion 92, converts this item of header data into a new item of header data and outputs the thus converted header data to the cell inserting portion 94.

The OAM portion 16 inputs the OAM cell data extracted by the cell extracting portion 92 and performs both cell receive processing and a creation of the OAM cells with respect to this item of OAM cell data.

The cell inserting portion 94 disposes of the cells in conformity with the cell disposal indication sent from the UPC portion 14 within the cell processing portion 96. The cell inserting portion 94 re-adds the new item of header data to the cell header in accordance with the new header data sent from the header conversion portion 18 within the cell processing portion 96. The cell inserting portion 94 inserts the OAM cell in accordance with the OAM cell data sent from the OAM portion 16 within the cell processing portion 96.

The operations explained above are those on the upstream side from the subscriber's terminal 1 to the switch 4. Only the accounting portion 15 and the OAM portion 16 operate on the downstream side from the switch 4 to the subscriber's terminal 1 as shown in FIG. 42. In this case, the UPC portion 14 and the header conversion portion 18 do not operate.

According to the second type ATM switching equipment illustrated in FIG. 40, the internal circuits of the transmission line corresponding unit 3A are separated into the MC portion 17 in which the extraction and insertion timings of the MC cells are required to be coincident with each other and the block portion 90 in which there is permitted some deviation between the extraction timing and the insertion timing of the header data and the OAM cell data. Then, the UPC portion 14, the accounting portion 15, the header conversion portion 18 and the OAM portion 16 that are provided in the block portion 90 employ the single cell extracting portion 92 and the single cell inserting portion 94 in common, thereby attaining the down-sizing of the transmission line corresponding unit 3A.

First Embodiment

The elements in the above-discussed separate configuration examples 1 through 4 of the individual unit and the common unit in the transmission line corresponding unit are packaged in the ATM switching equipment in accordance with this embodiment.

In this embodiment, the transmission line corresponding unit 3 is separated into a plurality of individual units 31 that have to be provided corresponding to the subscribers and the common units 32 that can be commonized into one unit. These elements are respectively packaged on separate circuit boards.

Figure 1:
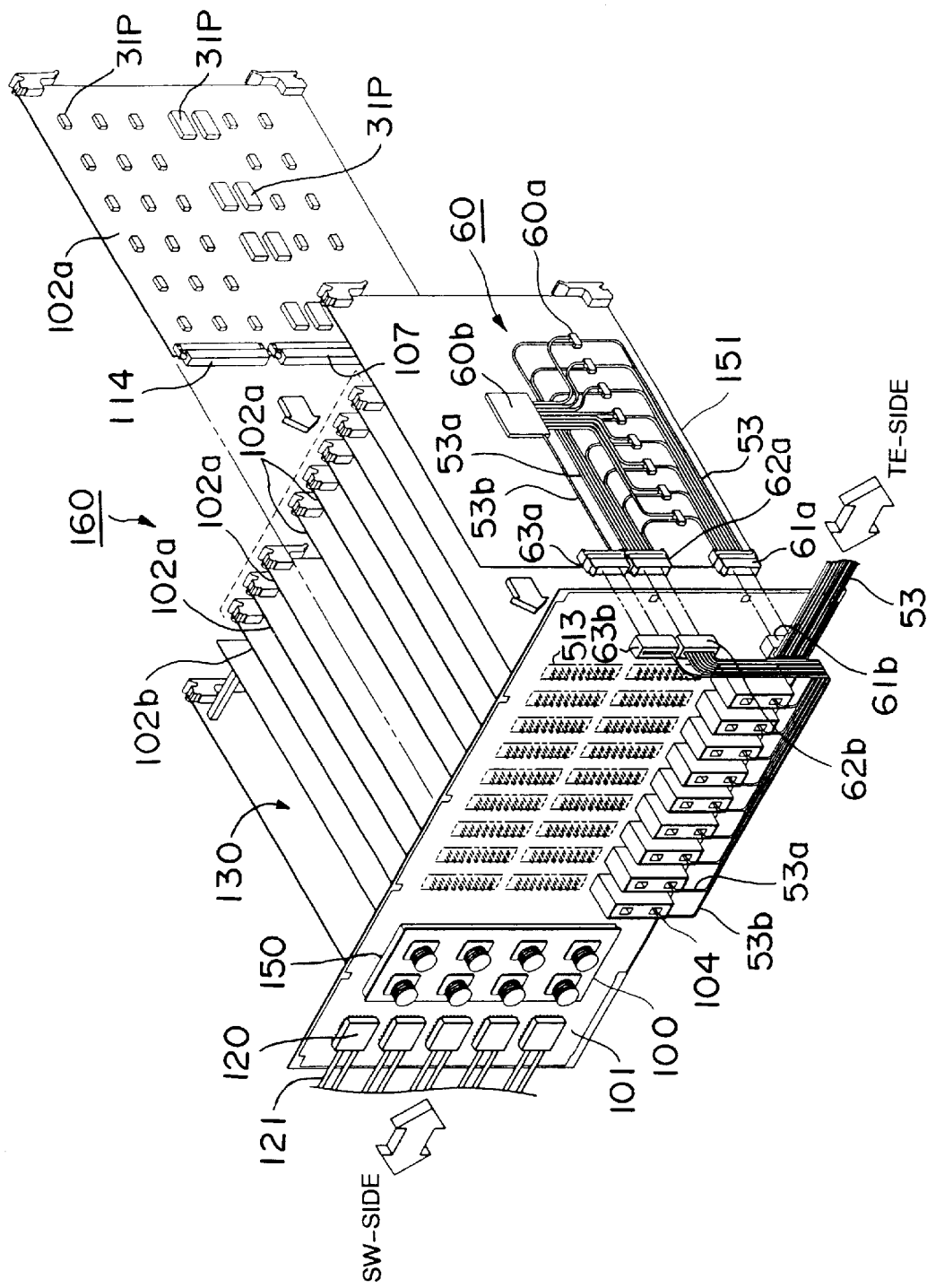
FIG. 1 is a perspective view illustrating a package shelf in a first embodiment of the present invention.

FIG. 1 illustrates a circuit board packaging structure in accordance with this embodiment. FIG. 1 illustrates a situation wherein only a package shelf 160 corresponding to one transmission line corresponding unit 3 is removed from the ATM switching equipment.

This package shelf 160 is assembled based on a bookshelf structure composed of a back wiring board 101 (hereinafter abbreviated as BWB) serving as a circuit board and a plurality of circuit boards (an individual unit package board 102, a common unit package board 130, a coupler package board 151 and an auxiliary board 100) connected to the BWB 101. More specifically, the individual unit package board 102, the common unit package board 130 and the coupler package board 151 are connected to the rear surface of board (BWB) 101 in such a manner that these package boards are perpendicular to the board (BWB) 101 and parallel to each other. Further, the auxiliary board 100 is connected through an electric connector 150 to the front surface of the board (BWB) 101 in such manner that the board 100 is parallel to the board (BWB) 101.

The board (BWB) 101 is a circuit board for electrically or optically connecting the circuits to each other on the boards 102, 130, 151. An illustration of wiring printed on the board (BWB) 101 and serving to make this electric connection is omitted to avoid unnecessarily complicating the figure.

Also connected to the external surface of the board (BWB) 101 are an optical cable 53 (hereinbelow termed a [subscriber-side optical cable 53]) serving as the subscriber's transmission line 53, an optical cable 121 (hereinafter termed a [switch-side optical cable 121]) leading to the ATM cell switch 4 and optical modules 104, 120 for connecting the circuits on the respective boards 102, 130, 151. Among them, the subscriber-side optical module 104 is an optical module for connecting the subscriber-side optical cable 53 to the individual unit package board 102. Further, the switch-side optical module 120 is an optical module serving as a switch-side interface for connecting the switch-side optical cable 121 to the common unit package board 130.

The individual unit package board 102 is a circuit board packaged with respective parts 31P (e.g., LSIs but exclusive of the photoelectric converting portion 11) constituting the individual unit 31. Altogether, nine sheets of the individual unit package boards 102 are connected. That is, there are connected eight sheets of package boards 102a packaged with 0-system (active system) individual units 31-1 through 31-N and one sheet of package board 102b packaged with the 1-system (standby system) individual unit 31-(N+1).

A first electric connector 114 for connection to the common unit 32 and a second electric connector 107 for connection to the optical module 104 are attached to a front edge of the individual unit package board 102.

The coupler package board 151 is a board for packaging the selector 60 illustrated in FIG. 29. This selector 60 is composed specifically of a beam splitter 60a and a switching device 60b. This switching device 60b is constructed to switch a cable, for connection to 1-system output-side optical cable, among N-system (herein, N=8) input-side optical cables.

The coupler package board 151 is used only for packaging such an optical circuit and therefore connected to the board (BWB) 101 through optical connectors 61–63. Hereinafter, a configuration of the optical circuit on the coupler package board 151 will be explained.

The first optical connector 61 is an optical connector for leading the subscriber-side optical cable 53 from the subscriber's terminal 1 connected to the board (BWB) 101 to the coupler package board 151. Accordingly, this first optical connector 61 has a structure for connecting the 8-system subscriber's transmission line cables 53 which is the same number as the number of the 0-system (active system) individual package boards 102a. Each subscriber-side optical cable 53 extending from the package board side portion 61a of this optical connector 61 is connected to the beam splitter 60a.

This beam splitter 60a works to branch off the subscriber-side optical cable 53 into an 0-system (active system) subscriber-side optical cable 53a and a 1-system (standby system) subscriber-side optical cable 53b.

The second optical connector 62 is an optical connector for connecting bundles of the 0-system (active system) optical cables 53 to the board (BWB) 101. Each 0-system (active system) subscriber-side optical cable 53a extending from a side portion 62b of this second optical connector 62 on the side of the board (BWB) 101 is connected to the corresponding subscriber-side optical module 101 (connected to the 0-system individual unit package board 102a).

On the other hand, the 1-system (standby system) subscriber-side optical cable 53b is connected to the input terminal of the switching device 60b.

The third optical connector 63 is an optical connector for connecting a single line of optical cable 53b connected to the output terminal of the switching device 60b to the board (BWB) 101. The 1-system (standby system) subscriber-side optical cable 53b extending from a side portion 63b of this third optical connector 63 on the side of the board (BWB) 101 is connected to the optical module 104 (connected to the 1-system individual unit package board 102b).

The common unit package board 130 is a circuit board packaged with some parts exhibiting comparatively large exothermic quantity among the parts (e.g., LSIs) constituting the common unit 32. A first electric connector for connection to the individual unit 31 and a second electric connector for connection to the optical module 120 are, as in the case of each individual unit package board 102, are attached to the front edge of this common unit package board 130.

The auxiliary board 100 is a circuit board packaged with parts exhibiting a relatively small exothermic quantity among the parts (e.g., LSIs) constituting the common unit 32.

According to the above construction, communications data transmitted in the form of optical signals from the subscriber's terminal 1 are inputted via the first optical connector 61 to the coupler package board 151. Then, the communications data pass through the selector 60 on this coupler package board 151 and are inputted to the subscriber corresponding optical module 104 on the board (BWB) 101 via the second optical connector 62 or the third optical connector 63. The communications data converted into electric signals by this subscriber-side optical module 104 are inputted to the individual unit package board 102. When the cells are processed by the individual units on this individual unit package board 102, the cells are temporarily transferred back to the board (BWB) 101 and then inputted to the auxiliary board 100 and the common unit package board 130. The cells processed by the common unit 32 on this common unit package board 130 are inputted to the switch-side optical module 120 on the board (BWB) 101. The cells converted into the optical signals by this switch-side optical module 120 are transferred to the ATM cell switch 4.

A specific construction of a connecting structure between the board (BWB) 101 and the individual unit package board 102 will now be provided. Note that a connecting structure between the board (BWB) 101 and the common unit package board 130 is also substantially the same as the above, and its explanation will therefore be omitted.

Figure 2:
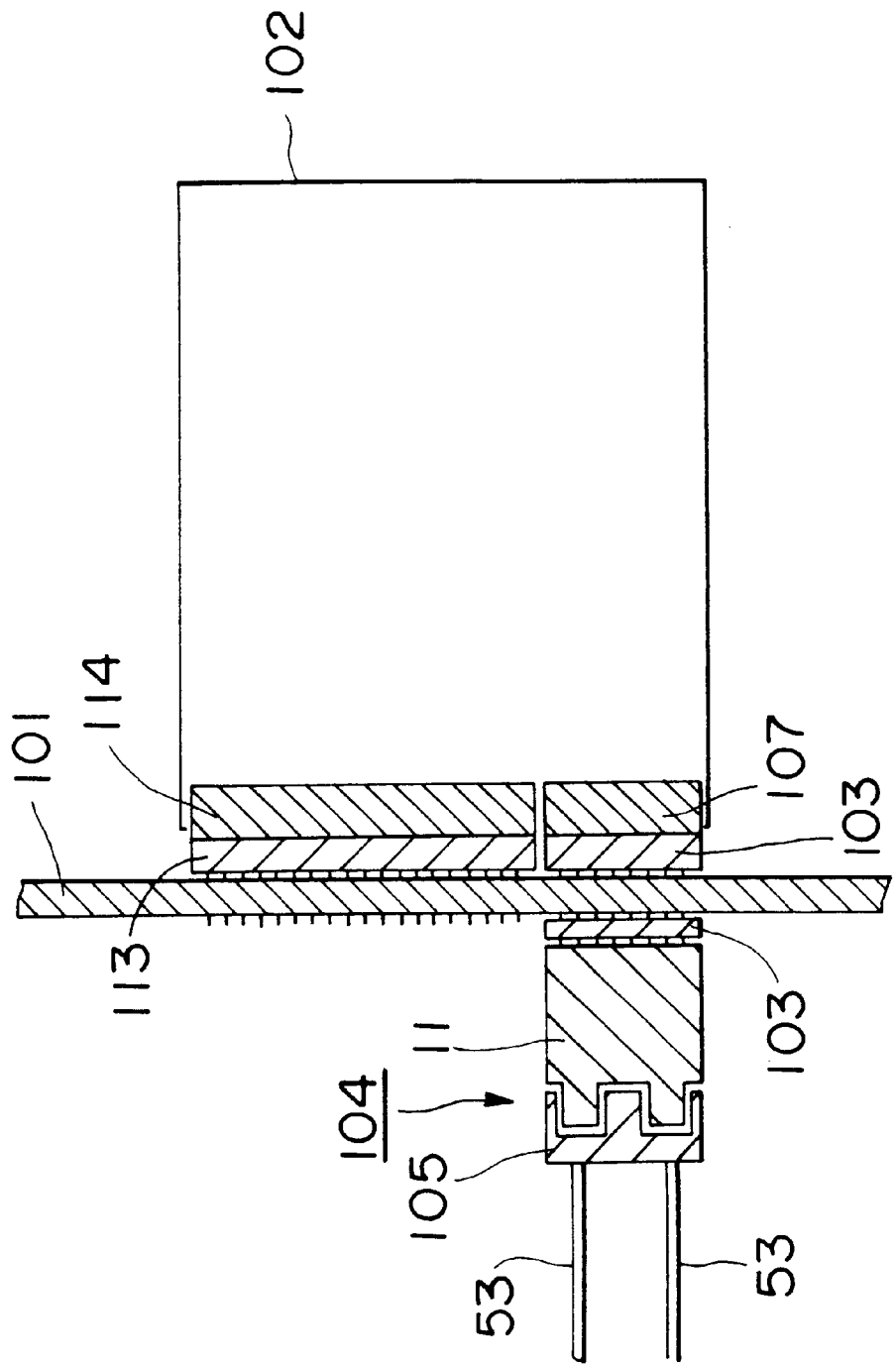
FIG. 2 is a sectional view illustrating a subscriber's transmission line optical module and an individual unit oriented package board corresponding thereto in FIG. 1.

FIG. 2 is a sectional view illustrating the subscriber-side optical module 104, the board (BWB) 101 and the first and second electric connectors 114, 107. In FIG. 2, unlike FIG. 1, the illustration of the casing for enclosing the subscriber-side optical module 104 is omitted.

This subscriber-side optical module 104 includes an optical connector 105 connected to the optical cable 53 and the photoelectric converting portion 11 connected to this optical connector 105. This optical module 104 deals with a signal of 155 Mbps.

The optical connector 105 optically connects the optical cable 53 to the photoelectric converting portion 11. Further, the photoelectric converting portion 11 is connected to the second electric connector 107 of the individual unit package board 102 via a connector 103 which electrically traverses the board (BWB) 101.

The board (BWB) 101 is normally in the of order 2.4 mm in thickness and is small in terms of an electrical deterioration even when the electric signal converted from the optical signal is inputted via the board (BWB) 101 to the individual unit package board 102.

Also, the board (BWB) 101 is provided with an individual unit/common unit connector 113 for connecting the individual units 31 packaged on the individual unit package board 102 to the common unit 32 by a linkage to the first electric connector 114 provided at the front edge of the individual unit package board 102.

As described above, the individual unit package board 102 is attachable and detachable between the first electric connector 114 and the individual unit/common unit connector 113 and between the second electric connector 107 and the connector 103. The individual unit package board 102 is thereby easily attachable to and detachable from the board 101 including the common unit 32 (the common unit package board 130 and the auxiliary board 100).

Figure 3:
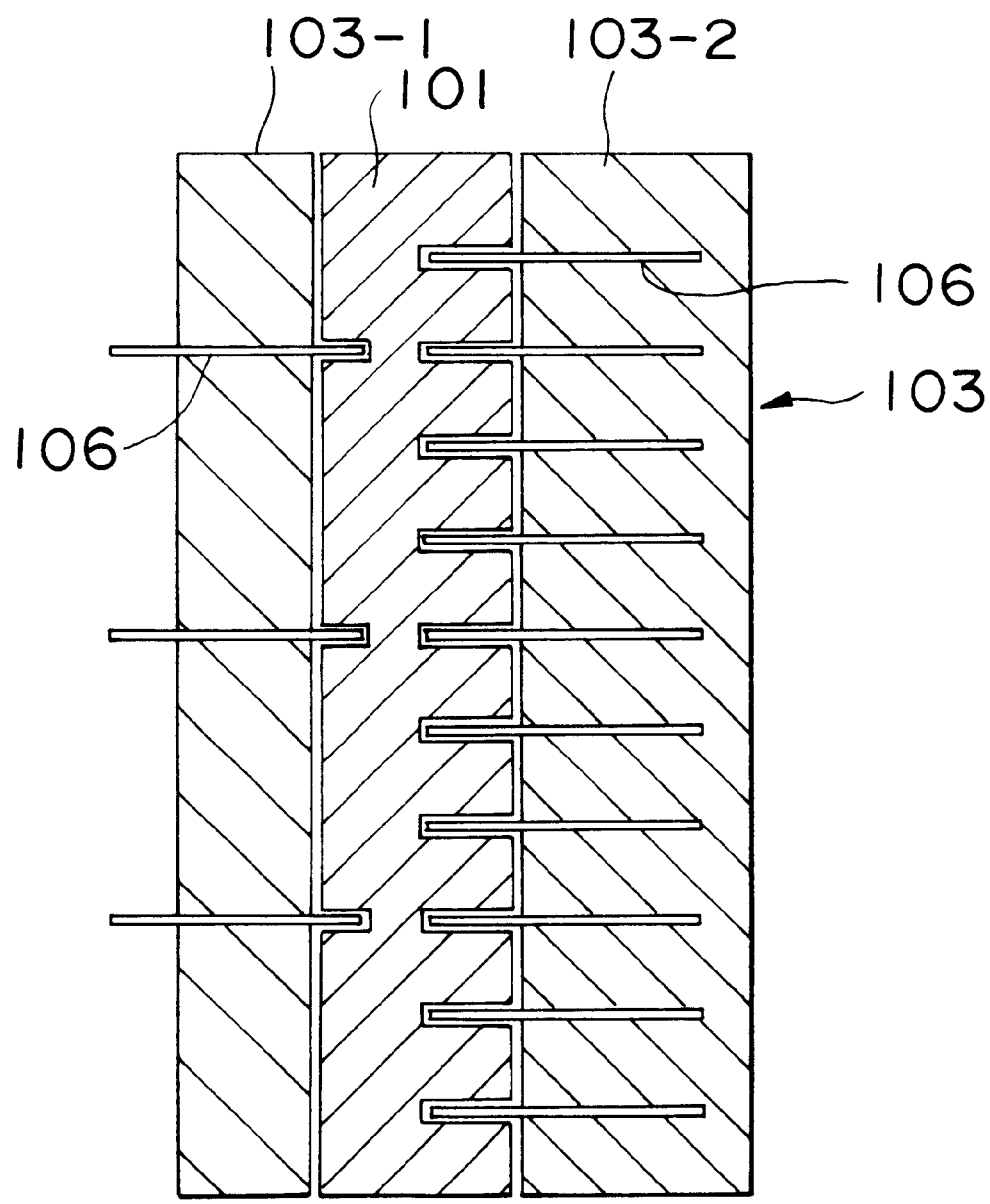
FIG. 3 is a sectional view of a structure of a non-penetration type connector in FIG. 2.

As illustrated in FIG. 3, the connector 103 has an outer connector housing 103-1 formed outwardly of the board (BWB) 101 and an inner connector housing 103-2 formed inwardly of the board (BWB) 101. The outer and inner connector housing 103-1, 103-2 are respectively perforated with small holes for fitting the terminals. This small hole accommodates a metal tube (connector contact) 106 fitted to the terminal of the second electric connector 107 or the optical module 104 and thus electrically connected thereto. Then, the metal tubes 106 of the outer and inner connector housings 103-1, 103-2 are respectively inserted into the board (BWB) 101 and electrically connected to each other.

Thus, it is possible to construct the structure for supplying the signals to the individual units 31 without forming holes in the board (BWB) 101 for the optical cables. As a result, the board can be kept strong, and the board area can be effectively utilized.

Figure 4:
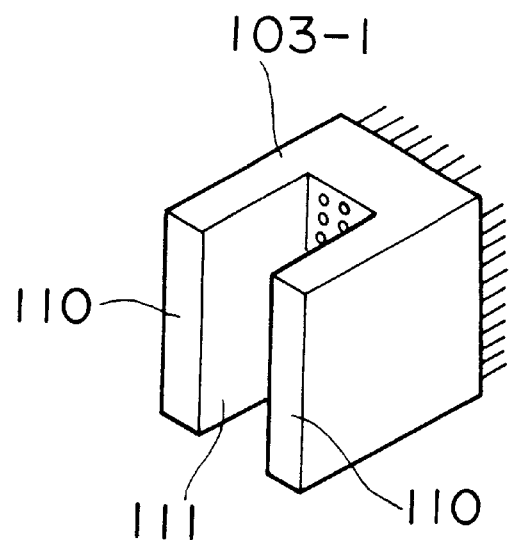
FIG. 4 is a view illustrating a single unit of connector in FIG. 3.
Figure 5:
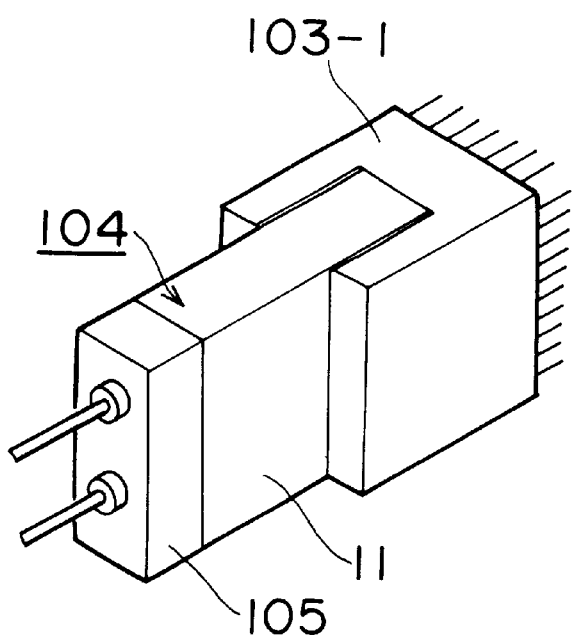
FIG. 5 is a perspective view illustrating a connecting state of the optical module to the connector.

As shown in FIG. 4, the outer connector housing 103-1 has parallel holding walls 110 protruding right and left. Further, as illustrated in FIG. 5, the optical module 104 is fitted in between these holding walls 110. An internal surface of the holding wall 110 is covered with a shield film 111 composed of a metal or a resin containing metallic powder. This shield film 111 prevents an electric disturbance from affecting the connector member. Providing such holding walls 110 increases the mechanical strength or the structure. Note that the holding walls 110 may be constructed to hold not only the right and left portions of the optical module 104 but also the entire periphery thereof including the upper and lower portions.

Within the board (BWB) 101, 155 Mbps I/O signals of the optical module 104 are transmitted in the thickness direction thereof, and, hence, an effective signal line (through-hole) within the board (BWB) 101 is provided with a shield structure for preventing deterioration of the electric characteristic due to an crosstalk or the like.

Figure 6:
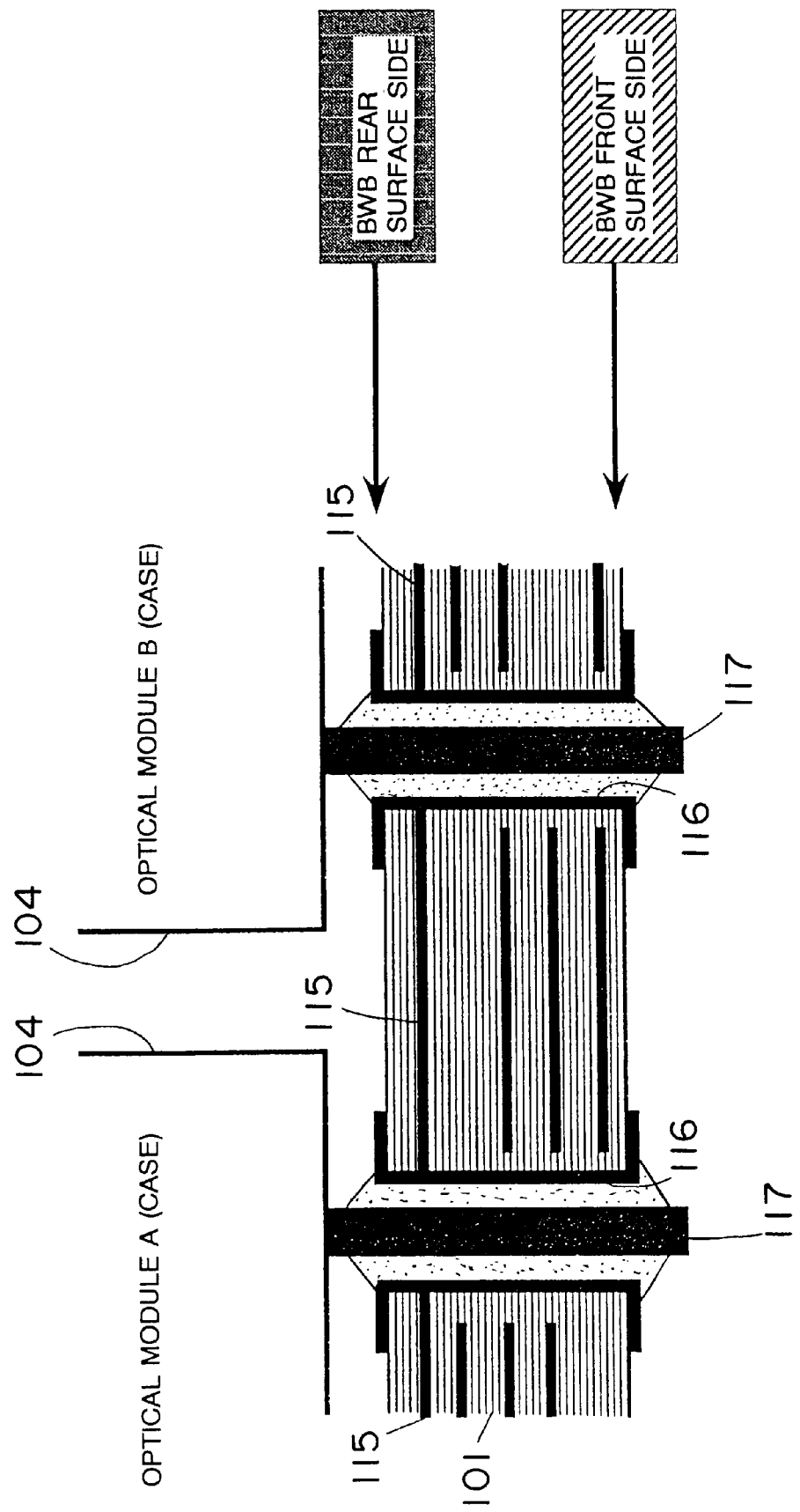
FIG. 6 is a sectional view showing a ground structure within the board.
Figure 7:
FIG. 7 is a sectional view of the board.
Figure 8:
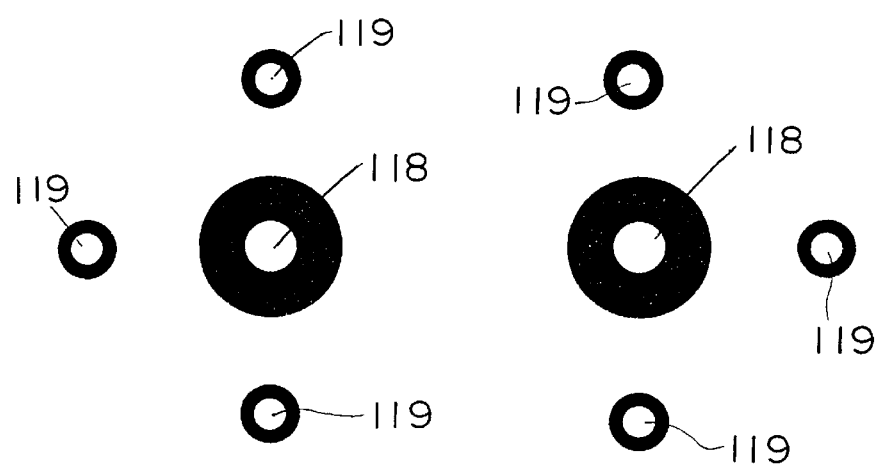
FIG. 8 is a plan view of the board.

Next, FIGS. 6 to 8 illustrate a ground structure incorporated into the board (BWB) 101.

FIG. 6 illustrates a first ground structure. To be specific, a ground layer 115 is connected to the one which is the same as a ground potential employed for a circuit constituting the transmission line corresponding unit 3 and the subscriber-side optical module. Further, the ground layer 115 is connected to a ground oriented through-hole 116 passing through within the board (BWB) 101, and a ground terminal 117 is inserted through this ground oriented through-hole 116 and thus connected thereto.

FIGS. 7 and 8 illustrate a second ground structure. That is, the interior of the board (BWB) 101 is formed with two signal terminal oriented through-holes 118 for receiving signal terminals of the subscriber-side optical module 104. A plurality of ground corresponding via-holes 119 are formed to encircle the periphery of this through-hole 118. In accordance with this embodiment (see FIG. 8), three pieces of ground corresponding via-holes 119 are provided for every signal terminal oriented through-hole 118. Also, it is desirable that respective grounds of the subscriber-side optical modules 104 accommodated corresponding to the transmission lines be the same in the sense that the ground potential is made coincident. This ground corresponding via-hole 119 functions as a shield structure for preventing the deterioration of the electric deterioration due to the crosstalk or the like.

Note that interfaces of the transmission line corresponding unit 3 are needed at the following two portions. To begin with, a first interface is, as already explained, an interface element to the subscriber through the subscriber-side optical module 104. Herein, the signal speed is 155 Mbps. A second interface is an interface element for connecting the transmission line corresponding unit 3 constructed of the individual units 31 and the common unit 32 to the switch system 4. This interface element is composed of a switch-side optical module 120 constructed of an electro-optic converting device. The interface element is, as illustrated in FIG. 1, packaged on the external surface of the board (BWB) 101.

Next, there will be described a box body 161 for housing the thus constructed package shelves 160.

Figure 9:
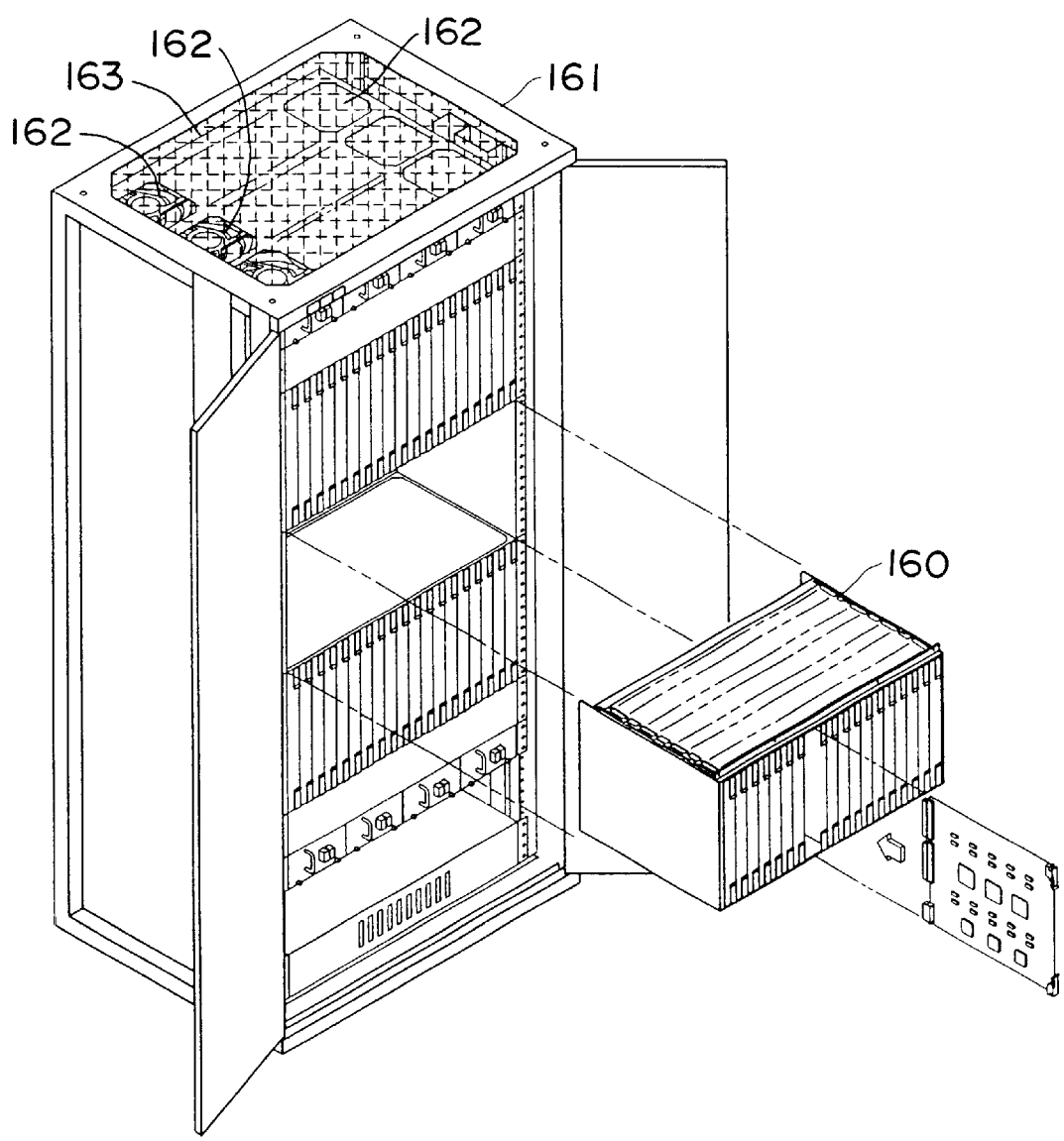
FIG. 9 is a perspective view of a construction wherein the package shelf of FIG. 1 is housed in a box body.

As shown in FIG. 9, the box body 161 has a box-shape which houses the package shelves 160 corresponding to the plurality of transmission line corresponding units 3 in such a manner that the package shelves are stacked in multi-stages. In this arrangement, each package shelf 160 is installed in the box body 161 so that the individual unit package board 102, the common unit package board 130 and the coupler package board 151 are directed towards the door thereof. Accordingly, the package boards can be easily removed and replaced without demounting all the package shelves 160. For this reason, operation of the transmission line corresponding units 3 does not have to stop when some package boards are removed.

The upper surface of the box body 161 is formed with a ventilation hole 163 provided with wire netting. This ventilation hole 163 is internally formed with PULL-fans 162 for forcibly sucking the air from the inside of the box body 161 toward the outside. Similarly, though not illustrated, the lower surface of the box body 161 is formed with a ventilation hole provided with wire netting. The interior of this ventilation hole is formed with PUSH-fans for forcibly causing an inflow of the air from the outside of the box body 161 towards the inside thereof.

Consequently, the cool air is blown from the lower portion toward the upper portion within the box body 161. Thus, the circuits packaged on the package shelves 160 are cooled off. In particular, the above-stated bookshelf configuration is adopted, and the individual unit package board 102, the common unit package board 130 and the coupler package board 151 are arranged along a direction of the cooling air. It is therefore possible to prevent the flow of cool air from being shut off and to maintain good cooling efficiency.

Note that an allowable dissipation of electric power based on the above forced air cooling is in the order of 50 W for 0.6 in. 1-sheet width packaging and 72 W (two units/rack) for 0.6 in. 2-sheet width packaging. Hence, the manner in which the dissipation of electric power of 100 W is accomplished is important for the practical construction of a one-transmission line/printed circuit board. However, as in this embodiment, a configuration adapted for air cooling can be provided by the above separation of the common unit 32 and the individual units 31.

As discussed above, in accordance with this embodiment, the transmission line corresponding unit 3 is separated into the individual units 31 and the common unit 32 in the ATM switching equipment. The subscriber-side optical module 104 is arranged on the board (BWB) 101, corresponding to the individual unit package board 102 packaged with the individual units 31. Accordingly, down-sizing of the equipment can be attained. Besides, the subscriber-side optical module 104 is arranged outwardly of the board (BWB) 101, and it is therefore feasible to maintain the a high strength of the board (BWB) 101 without perforating the board (BWB) 101 with holes for the optical cables 53 as is done in the prior art arrangements. Further, a variety of packaging layouts are practicable, and a high degree of freedom of wiring design and wiring accommodatability is achieved.

Second Embodiment

The elements in the above-discussed separate configuration examples 1 to 4 of the individual unit and the common unit in the transmission line corresponding unit are packaged in the ATM switching equipment in accordance with this embodiment.

A second embodiment is, as compared with the first embodiment, characterized by the following points. A plurality (three sheets) of individual unit package boards 202 (see FIG. 10) are arranged not only in the major-axis direction of the board (BWB) 101 but also in the minor-axis direction thereof. The common unit 32 is packaged on a board (BWB) 201. There are provided an auxiliary board 200a packaged with the 0-system (active system) common unit 32 and an auxiliary board 200b packaged with the 1-system (standby system) common unit 32. Hereinafter, a specific configuration will be explained.

Figure 10:
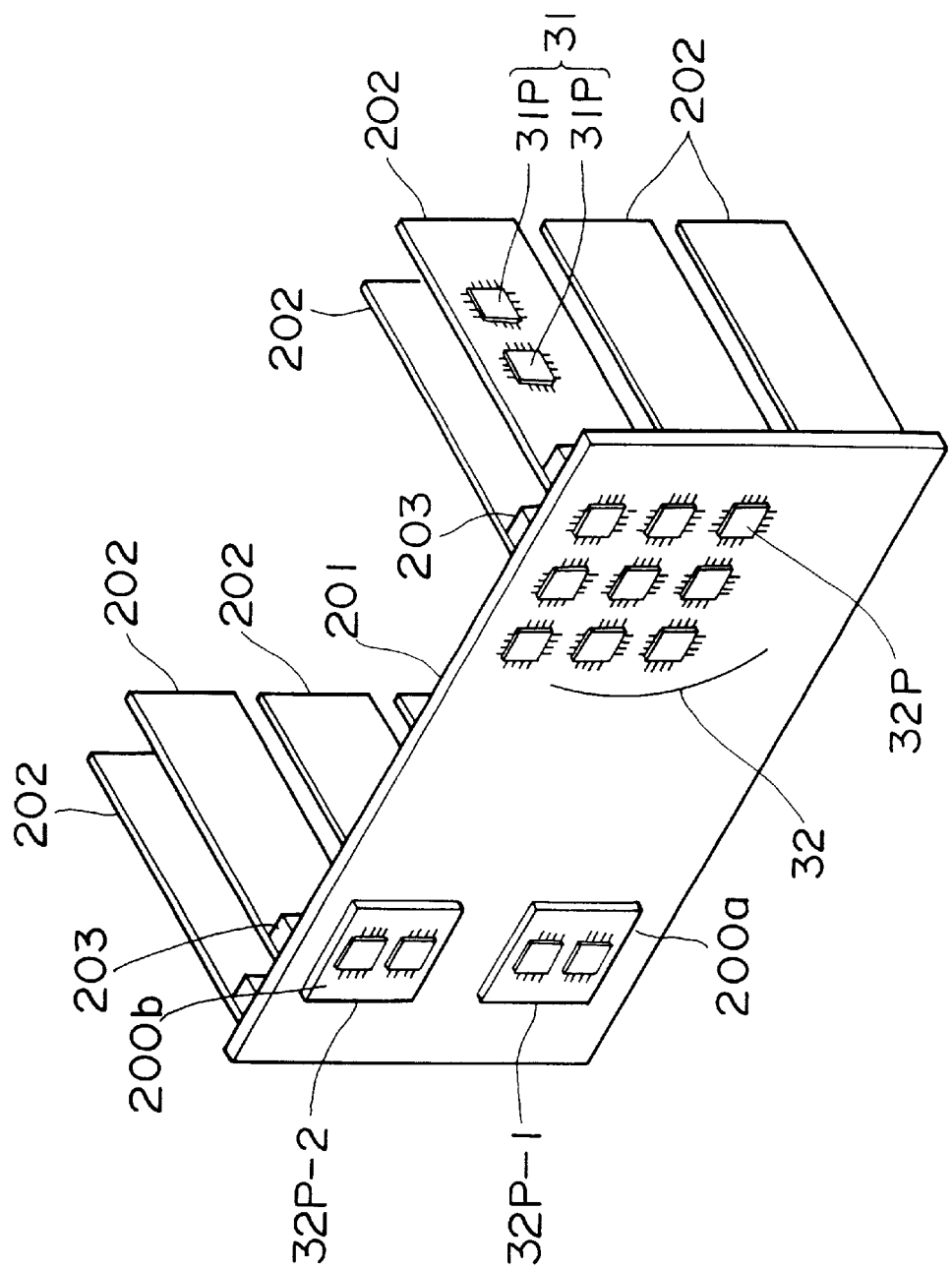
FIG. 10 is a perspective view illustrating a package shelf in a second embodiment of the present invention.
Figure 11:
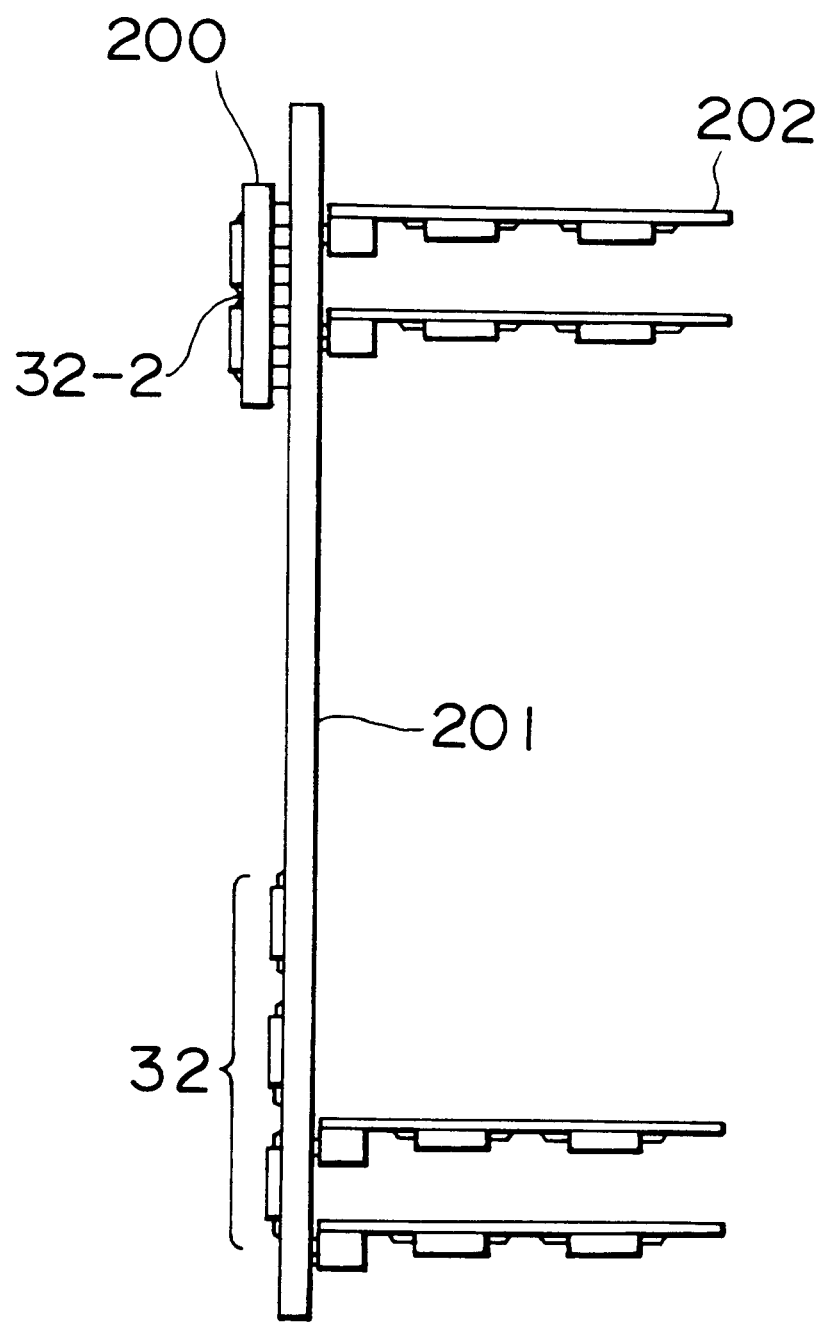
FIG. 11 is a plan view of the package shelf of FIG. 10.

As illustrated in FIGS. 10 and 11, eight sheets of individual unit package boards 202 each packaged with the parts 31P (e.g., LSIs) of the individual unit are connected corresponding to eight subscriber transmission lines to the inner surface of the board (BWB) 201 in such a way that these boards 202 are orthogonal to the inner surface of the board (BWB) 201. The individual unit package board 202 is detachably connected to a connector 203 fixed to the board (BWB) 201 and also electrically connected to the common unit 32. Connected further to the outer surface of the board (BWB) 201 are the auxiliary boards 200a, 200b each packaged with parts 32P (e.g., LSIs) constituting the common unit 32.

More specifically, referring to FIG. 10, 32P-1 represents circuit parts used only for the 0-system (active system) in the common unit 32, while 32P-2 designates circuit parts employed only for the 1-system (standby system) in the common unit 32. The 0-system (active system) circuit parts 32P-1 are packaged on the auxiliary board 200a. Also, the 1-system (standby system) circuit parts 32P-2 are packaged on the auxiliary board 200b. Then, these auxiliary boards 200 are mounted on the board (BWB) 201.

Other configurations in this second embodiment are the same as those in the first embodiment, and hence other repetitive explanations will be omitted.

Third Embodiment

The elements in the above-discussed separate configuration examples 1 to 4 of the individual unit and the common unit in the transmission line corresponding unit are packaged in the ATM switching equipment in accordance with this embodiment.

Figure 12:
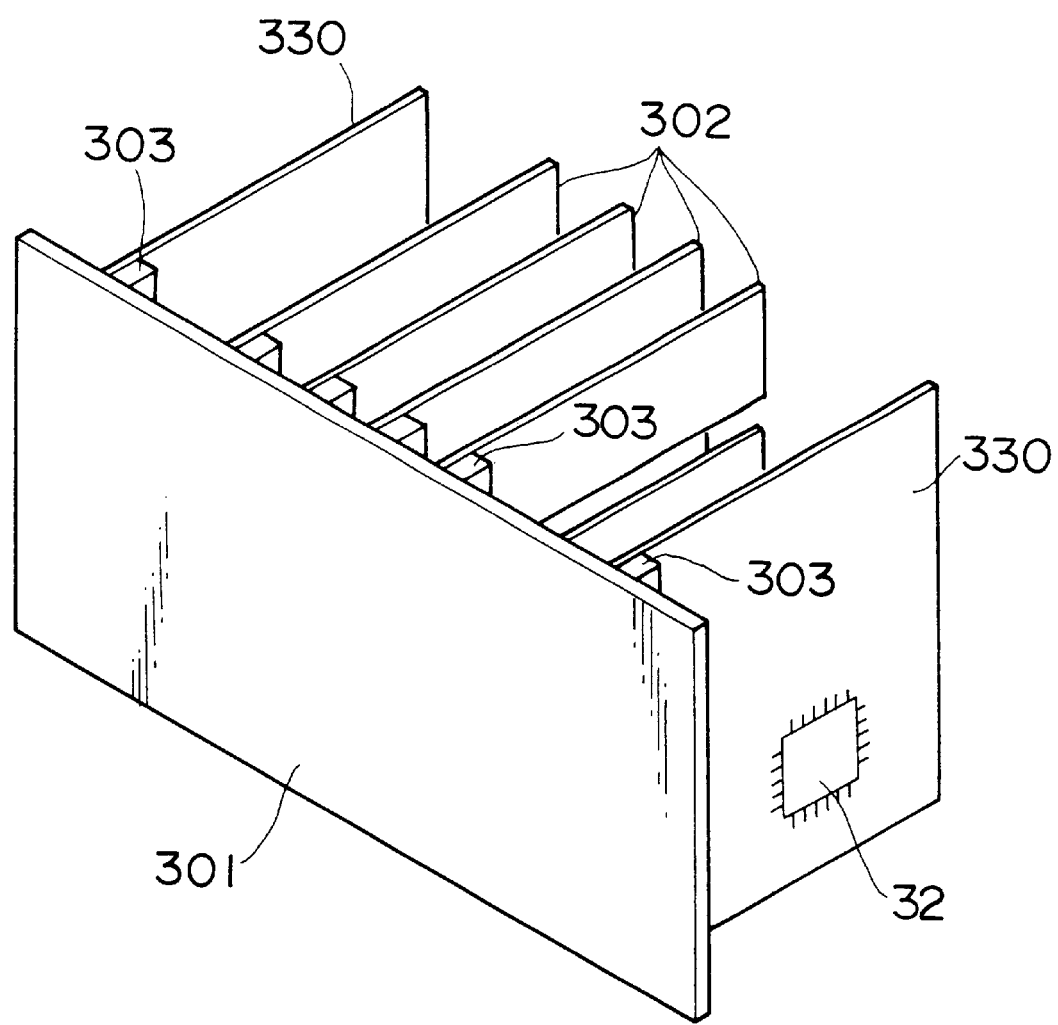
FIG. 12 is a perspective view illustrating a package shelf in a third embodiment of the present invention.

A third embodiment, as compared with the first and second embodiments, is characterized by the following points. As illustrated in FIG. 12, the common unit 32 is also packaged on the same package board (common unit package board) 330 as the board for the individual units 31. This common unit package board 330 is attached orthogonally to board (BWB) 301.

In this embodiment, two common units 32 are provided for every four transmission lines. The respective common units 32 are packaged on two sheets of the common unit package boards 330. The common unit package boards 330 are disposed at both ends of the board (BWB) 301. The common units 32 have a relatively large dissipation electric power requirement and are preferably decentralized within the equipment. In the case of the decentralized packaging, it is necessary that a thermal requirement within the equipment and an electric requirement for controlling the common unit 32 be satisfied. For this purpose, the common units 32 are decentralized into two portions, i.e., disposed at both ends of the board (BWB) 301, thus satisfying the above requirements.

Other configurations in this third embodiment are the same as those in the first embodiment, and therefore other repetitive explanations will be omitted.

Fourth Embodiment

The elements in the above-discussed separate configuration examples 1 to 4 of the individual unit and the common unit in the transmission line corresponding unit are packaged in the ATM switching equipment in accordance with this embodiment.

A fourth embodiment is, as compared with the first embodiment, characterized by separately providing a plurality of electric connectors 435 (see FIG. 13) for connecting an auxiliary board 400 to a board (BWB) 401 and thus enhancing the cooling efficiency by providing a spacing between the auxiliary board 400 and the board (BWB) 401.

Figure 13:
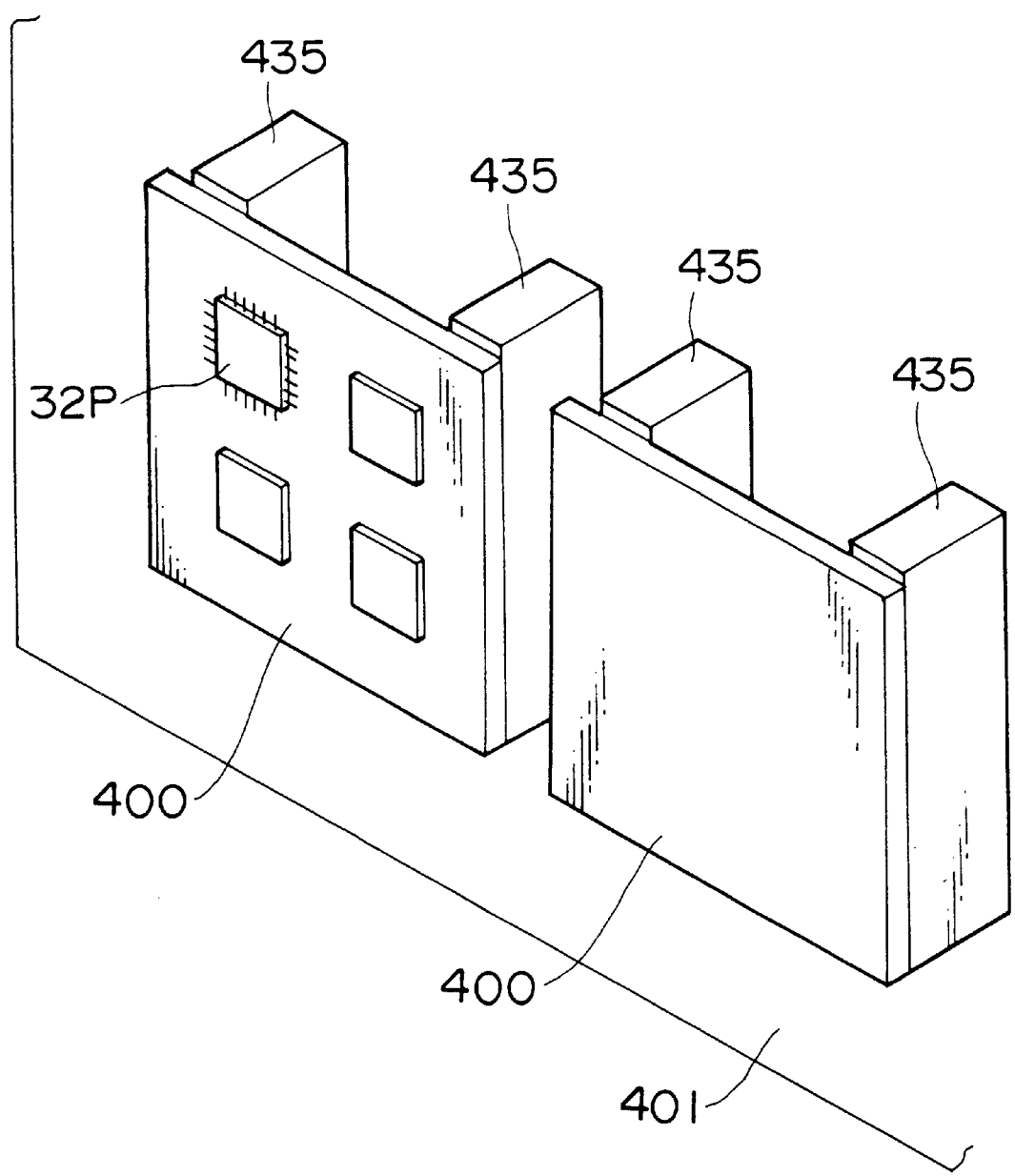
FIG. 13 is a partially enlarged perspective view illustrating a package shelf in a fourth embodiment of the present invention.

More specifically, in this embodiment, as illustrated in FIG. 13, each auxiliary board (subpackage board) 400 is provided through two connectors 435 above the board (BWB) 401. With this arrangement, each subpackage board 400 is parallel to the board (BWB) 401 and spaced at a given interval away from the board (BWB) 401. Then, the parts 32P constituting the common unit 32 are packaged on the outer surface of each subpackage board 400. The common units 32 are required to preside over a control function for, e.g., every four transmission lines and accommodate the 0-system (active system) and the 1-system (standby system) and are therefore packaged separately on the two subpackage boards 400.

The subpackage board 400 is detachably connected to the connectors 435, thereby making it possible to perform maintenance and inspection detaching the common unit 32 from every subpackage 400. The connector 435 may involve the use of connectors based on ZIF and other standards.

Note that preferably cooling fans may be provided for cooling.

Other configurations in this fourth embodiment are the same as those in the first embodiment, and therefore other repetitive explanations will be omitted.

Fifth Embodiment

The elements in the above-discussed separate configuration examples 1 to 4 of the individual unit and the common unit in the transmission line corresponding unit are packaged in the ATM switching equipment in accordance with this embodiment.

Figure 14:
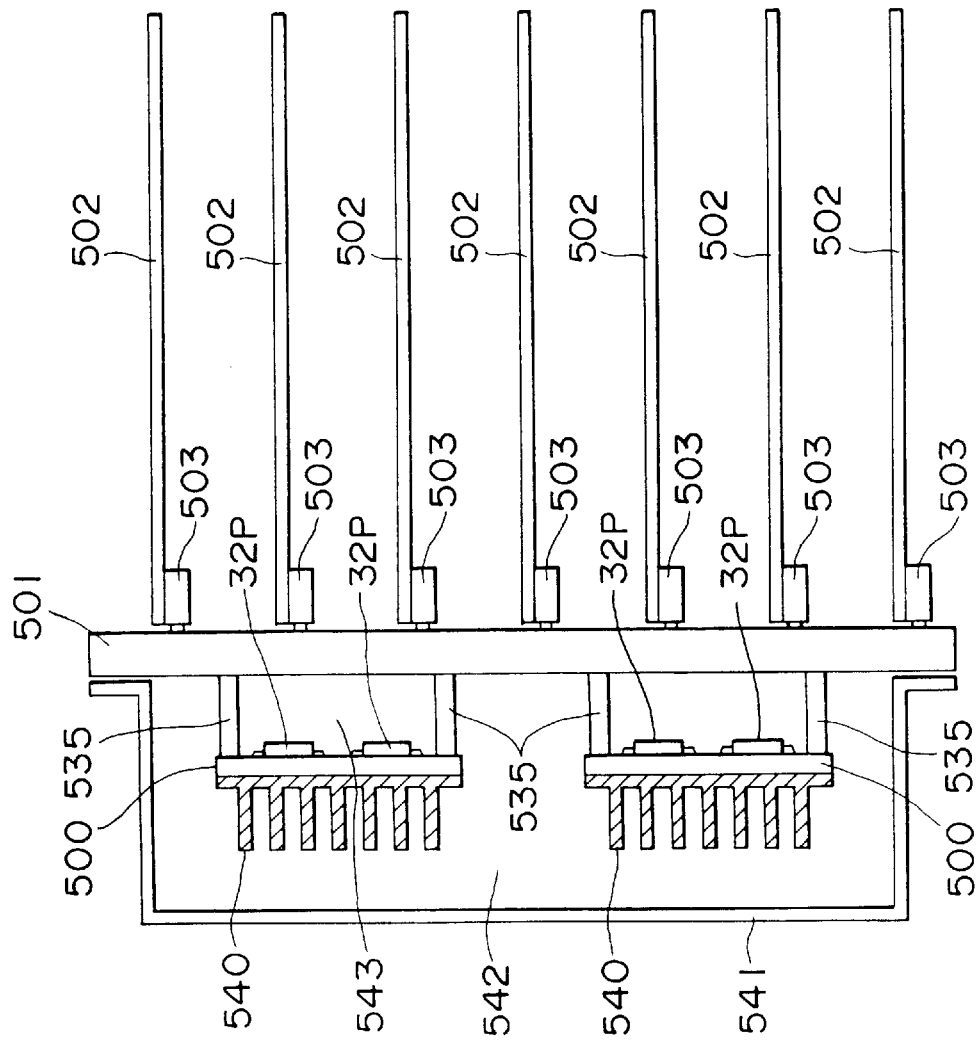
FIG. 14 is a plan view illustrating a package shelf in a fifth embodiment of the present invention.

The fifth embodiment, as shown in FIG. 14, is similar to the embodiment 3. The parts 32P such as LSIs constituting the common unit 32 are packaged on an auxiliary board 500 provided through connectors 535 above a board (BWB) 501. In the fifth embodiment, however, the parts 32P are not packaged on the outer surface but rather on the inner surface of the auxiliary board 500. Radiating fins 540 are mounted on the outer surface of the auxiliary board 500. The radiating fins 540 radiate the heat produced by the parts 32P mounted on the inner surface of the auxiliary board 500. Further, a wall 541 for guiding airflow is mounted on the board (BWB) 501 so as to surround the radiating fins 540. An air flow path 542 is formed inwardly of this air flow guide wall 541, and a flow of air passing trough the air flow path 542 thus cools off the radiating fins.

The auxiliary board 500 is provided so as to be attachable to and detachable from the two parallel connectors 535 and thereby arranged parallel to but spaced at a given distance away from the board 501. With this arrangement, there a radiating path 543 is formed defined by the two connectors 535, the board 501 and the auxiliary board 500. It is therefore possible to cool off the parts 32P of the common unit packaged on the inner surface of the subpackage board 500 with a high efficiency.

The remaining configurations in this fifth embodiment are the same as those in the first embodiment, and therefore other repetitive explanations will be omitted.

Sixth Embodiment

The elements in the above-discussed separate configuration examples 1 to 4 of the individual unit and the common unit in the transmission line corresponding unit are packaged in the ATM switching equipment in accordance with this embodiment.

Figure 15:
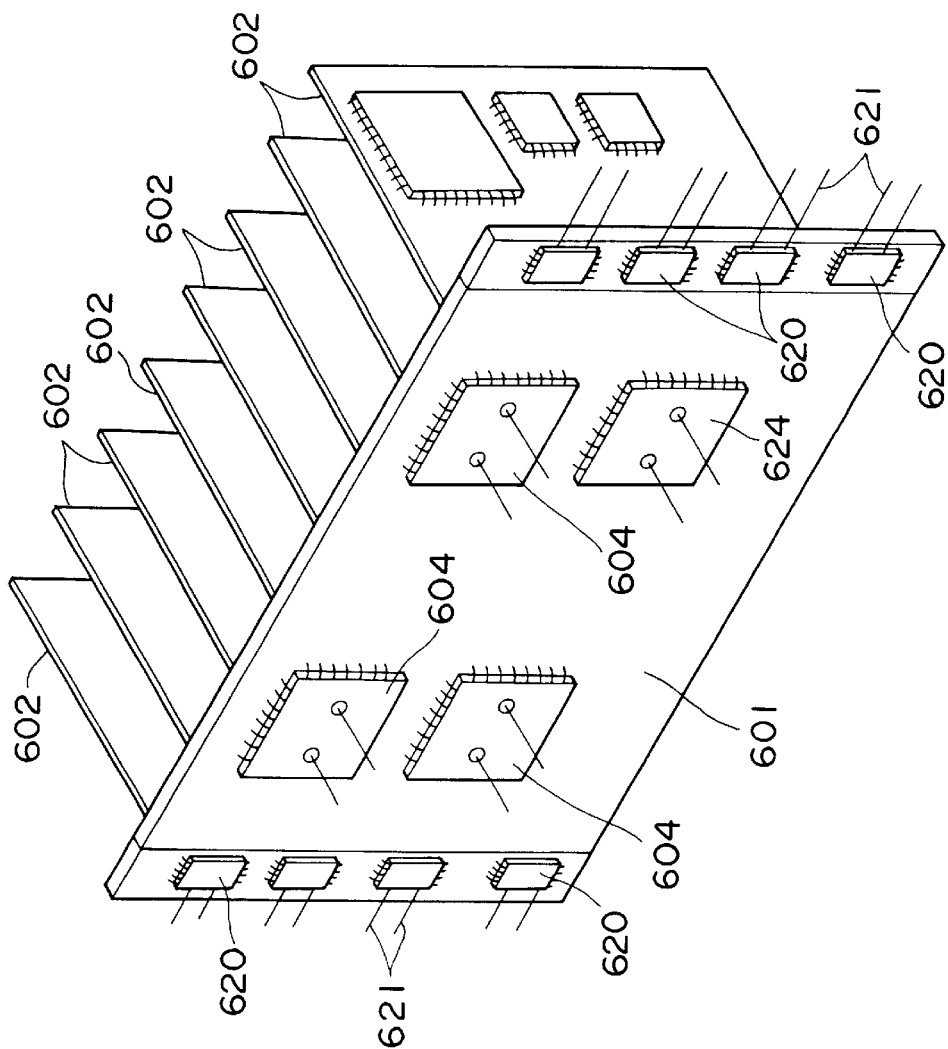
FIG. 15 is a perspective view illustrating a package shelf in a sixth embodiment of the present invention.

A sixth embodiment shown in FIG. 15, as compared with the first embodiment, is characterized by packaging switch-side optical modules 620 on both edge portions of a board (BWB) 601. That is, in accordance with this sixth embodiment, the subscriber-side optical modules 604 each serving as an interface to the optical cable coming from the subscriber are packaged in a direction perpendicular to the outer surface of the board (BWB) 601. Further, the switch-side optical modules 620 each serving as an interface to the switch system 4 are packaged on both outer-surface edge portions arranged as peripheral portions of the board (BWB) 601. The switch-side optical modules 620 are connected via the optical cable 621 to the switch system 4.

The remaining configurations, especially those of the subscriber- and switch side optical modules 604, 620 in this sixth embodiment are the same as those in the first embodiment, and therefore other repetitive explanations will be omitted.

Seventh Embodiment

The elements in the above-discussed separate configuration examples 1 to 4 of the individual unit and the common unit in the transmission line corresponding unit are packaged in the ATM switching equipment in accordance with this embodiment.

Figure 16:
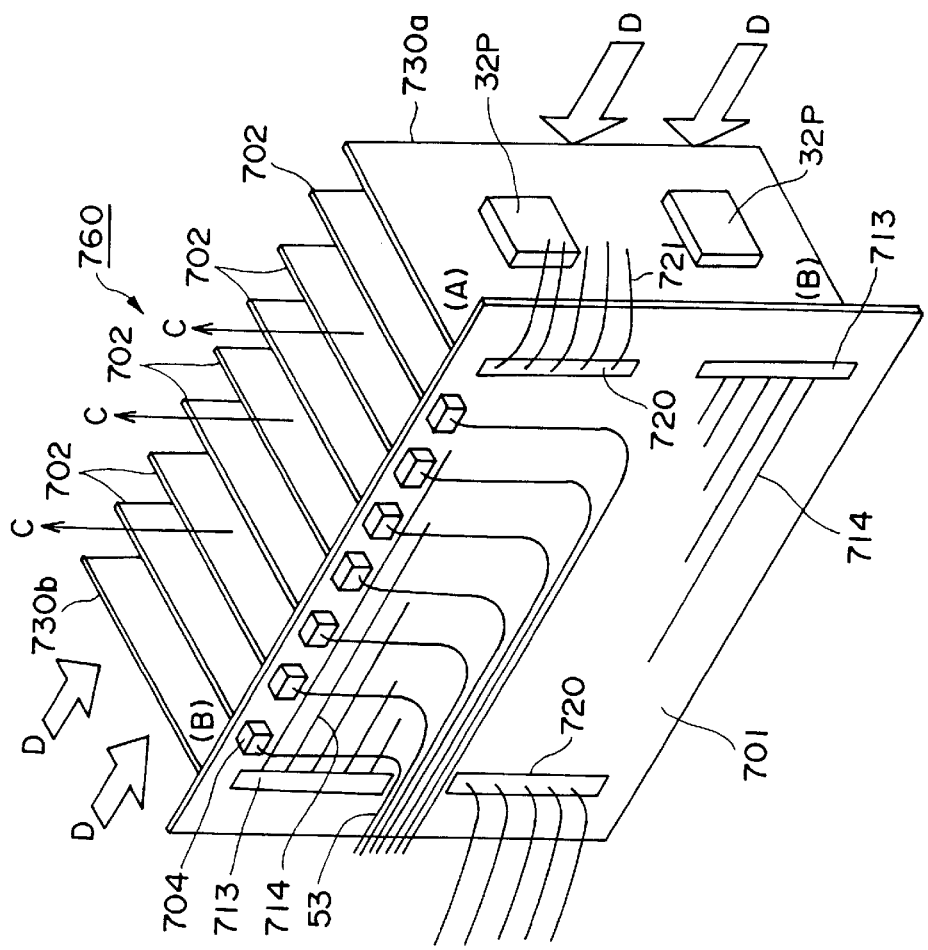
FIG. 16 is a perspective view illustrating a package shelf in a seventh embodiment of the present invention.

A seventh embodiment illustrated in FIG. 16 is similar to the third embodiment and characterized by placing 0-system (active system) and 1-system (standby system) common unit package boards 730a, 730b on both sides of individual unit package boards 702. The seventh embodiment is, however, unlike the third embodiment, characterized by such an arrangement wherein circuit-part-32P-packaging-surfaces of both of the two common unit package boards 730a, b are directed outward (opposite to the side on which the individual unit package boards 702 exist). With this arrangement, the seventh embodiment is intended to enhance the cooling efficiency of the circuit parts 32P of the common unit 32 which has a large exothermic quantity.

The common unit package boards 730a, b are all identically constructed regardless of the difference between the 0-system and the 1-system. That is, first electric connectors (not shown) for connecting to common unit/individual unit connector 713 leading to the individual unit 31 are mounted on the (B)-sides, shown in FIG. 16, of the common unit package boards 730a, 730b. Further, second electric connectors (unillustrated) for connections to switch-side optical modules 720 leading to the switch 4 are mounted on the A-sides, shown in FIG. 16, of the common unit package boards 730a, b.

Accordingly, two sheets of the thus constructed common unit package boards 730a, b are disposed outwardly of the individual unit package boards 702 in such manner that the circuit parts 32P mounted thereon are directed outward and thus connected to the board (BWB) 701. To accomplish this, the two common unit package boards 730a, b are disposed in a positional relationship wherein the boards are turned 180° with respect to each other.

Therefore, on the outer surface of the board (BWB) 701, the common unit/individual unit connectors 713 connected to the first electric connectors and the switch-side optical modules 720 connected to the second electric connectors are disposed by twos in a positional relationship exhibiting a rotational symmetry about the axis orthogonal to the board (BWB) 701 in accordance with the (A)–(B) directions of the corresponding common unit package boards 730a, b. That is, on the outer (near) side in FIG. 16, the switch-side optical module 720 is disposed on the upper side at the edge portion of the board (BWB) 701, while the common unit/individual unit connector 713 is disposed on the lower side thereof. In contrast with this, at the edge portions on the inner (far) side, the switch-side optical module 720 is disposed on the low side, while the common unit/individual unit connector 713 is disposed on the upper side.

Note that a plurality of wires 714 extending in parallel from the common unit/individual unit connector 713 connect the common unit/individual unit connector 713 to a connector (not shown) leading to each individual unit package board 702. Wires 714 are also formed in two positions in the rotational symmetric shape about the axis orthogonal to the board (BWB) 701 in the same way as the common unit/individual unit connectors 713. This arrangement makes each common unit package board 730a, b connectable to each individual unit package board 702.

Further, the subscriber's transmission line optical module 704 connected to the subscriber's transmission line optical cable 53 is prepared per individual unit package board 702. This arrangement makes each subscriber's transmission line 53 connectable to the corresponding individual unit 31.

Other configurations, particularly those of the switch-side optical module 720 and the subscriber's transmission line optical module 704 in the package shelf 760 in accordance with the seventh embodiment discussed above are the same as those in the first embodiment, and hence the repetitive explanations thereof will be omitted.

Next, a box body for cooling off the package shelf 760 in this seventh embodiment will be described.

Figure 17:
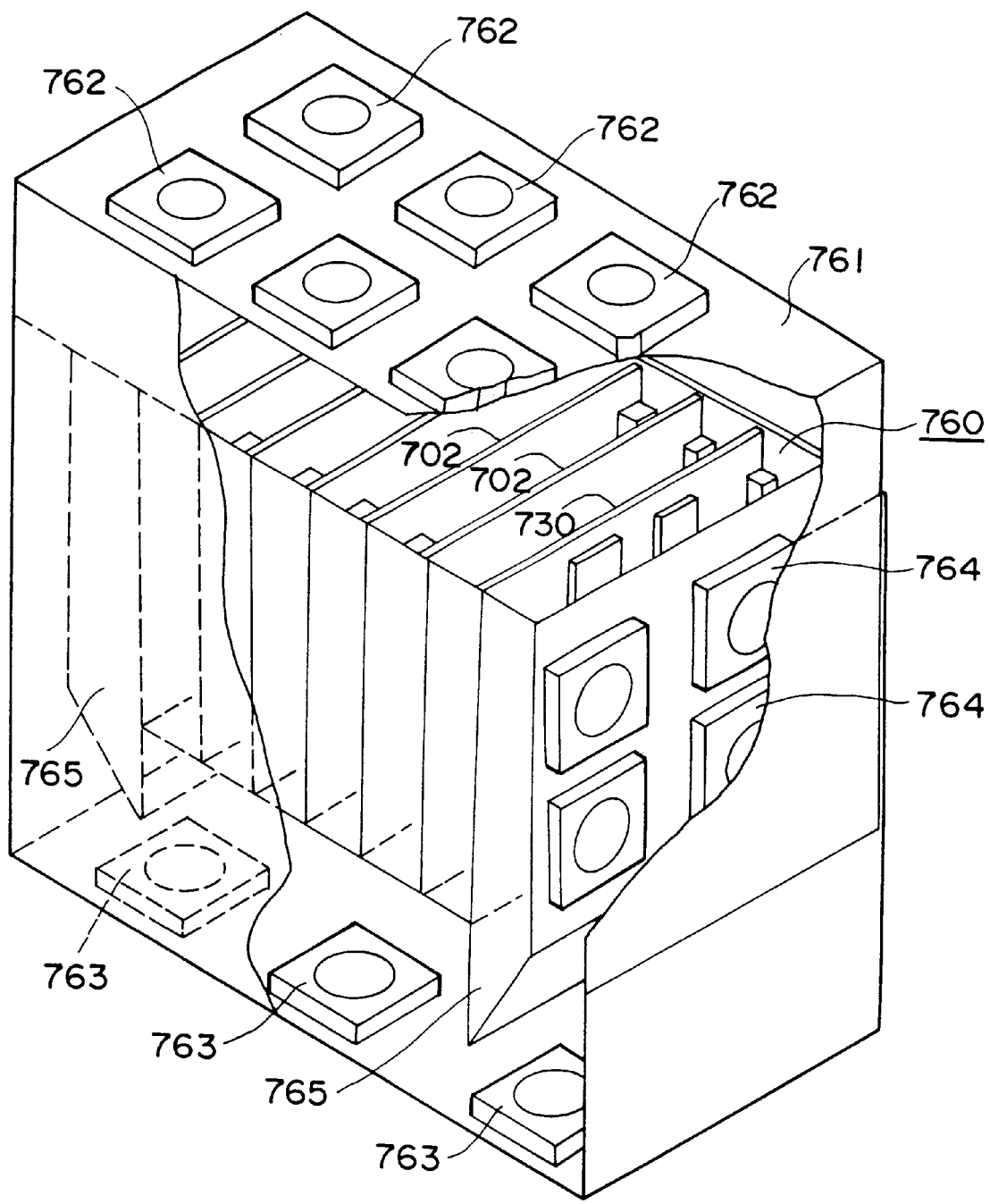
FIG. 17 is a partially cut-away perspective view of a construction wherein the package shelf of FIG. 16 is housed in the box body.

As illustrated in FIG. 17, the box body 761 having the box-shape in the seventh embodiment, unlike the first embodiment, houses a single unit of package shelf 760. In this arrangement, the package shelf 760 is installed in the box body 761 so that the individual unit package boards 702 and the common unit package boards 730a, b are directed toward the door thereof.

PULL-fans 762 for forcibly sucking the air from the interior of the box body 761 to the outside are mounted on the upper surface of this box body 761. Further, PUSH-fans 763 for forcibly causing an inflow of air from the outside of the box body 761 to the interior thereof are mounted on the lower surface of the box body 761.

Accordingly, within the box body 761, as indicated by arrows C (see FIG. 16), the cooling air is blown from the bottom to the top. Thus, the circuits packaged on the package shelf 760 are cooled off. In particular, with the above-stated bookshelf structure, the individual unit package boards 702 and the common unit package boards 730 are arranged along the cooling air direction. It is therefore possible to prevent the flow of the cooling air from being shut off and to maintain high cooling efficiency.

When the box body 761 houses the package shelf 760, the mounting surface of the circuit parts 32P on the common unit package board 730 (at each end) is covered with a rectifying plate 765 (at each end) in the shape of wedge-like box. This rectifying plate 765 collects the flow of cooling air blown from the PUSH-fans 763 sideways of this rectifying plate 765 and, at the same time, secures an air space for the common unit package board 730.

Four collision jet fans 764 are mounted on this rectifying plate 765. These collision jet fans 764 blow the air collected by the rectifying plate 765 itself directly onto the circuit parts 32P on the common unit package board 730. The common unit package board 730 is thereby cooled off by the collision jets of the air as indicated by arrows D in FIG. 16. This collision jet of cooling air, which is not yet used for cooling other circuit parts, is blown directly onto the circuit parts 32P, and, therefore, there is no dissipation of the cooling effect depending on the packaging position of the circuit parts 32P. Accordingly, this arrangement exhibits a higher cooling efficiency for the circuit parts than is available by the cooling air (arrow C) along the circuit board which serves to cool off the individual unit package board 702.

Further, the rectifying plate 765 and the collision jet fan 764 are provided for each of the common unit package boards 730a, 730b.

As discussed above, according to the seventh embodiment, the construction is such that two sheets of the common unit package boards 730a, 730b are disposed outwardly of each individual unit package board 702 where the circuit parts mounting surface thereof is directed towards the outside. The construction is also such that, where the box body 761 houses the package shelf 760 assembled in the illustrated positional relationship, the collision jet of air collides with the circuit parts 32P of the common unit 32 packaged on this common unit package board 730 from a direction perpendicular to the common unit package board 730. Consequently, the circuit parts 32P constituting the common unit 32 exhibiting a relatively large exothermic quantity can be cooled off with a high efficiency.

Eighth Embodiment

The elements in the above-discussed separate configuration examples 1 to 4 of the individual unit and the common unit in the transmission line corresponding unit are packaged in the ATM switching equipment in accordance with this embodiment.

Figure 18:
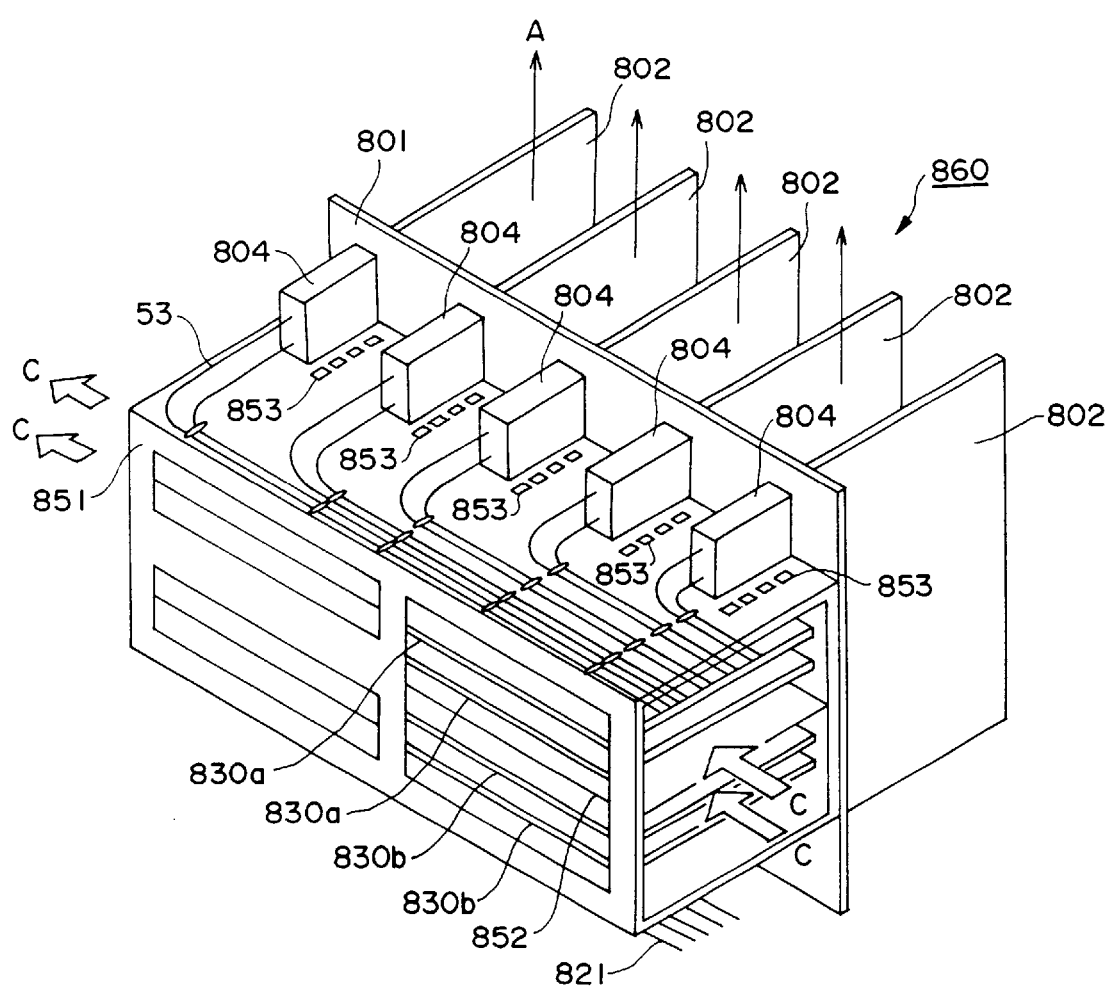
FIG. 18 is a perspective view illustrating a package shelf in an eighth embodiment of the present invention.

Referring to FIG. 18, eighth embodiment is characterized by positioning a 0-system (active system) common unit package board 830a and a 1-system (standby system) common unit package board 830b to intersect each side of an individual unit package board 802. For this purpose, in this eighth embodiment, as illustrated in FIG. 18, a mounting duct 851 for the common unit package boards 830 is provided on a board (BWB) 801.

That is, duct 851 has an angular cylindrical shape and is disposed in a direction perpendicular to the connecting direction of each individual unit package board 802. The interior of this duct 851 is partitioned into an upper and lower chamber by a partitioning plate 852 disposed along the major-axis direction thereof and perpendicular to the board (BWB) 801. Then, the 0-system (active system) common unit package board 830a is installed in parallel to the partitioning plate 852 in the upper chamber above the partitioning plate 852. Similarly, the 1-system (standby system) common unit package board 830b is installed in parallel to the partitioning plate 852 in the lower chamber under the partitioning plate 852. Note that the respective common unit package boards 830 are packaged on two separate boards.

The respective common unit package boards 830 are electrically connected to the respective individual unit package boards 802 via electric connectors provided on the respective common unit package boards 830, the respective individual unit package boards 802 and the board (BWB) 801.

A subscriber-side optical module 804 for connecting the each individual unit package board 802 to the subscriber-side optical cable 53 is provided per individual unit 802 on the upper surface of the duct 851. Note that this subscriber-side optical module 804 is also an exothermic circuit element and, hence, in this embodiment, cooling holes 853 for blowing cooling air are formed in the peripheral portions of the subscriber-side optical modules 804 on the upper surface of the duct 851.

Incidentally, although hidden from view, switchside optical modules for connecting the respective common unit package boards 830 to the switch-side optical cables 821 are mounted on the lower surface of the duct 851.

Other configurations, especially those of the switch-side optical module (not shown) and the subscriber(s transmission line optical module 804 in the package shelf 860 in accordance with the eighth embodiment discussed above are the same as those in the first embodiment, and hence their repetitive explanations will be omitted.

Next, there will be described a box body 861 for cooling off the package shelf 860 of this eighth embodiment.

Figure 19:
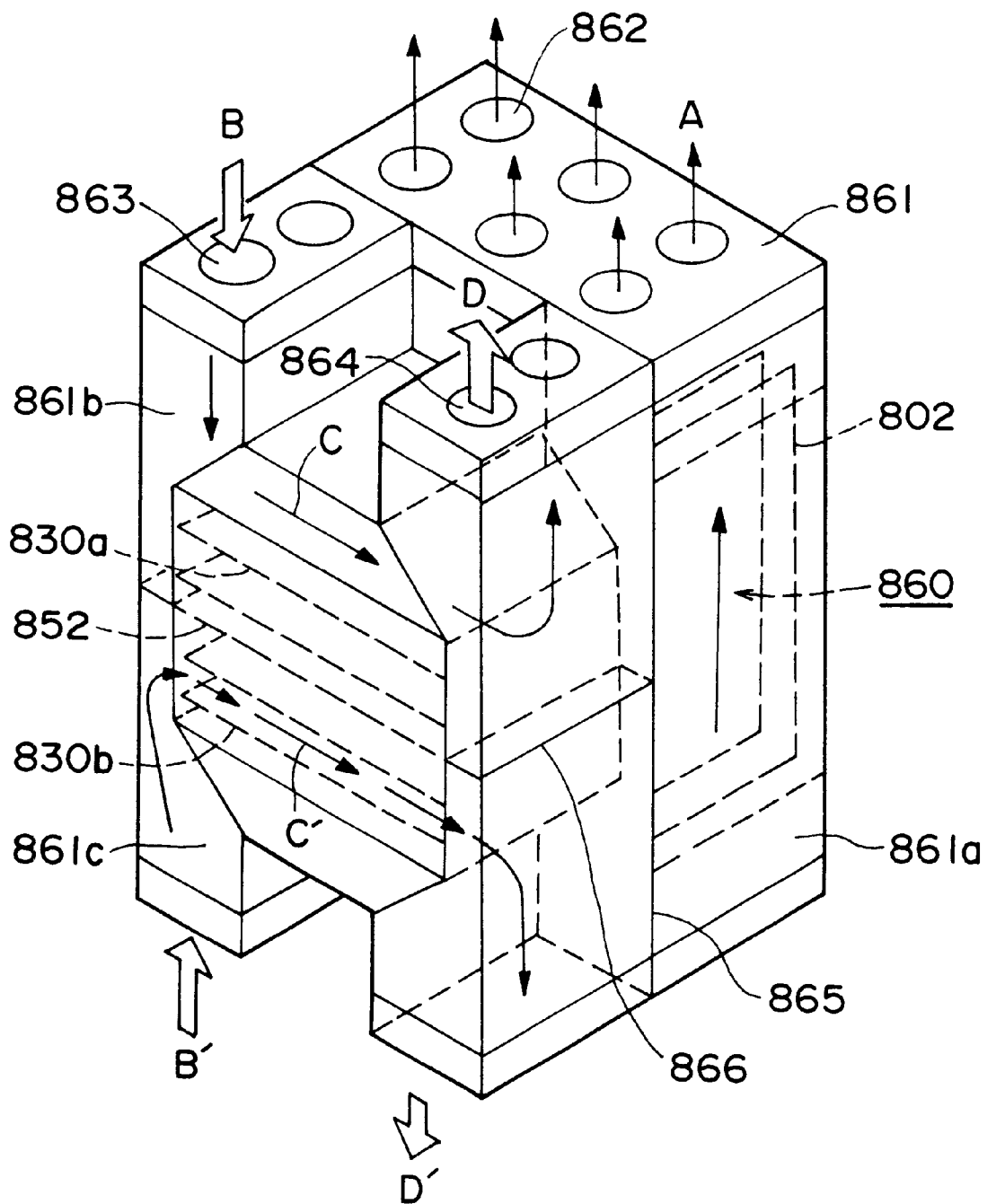
FIG. 19 is a partially cut-away perspective view of a construction wherein the package shelf of FIG. 18 is housed in the box body.

As illustrated in FIG. 19, the box body 861 in this eighth embodiment houses one package shelf 860 as in the seventh embodiment. The interior of this box body 861 is largely partitioned by a partitioning wall 865 in the vertical direction in FIG. 19. One of the partitioned spaces is a first space 861a for housing the individual unit package boards 802. The other space is cut in half by a partitioning wall 866 in the horizontal direction in FIG. 19. Above the wall 866 is a second space 861b for housing the 0-system (active system) common unit package board 830a. Below the wall 866 is a third space 861c for housing the 1-system (standby system) common unit package board 830b.

When the box body 861 houses the package shelf 860, the board (BWB) 801 is fitted into an opening formed in the partitioning wall 865. The first, second and third spaces 861a, 861b, 861c are thereby completely isolated from each other. A partitioning plate 852 is fitted in an opening formed in the partitioning wall 866. The second and third spaces 861b, 861c are completely isolated from each other.

The first space 861a of this box body 861 assumes a shape of rectangular parallelopiped. PULL-fans 862 for forcibly sucking air from the interior of the first space 861a toward the outside are disposed on the upper edge surface of this first space 861a. Further, PUSH-fans (not shown) for forcibly causing an inflow of the air from the outside of the first space 861a toward the interior thereof are disposed on the lower edge surface of the first space 861a.

Accordingly, within the first space 861a, as indicated by arrows A in FIGS. 18 and 19, the cooling air flows from the lower side to the upper side. Thus, the circuits packaged on the individual unit package board 802 are cooled off. In particular, with the adoption of the above-stated bookshelf structure, the individual unit package boards 802 are disposed along the cooling air direction. In this way, the flow of cooling air is prevented from being shut off and the cooling efficiency is kept high.

The second space 861*b* of this box body 861 is effectively U-shaped. One upper edge surface of this second space 861*b* is provided with PULL-fans 864 for forcibly sucking air from the interior of the second space 861*b* toward the outside. Also, the other upper edge surface of the second space 861*b* is provided with PUSH-fans 863 for forcibly causing the inflow of air from the outside of the second space 861*b* toward the interior thereof.

Accordingly, the cooling air, as illustrated in FIG. 19, enters from the direction of the arrow B, passes as indicated by the arrow C and exits in the direction of the arrow D, thereby circulating the cooling air within the second space 861*b*. Thus, the circuits packaged on the 0-system (active system) common unit package board 830*a* are cooled off. Especially, as indicated by the arrow C in FIG. 18, the cooling air is blown along the 0-system (active system) common unit package board 830*a*, and, hence, it is possible to prevent the flow of cooling air from being shut off by the board and to maintain a high cooling efficiency.

Note that when the cooling air is blown through the second space 861*b*, some cooling air leaks to the outside of the duct 851 from the cooling holes 853 (see FIG. 18). The leaked cooling air is blown against the outer surface of the subscriber-side optical module 804 and thus cools off this subscriber transmission line optical module 804 with a high efficiency.

The third space 861*c* of this box body 861 has an effective inverted U-shape compared to the second space 861*b*. The lower edge surface of the third space 861*c* is also fitted with PUSH-fans (unillustrated) and PULL-fans (unillustrated). Therefore, within the third space 861*c*, as shown in FIG. 19, the cooling air enters from the direction of the arrow B', passes as indicated by the arrow C' and exits in the direction of the arrow D', thus circulating the cooling air. Thus, the circuits packaged on the 1-system (standby system) common unit package board 830*b* are cooled off.

Further, when the cooling air is blown within the third space 861*c*, some cooling air leaks to the outside of the duct 851 from the unillustrated cooling holes, thereby cooling off the unillustrated switch-side optical modules.

As discussed above, according to the eighth embodiment, there is provided a structure that the plurality of individual unit package boards 802 and the plurality of common unit package boards 830 are electrically connected at the intersecting points thereof. Accordingly, even when the numbers of both of the boards 802 and the boards 830 increase, there is almost no necessity for wiring on the board (BWB) 801, and it is possible that the connectors of both of the boards 802 and 830 are merely connected to each other in only the thickness direction of the board (BWB) 801. Consequently, complicated wiring on the board (BWB) 801 can be avoided.

Further, even when the boards 802, 830 are, as described above, so arranged as to intersect each other, the cooling air can be circulated in accordance with the directions of the respective boards 802, 830 because of the arrangement that the internal space of the box body 861 is partitioned into the first through third spaces 861*a*–861*c*, and, at the same time, the second and third spaces 861*b*, 861*c* are U-shaped. It is therefore feasible to maintain a high cooling efficiency.

Also, the construction is such that the spaces 861*a*, 861*b* are partitioned so as not to cause the leakages of the cooling air from each other. Hence, for example, even if the cooling air in the second space 861*b* is stopped for maintenance and inspection of the 0-system common unit 32, this does not influence the cooling of the individual units 31 and the common unit 32.

Ninth Embodiment

The elements in the above-discussed separate configuration examples 1 to 4 of the individual unit and the common unit in the transmission line corresponding unit are packaged in the ATM switching equipment in accordance with this embodiment.

Figure 20:
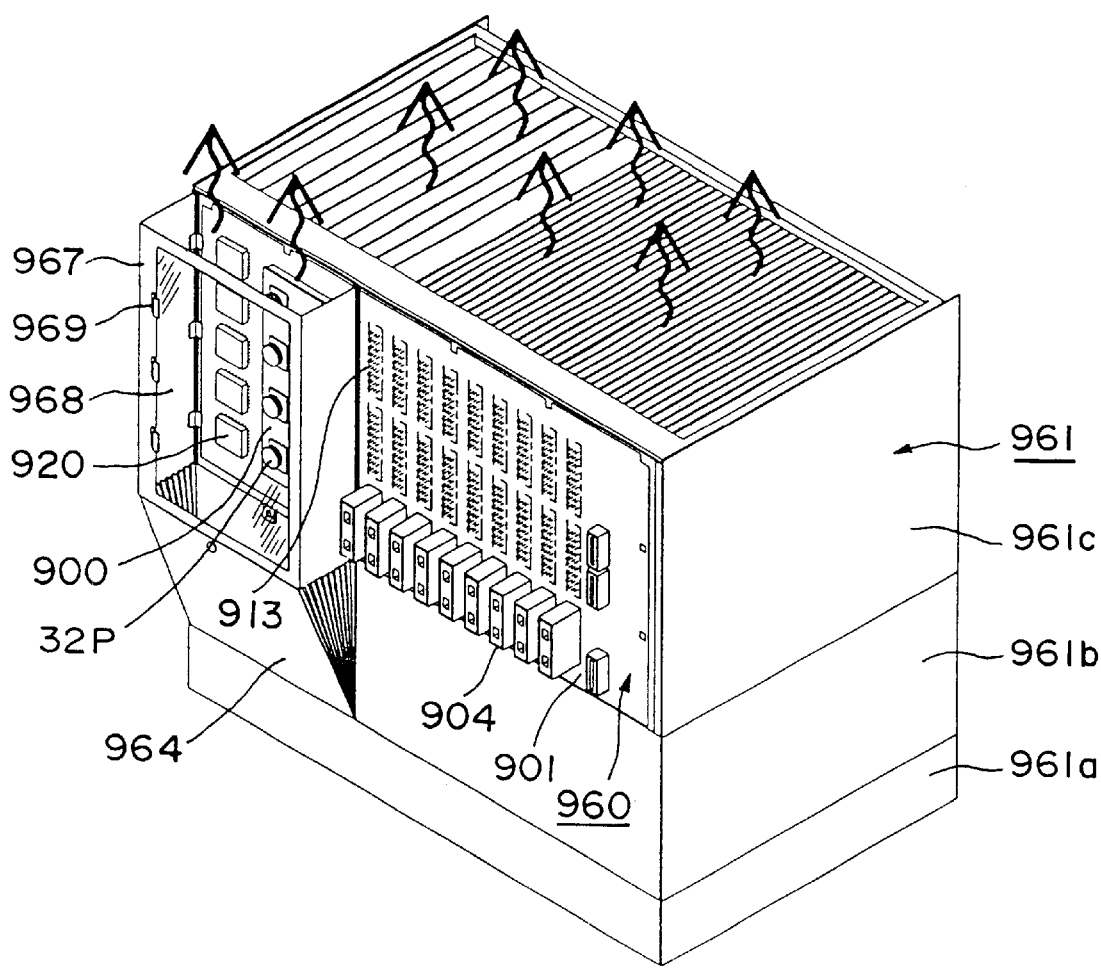
FIG. 20 is a perspective view illustrating a normally operating state of the box body which houses a package shelf in a ninth embodiment of the present invention.

Referring to FIG. 20, a ninth embodiment is characterized by a box body 961 housing a package shelf 960 of identical construction to that of the package shelf 160 (see FIG. 1) and, at the same time, providing ease of maintenance and inspection of the circuit parts 32P of the common unit 32 packaged on a board (BWB) 901 (or on an auxiliary board 900).

In the thus constructed package shelf 960, the circuit parts 32P of the common unit 32 are packaged on the board (BWB) 901 (or on the auxiliary board 900). The common unit 32 performs processing corresponding to the plurality of individual units 31 and has a larger cell processing quantity than that of each individual unit 31. Hence, an exothermic quantity of the circuit parts 32P thereof is larger than that of the circuit parts 31P of each individual unit 31. Accordingly, a construction is required for the cooling air to also be supplied onto the board (BWB) 901.

Further, it is necessary to inspect the circuit parts 32P to maintain the reliability of this common unit 32. Therefore, the box body 961 must be constructed so that the cover of the box body 961 can be opened, and the common unit 32 inspected from the outside.

Such an inspection operation has to be carried out without causing any trouble in the operation of the switching equipment, and it is therefore also necessary for that the transmission line corresponding unit 3 to be operated during this inspection operation. However, when the door of the box body 961 is opened, the door portion is well ventilated, and it follows that a large amount of the cooling air can flow out through the open door. For this reason, the individual unit package boards 902 are not cooled, and therefore, as a matter of fact, the transmission line corresponding unit 3 is unusable.

In order to solve this problem, as in, e.g., the eighth embodiment, the cooling system for cooling the individual unit package board 802 (see FIG. 19) is completely separated from the cooling system for the common unit package board 830. However, the structure becomes complicated for the arrangement of FIG. 1, and, at the same time, it is not possible to employ the fan unit 162 in the conventional box body that is also used in the first embodiment.

Under such circumstances, in accordance with the ninth embodiment, the box body 961 is made capable of cooling off the individual unit package board 902 during the inspection of the circuit parts 32P of the common unit 32 without making its structure complicated.

Figure 27:
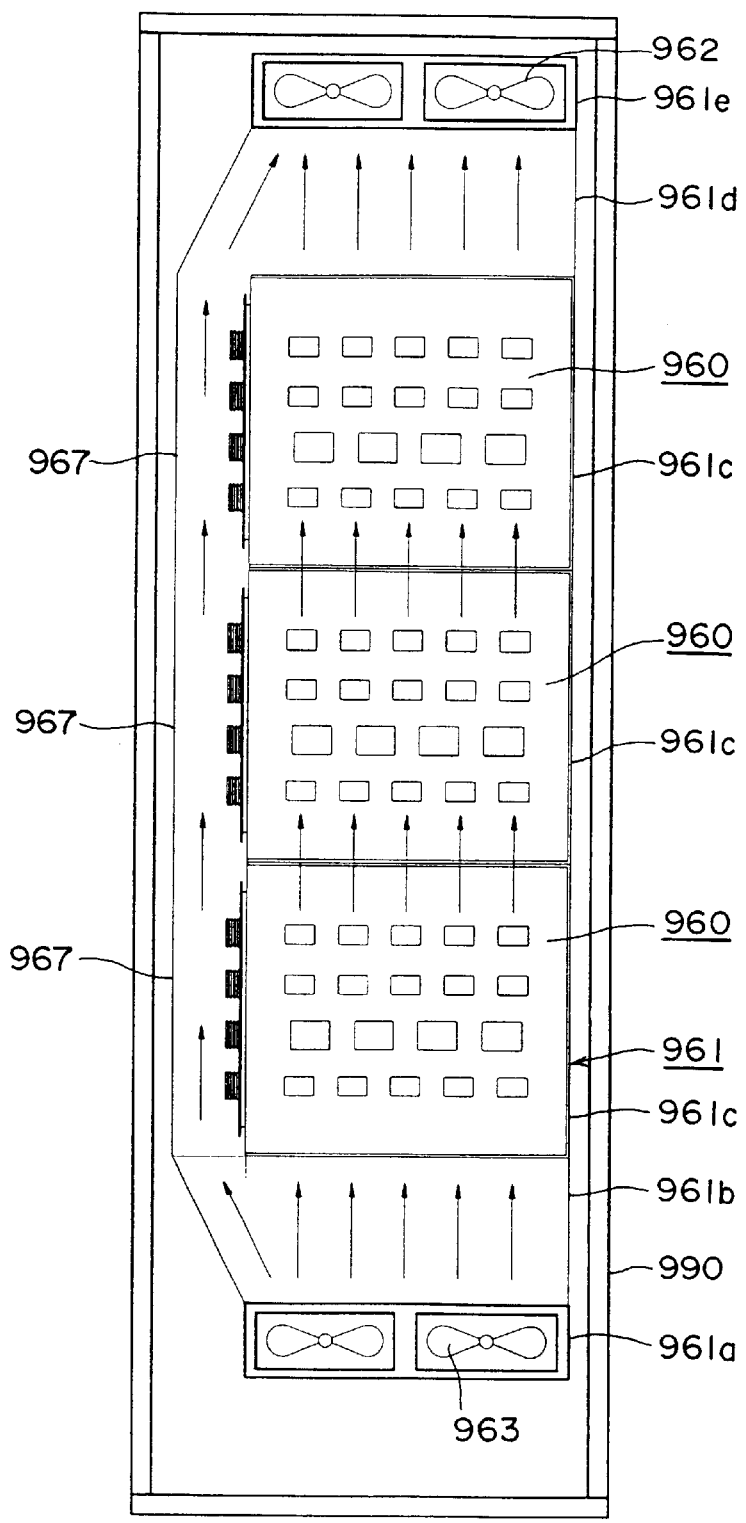
FIG. 27 is a side perspective view illustrating the box body and a casing as a whole in the ninth embodiment of the present invention shown in FIG. 20.

Referring to FIG. 27, the box body 961 in the ninth embodiment is shown encased by a casing 990. As illustrated in FIG. 27, the box body 961 is constructed of five types of layers. The lowermost layer is a lower fan unit 961*a* for housing PUSH-fans 963. The next layer is a lower air duct 961*b* for branching off the path of the cooling air. The layer next thereto is a group of package units 961*c* for housing package shelves 960. In this ninth embodiment, 3-layered package units 961*c* are provided, enough to house three package shelves 960. The next layer is an upper air duct 961*d* for unifying the branched cooling air paths. The layer subsequent thereto is an upper fan unit 961*e* for housing PULL-fans 962.

FIG. 20 is a perspective view illustrating a construction wherein only the lower fan housing layer 961*a*, the lower duct layer 961*b* and the single package shelf housing layer 961*c* constitute the box body 961.

As obvious from FIG. 20, the board (BWB) 901 of the package shelf 960 is exposed to the outside of the package unit 961*c*. Referring to FIG. 20, the individual unit/common unit connectors 913 and the subscriber-side optical modules 904 are packaged on the right side of this board (BWB) 901. Further, on the left side thereof, the auxiliary boards 900 and the switch-side optical modules 920 are packaged. The individual unit/common unit connector 913 and the subscriber's transmission line optical module 904 exhibit a small exothermic quantity, and hence no special cooling is needed. On the other hand, the circuit parts 32P of the common unit 32 are packaged on the auxiliary board 900.

Therefore, a box-like duct 967 is mounted on the board (BWB) 901 to surround only the auxiliary board 900 and the switch-side optical modules 920. This duct 967 has the same height as that of the package unit 961*c* in the vertical direction and is open at the upper and lower edges thereof. Accordingly, as shown in FIG. 27, when a plurality of package units 961*c* are stacked, the ducts 967 of the respective package units 961*c* are linked to each other, thus forming a single line of duct.

Figure 24:
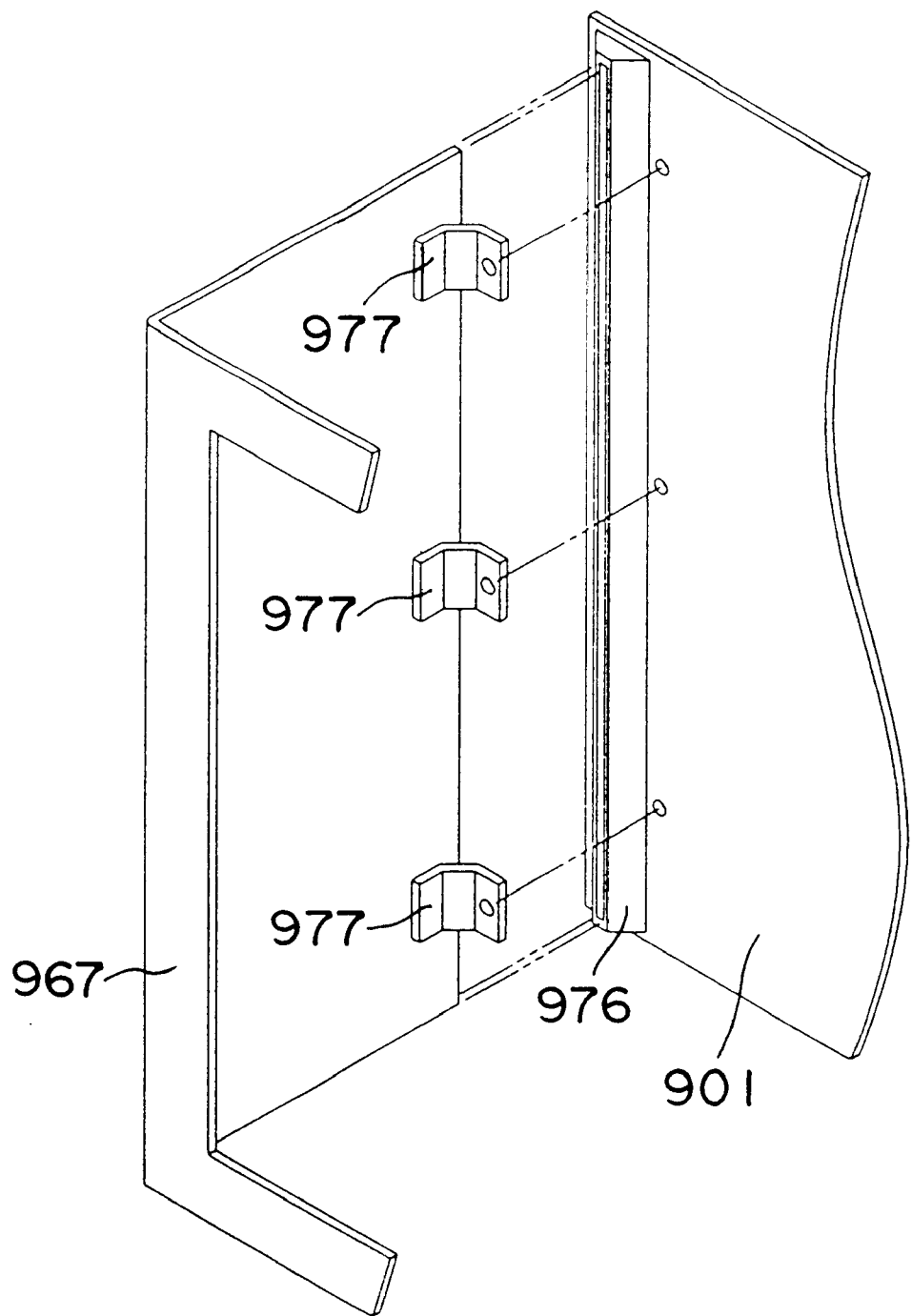
FIG. 24 is a fragmentary view illustrating a mounting structure of the duct of FIG. 22.

FIG. 24 is an enlarged view illustrating a structure for attaching this duct 976 to the board (BWB) 901. As illustrated in FIG. 24, the duct 967 is attached through a rubber packing to the board (BWB) 901 and, at the same time, fixed by a substantially L-shaped fitting 977. Consequently, no gap is formed in the connecting portion between the duct 967 and the board (BWB) 901, resulting in no leakage of the cooling air.

Figure 22:
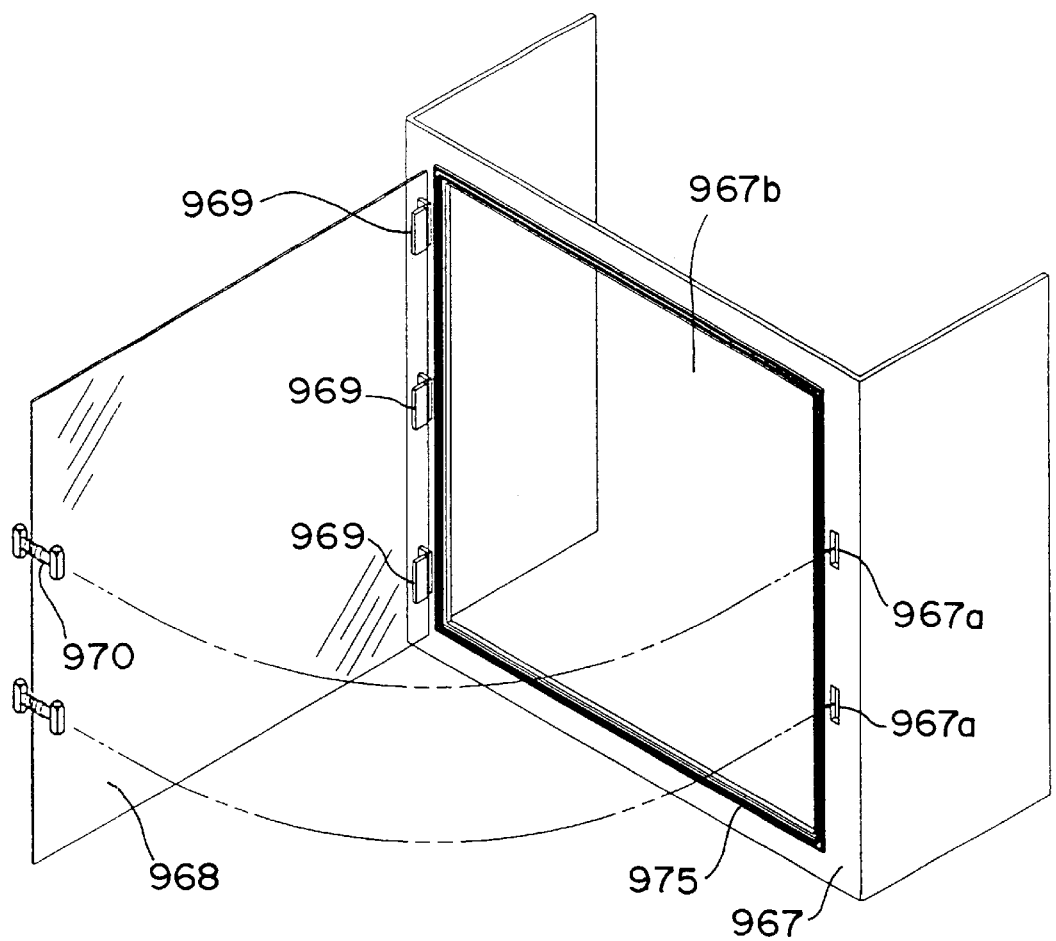
FIG. 22 is an enlarged view of a duct of FIG. 20.

An opening 967*b* for maintaining and inspecting the circuit parts 32P is formed in the surface, parallel to the board (BWB) 901, of this duct 967. FIG. 22 is an enlarged view thereof. A cover 968 is attached to the duct 967 in order to close this opening 967*b* during normal operation.

The cover 968 is composed of a transparent acrylic plate, and, therefore, the circuit parts 32P can be visually inspected even when the cover remains closed. Further, the cover 968 is so fitted to the duct 967 as to be openable and closable through hinges 969. Also, the cover 968 is locked in a closing position by a fixing fitting 970.

FIG. 23 illustrates a detailed configuration of this fixing fitting 970. Referring to FIG. 23, a hole 968*a* is formed in the cover 968. A shaft 971 of the fixing fitting 970 is inserted into this hole 968*a*. A hammer-like knob 972 is fixed to one end of this shaft 971, and similarly a hammer-like key 973 is fixed to the other end thereof. Both knob 972 and key 973 are fixed in the same direction, and hence the whole fixing fitting 970 is formed in an H-shape. A compression spring 974 is attached to the shaft 971 between the knob 972 and the cover 968, whereby the key 973 is so biased as to be press-fitted or urged against the cover 968.

Figures 23A, 23B:
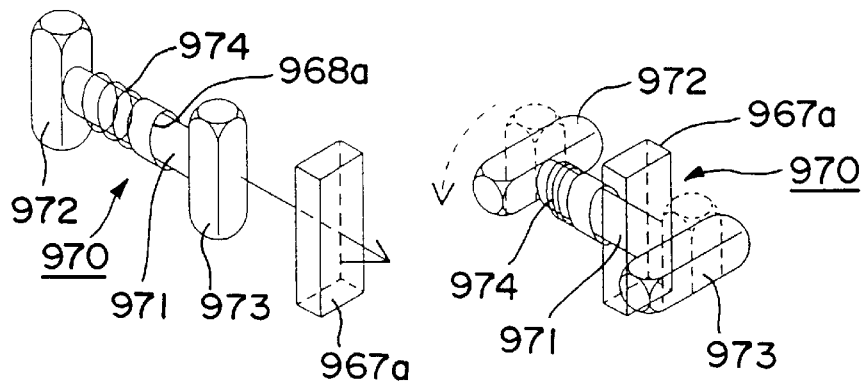
FIGS. 23a, 23b are enlarged view of a fixing fitting of FIG. 22.

On the other hand, a rectangular key hole 967*a*, enough to accommodate the key 973 of the fixing fitting 970, is formed opposite to the side on which the hinge 969 in the periphery of the opening 967*b* of the duct 967 is secured. FIG. 23(A) shows a state where the key 973 is going to pass the key hole 967*a*. This key hole 967*a* prevents the key 973 from coming off when the fixing fitting 970 is rotated through 90° after the key 973 has passed through. FIG. 23(B) shows a state where the key 973 is roatated and locked to the key hole 967*a*. Consequently, the cover 968 is locked in the closed position of the opening 967*b* by this fixing fitting 970.

When the key 973 is prevented from coming off by the key hole 967*a*, the biasing force of the compression spring 974 is still applied to this key 973. For this reason, the biasing force in the mutually-press-fitted direction acts between the cover 968 and the duct 967 with which the key 973 engages. A rubber packing 975 is applied to the peripheral portion of the opening 967*b* of the duct 967. Hence, the cover 968 is closed without forming any gap between this opening 967*b* and the cover 968 in combination with the biasing force acting between the duct 967 and the cover 968. The leakage of the cooling air is thereby prevented.

Figure 21:
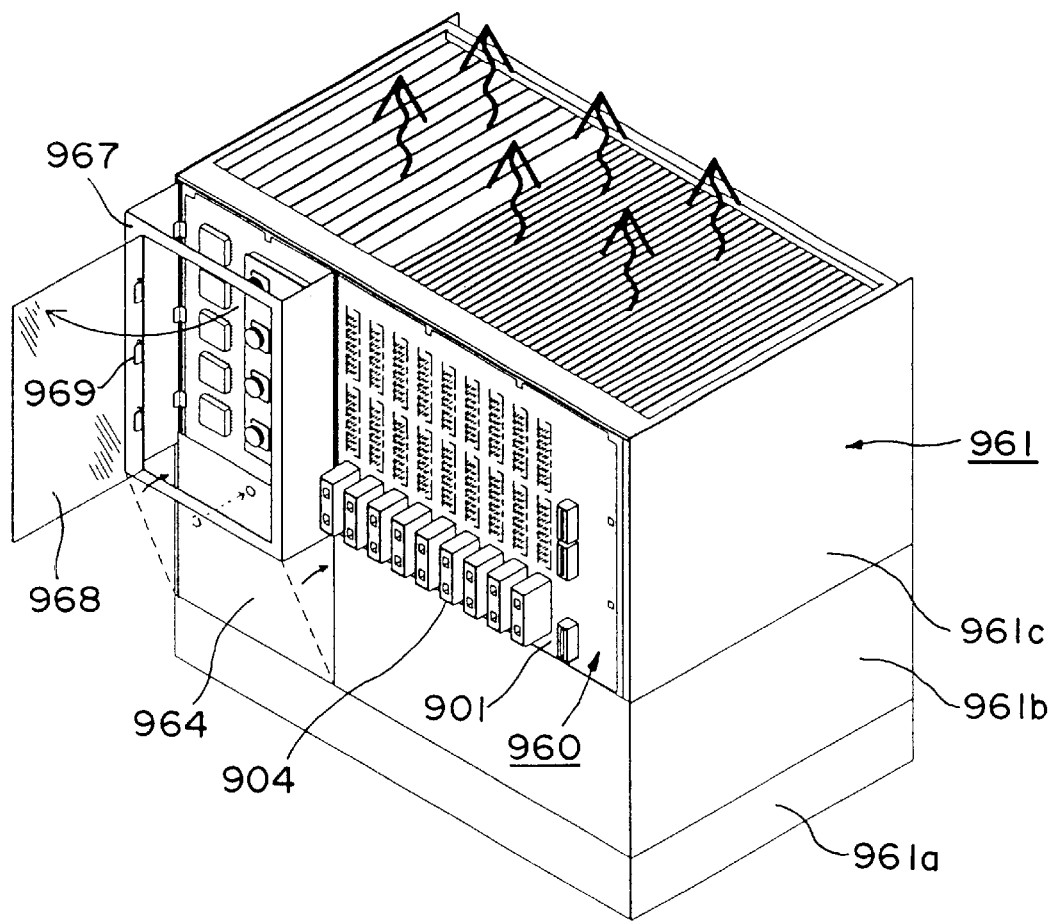
FIG. 21 is a perspective view illustrating a maintenance/inspection operating state in the box body shown in FIG. 20.

An opening 965 (see FIGS. 25 and 26) is formed in a position, corresponding to the above duct 967, of the lower air duct 961*b*. A single-hinge movable duct 964, with a lower edge of the lower air duct 961*b* serving as a hinge position, is fitted to this opening 965. As illustrated in FIG. 20, this movable duct 964 has enough length to contact the internal surface of the duct 967 without any gap in its opened state. Accordingly, as shown in FIG. 21, in the closed state of this movable duct 964, the front edge of this movable duct 964 intrudes into the duct 967.

Figure 25:
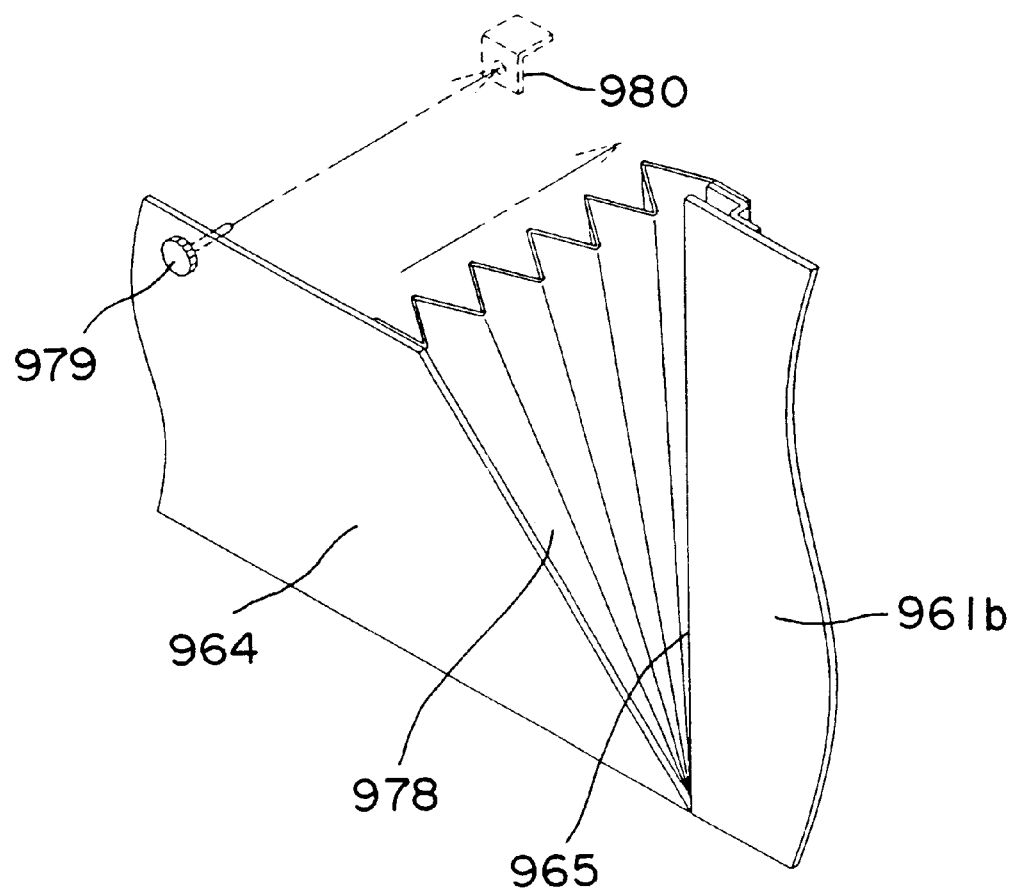
FIG. 25 is an enlarged view of a movable duct of FIG. 20.

A bellows 978 as shown in FIG. 25 is attached between a side edge of the movable duct 964 and a side edge of the opening 965. This bellows 978 is formed by folding a material with rubber coated over a canvas. Further, as illustrated in FIG. 20, when the movable duct 964 is opened to its maximum position, the configuration of the bellows 978 is arranged so that an upper edge of the bellows 978 assumes a linear edge along the lower edge of the duct 967. Hence, when the movable duct 964 is opened, the cooling air does not leak from between the movable duct 964, the opening 965 and the duct 967.

As shown in FIG. 25, a set screw 967 is rotatably secured to the front edge of the movable duct 964. This cooperates with a fastening plate 980 into which the set screw 979 is threaded. Plate 980 is attached to the opening 965 of the lower air duct 961*b*. Therefore, when the set screw 979 is screwed into the fastening plate 980, this movable duct 964 can be fixed in the closed position. Note that the movable duct 964, when closed and fixed, is flush with another surface of the lower air duct 961*b*. Accordingly, in the closed state of the movable duct 964, no cooling air leaks from the opening 965.

According to the thus constructed ninth embodiment, during normal operation, as illustrated in FIG. 20, the movable duct 964 is opened. In this state, the movable duct is expanded to the maximum because of the resilience of the bellows 978 itself. When the movable duct 964 is expanded to the maximum, the front edge of the movable duct contacts the inner surface of the duct 967, with the result that the expansion thereof is regulated, and, at the same time, the movable duct 964 is linked to the duct 967 without any gap.

Figure 26:
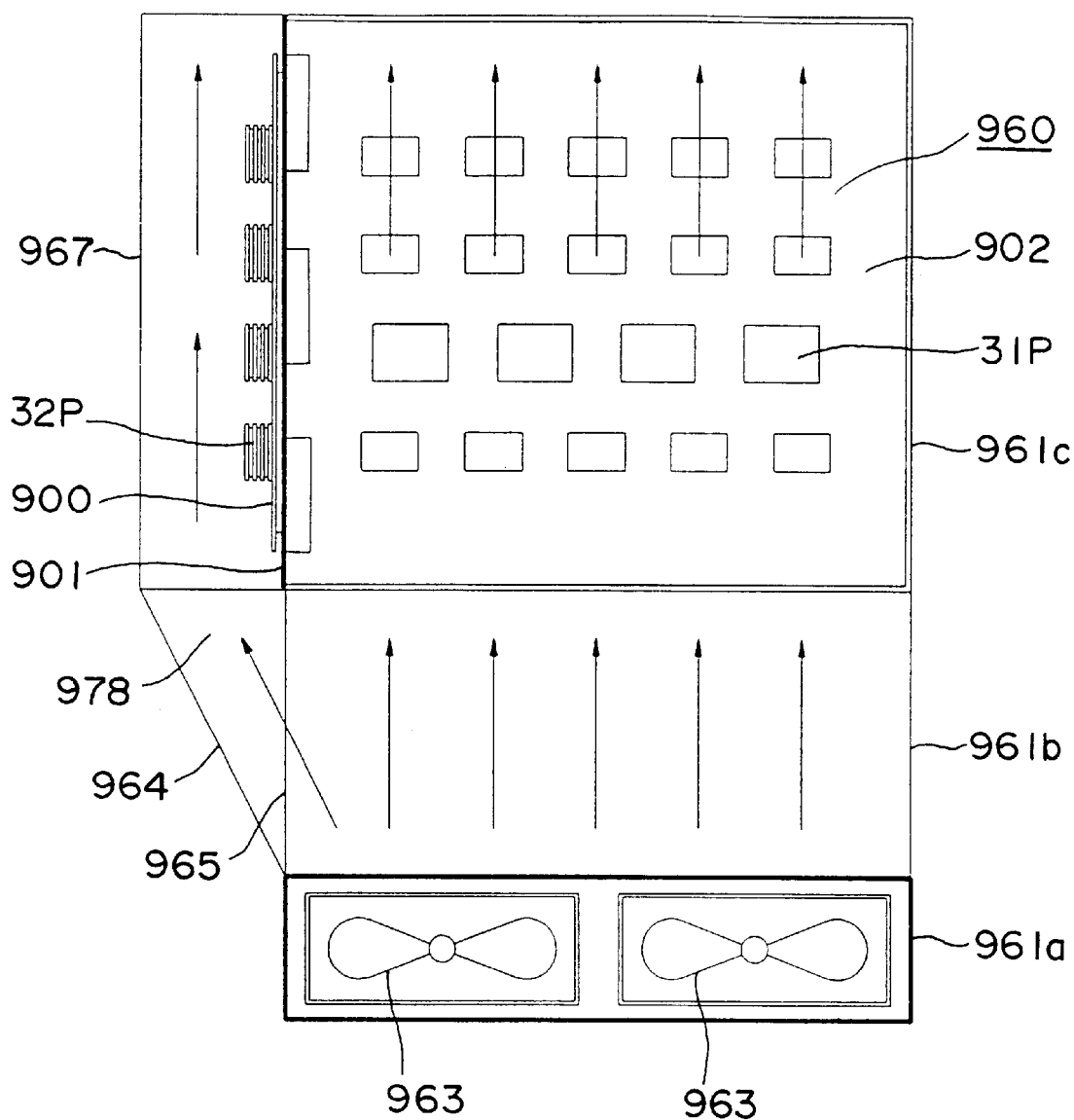
FIG. 26 is a side perspective view of the box body shown in FIG. 20.

In this state, a triangular space defined by the opening 965, the movable duct 964 and the duct 967 is closed by the bellows 978. Accordingly, as illustrated in FIG. 26, there is formed a cooling air path through which the interior of the lower air duct 961*b* communicates with the interior of the duct 967. Hence, when the PUSH-fans 963 are energized, the cooling air flows through the package unit 961*c*, and, simultaneously, some cooling air flows through the duct 967 via the opening 965. In this way, the circuit parts 32P of the common unit 32 packaged on the auxiliary board 900 covered with the duct 967 are cooled together with the circuit parts 31P packaged on each package board (e.g., the individual unit package board 902) housed in the package unit 961*c*.

In contrast with this, when maintaining and inspecting the circuit parts 32P of the common unit 32, the movable duct 964 is closed, and the set screw 979 is threaded into the fastening plate 980. As illustrated in FIG. 21, the opening 965 is closed, and cooling air cannot pass though the opening 965. Hence, all the cooling air blown by the PUSH-fans 963 run through within the package unit 961c, and consequently the cooling of the circuit parts 31P packaged on each package board (e.g., the individual unit package 902) housed in the package unit 961c is unaffected and continues as if the door 968 were closed.

For this reason, the cover 968 of the duct 967 can be opened without influencing the cooling of each package board. Then, the circuit parts 32P of the common unit 32 can be maintained and inspected through the opening 967b closed by this cover 968.

The upper air duct 961d shown in FIG. 27 is symmetrically configured between the upper and lower halves with respect to the lower air duct 961b. Hence, during normal operation, the movable duct is opened, and a cooling air path is formed through which the interior of the duct 967 communicates with the interior of the upper air duct 961d. Further, when maintaining and inspecting the circuit parts 32P of the common unit 32 in the package shelf 960 housed in one of the package units 961c, the movable duct 964 is closed, and the outside air is thereby prevented from being sucked in by the PULL-fans 962.

Note that when providing the standby system of the common unit 32 in the ninth embodiment, the duct 967 and the movable duct 964 must be provided separately to cool off the standby system.

Tenth Embodiment

The elements in the above-discussed separate configuration examples 1 to 4 of the individual unit and the common unit in the transmission line corresponding unit are packaged in the ATM switching equipment in accordance with this embodiment.

Figure 37:
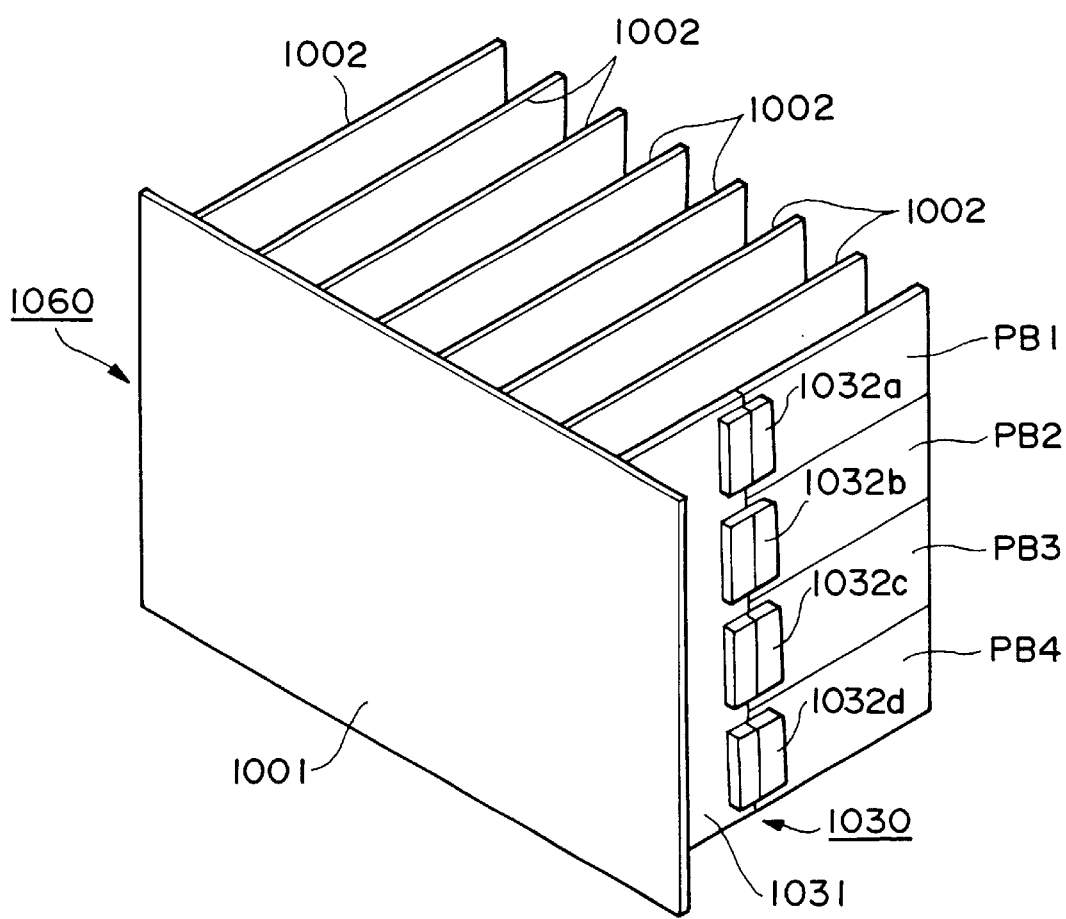
FIG. 37 is a perspective view illustrating a package shelf in a tenth embodiment of the present invention.

Referring to FIG. 37, a tenth embodiment is illustrated characterized by subdividing a common unit package board 1030 per service executed by the common unit 32.

More specifically, this common unit package board 1030 is constructed of a main board 1031 and four sheets of subboards PB1–PB4 detachably attached via connectors 1032 to the main board 1031. A basic processing unit 5B of a common unit 32B shown in FIG. 38 is packaged on this main board 1031. Further, a VC-SW internal identifier converting portion 185 shown in FIG. 38 is packaged on the first subboard PB1. Also, the UPC portion 14 illustrated in FIG. 38 is packaged on the second subboard PB2. The accounting portion 15 depicted in FIG. 38 is packaged on the third subboard PB3. A memory 186 for storing data used processing by the common unit 32 is packaged on the fourth subboard PB4.

As illustrated in FIGS. 37 and 38, a connector 1032a for connecting the main board 1031 to the first subboard PB1 incorporates a connector P1–P1' for connecting the output terminal of the multiplex/demultiplex portion 81 to the input terminal of the VC-SW internal identifier converting portion 185, a connector P2–P2' for connecting the output terminal of the VC-SW internal identifier converting portion 185 to the input terminal of the selector 6a and a connector P3–P3' for connecting the output terminal of the microprocessor 19 to the control terminal of the VC-SW internal identifier converting portion 185.

Similarly, a connector 1032b for connecting the main board 1031 to the second subboard PB2 incorporates a connector P4–P4' for connecting the output terminal of the selector 6a to the input terminal of the UPC portion 14, a connector P5–P5' for connecting the output terminal of the UPC portion 14 to the input terminal of the selector 6b and a connector P6–P6' for connecting the output terminal of the microprocessor 19 to the control terminal of the UPC portion 14.

Similarly, a connector 1032c for connecting the main board 1031 to the third subboard PB3 incorporates a connector P7–P7' for connecting the output terminal of the selector 6b to the input terminal of the accounting portion 15, a connector P8–P8' for connecting the output terminal of the accounting portion 15 to the input terminal of the selector 6c and a connector P9–P9' for connecting the output terminal of the microprocessor 19 to the control terminal of the accounting portion 15.

A connector 1032d for connecting the main board 1031 to the fourth subboard PB4 incorporates a connector P10–P10' for connecting a data input/output port of the microprocessor 19 to a data input/output port of the memory 186. A plurality of the PB4 are provided, of which each memory 186 contains data different from the others, and which are exchangeable according to the data demanded for the processing.

As discussed above, the subboards PB1–PB4 are attachable to and detachable from the main board 1031. The microprocessor 19 always recognizes whether or not each of the subboards PB1–PB4 is attached to the main board 1031. The respective selectors 6a–6c are switched over depending on this attached/detached state.

That is, when the first subboard PB1 is not connected to the main board 1031, the selector 6a selects an output of the VP-SW internal identifier converting portion 183. The VP-SW internal identifier converting portion 183 therefore performs VPI internal identifier conversion processing. On the other hand, when the first subboard PB1 is attached to the main board 1031, the selector 6a selects an output of the VC-SW internal identifier converting portion 185. The VC-SW internal identifier converting portion 185 therefore effects VCI internal identifier conversion processing.

Further, when the second subboard PB2 is not connected to the main board 1031, the selector 6b selects an output of the selector 6a, and, therefore, the UPC processing is not carried out. This arrangement performs a service for permitting the use of all the bands. On the other hand, when the second subboard PB2 is connected to the main board 1031, the selector 6b selects an output of the UPC portion 14, and hence the UPC portion 14 executes the UPC processing. That is, the user's band is managed.

Also, when the third subboard PB3 is not connected to the main board 1031, the selector 6b selects an output of the selector 6c, and consequently the accounting processing is not carried out. In this instance, a fixed charge is imposed without depending on a cell using quantity. If the third subboard PB3 is connected to the main board 1031, the selector 6c selects an output of the accounting portion 15. The accounting portion 15 thereby performs the accounting processing. That is, the charge is imposed based on the count number of the cells.

As explained above, according to the tenth embodiment, only the basic processing unit 5B of the common unit 32B is packaged on the main board 1031 connected directly to the board (BWB) 1001. The other added processing units 7A (the VC-SW internal identifier converting portion 185, the UPC portion 14 and the accounting portion 15) are packaged on the attachable/detachable subboards PB1–PB4. With this arrangement, if the subscriber's transmission line accommodated in the relevant transmission line corresponding unit 3 does not use one of the additional services offered by the respective added processing units 7A, the added processing unit 7A for permitting this unused additional service can be removed from the main board 1031 (the basic processing unit 5B) for each of the subboards PB1–PB4. Accordingly, an irreducible minimum amount of circuitry of the transmission line corresponding unit 3 is required.

Other configurations in the package shelf 1060 in the tenth embodiment discussed above are the same as those in the first embodiment, and hence the repetitive explanations thereof will be omitted.

Eleventh Embodiment

A transmission line corresponding unit 3A in the above-explained second type switching equipment is packaged in the ATM switching equipment in accordance with this embodiment.

Figure 39:
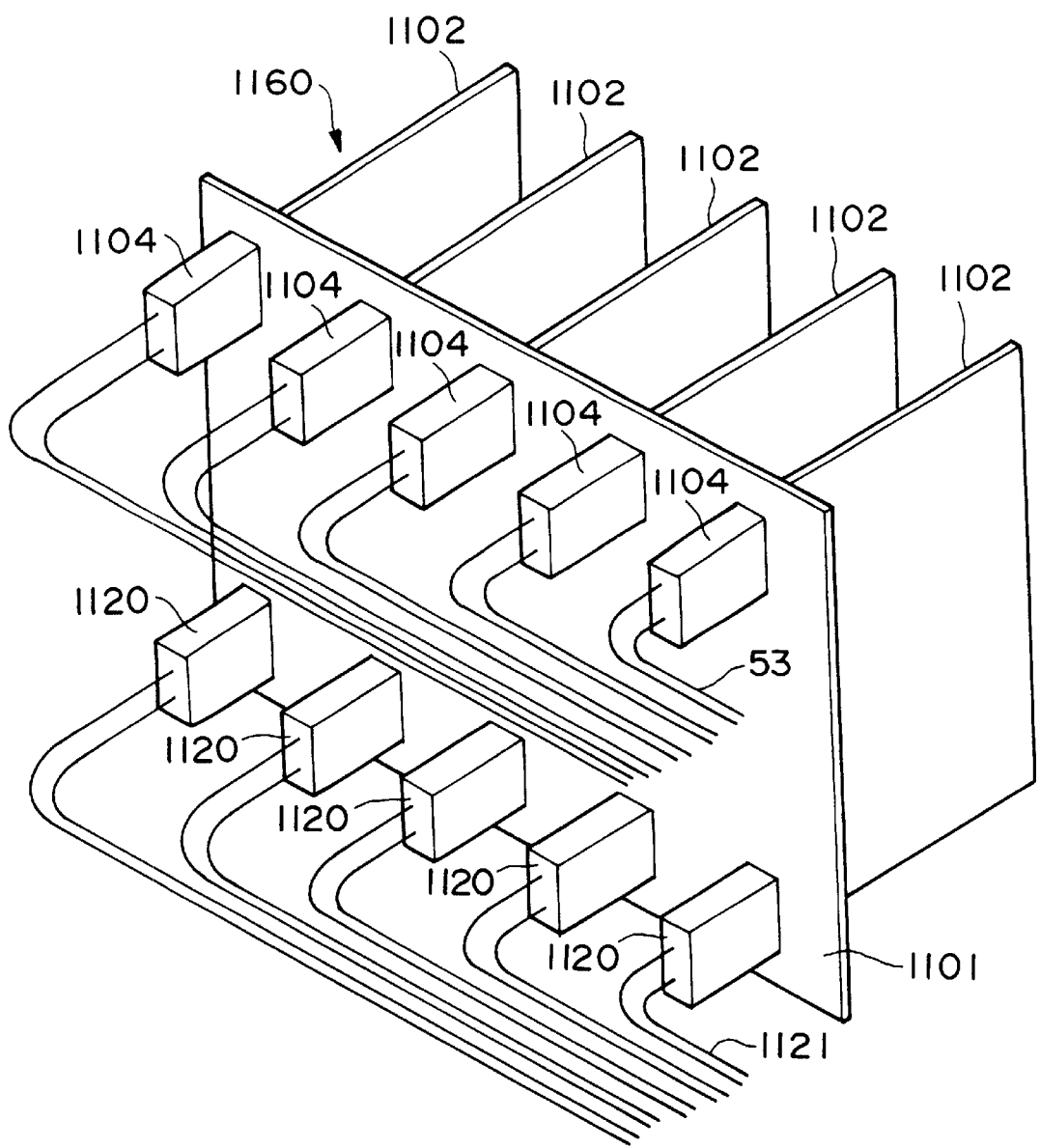
FIG. 39 is a perspective view illustrating a package shelf in an eleventh embodiment of the present invention.

Referring to FIG. 39, an eleventh embodiment is constructed so that the package boards mounted in parallel to each other but perpendicularly to a board (BWB) 1101 are transmission line corresponding unit oriented package boards 1102 each packaged with the transmission line corresponding unit 3A constructed as shown in FIG. 40.

More specifically, in accordance with this eleventh embodiment, five sheets of transmission line corresponding unit oriented package boards 1102 are connected to one sheet of board (BWB) 1101. Each transmission line corresponding unit oriented package board 1102 is packaged with one transmission line corresponding unit 3A shown in FIG. 40, and, therefore, it follows that one package shelf 1160 is packaged with five transmission line corresponding units 3A.

Each transmission line corresponding unit oriented package board 1102 is connected to the subscriber-side optical cable 53 through a subscriber-side optical module 1104. On the other hand, each transmission line corresponding unit oriented package board 1102 is connected to a switch-side optical cable 1121 through a switch-side optical module 1120. A detailed connecting structure between the optical modules 1104, 1120 and each of the transmission line corresponding unit oriented package boards 1102 is the same as the structure in the first embodiment, and hence its repetitive explanation will be omitted.

In accordance with this eleventh embodiment, even when a plurality of transmission line corresponding units 3A are prepared, the connecting structure in the construction of the bookshelf is simplified and no complicated configurations are necessary.

According to the first aspect of the present invention, the packaging structure of the optical module is based on the above construction, and it is therefore possible to package the optical modules without perforating the board and maintain the strength of the board. Besides, there is a wide degree of freedom of choice in the wiring on the board, and the wiring accommodatability can be kept high.

According to the second aspect of the present invention, when the electric circuits are packaged on the circuit board based on the bookshelf construction, the circuit elements exhibiting the comparatively high exothermic quantity are disposed outwardly of the bookshelf construction, and the cooling air can be directly brought into contact therewith. Therefore, these circuit elements can be cooled off relatively simply.

According to the third aspect of the present invention, since the path of the cooling air can be switched over, some circuit elements can be made available for maintenance and inspection without adversely affecting the introduction of cooling air to the other elements.

According to the fourth aspect of the present invention, if some of the circuit parts provide functions not being used, they can be easily removed from the transmission line corresponding unit of the ATM switching equipment.

It is apparent that, in the apparatus incorporating the principles of the present invention, a wide range of different working modes can be provided based on the invention without deviating from the spirit and scope of the invention. This invention is not restricted by its specific working modes except being limited by the appended claims.

What is claimed is:

1. A circuit board packaging structure comprising:

a plurality of circuit boards each packaged with electric circuit parts and disposed in parallel to each other, wherein a circuit board packaged with electric circuit parts exhibiting a larger exothermic quantity than those of the electric circuit parts packaged on other circuit boards of said plurality of circuit board is disposed outermost among said plurality of circuit boards and, at the same time, disposed so that the surface of the circuit board packed with the electric circuit parts exhibiting the larger exothermic quantity is directed outside;

a first cooling fan for flowing cooling air from outside of the structure along said plurality of circuit boards to cool off the electric circuit parts packaged on said plurality of circuit boards; and a second cooling fan for pulling said cooling air in a direction from said first cooling fan along said circuit board toward the outside of the structure.

2. A circuit board packaging structure according to claim 1, wherein the electric circuit parts include a transmission line corresponding unit of a switching equipment for accommodating a plurality of transmission lines and, at the same time, processing the data from each transmission line on a packet-basis.

3. A circuit board packaging structure according to claim 2, wherein said electric circuit parts are separated into a plurality of individual units, individually connected respectively to the plurality of transmission lines accommodated therein for individually processing packets, and separated into a common unit for batch-processing the packets processed by said individual units, each of said individual units and said common unit being mounted on a respective one of said plurality of circuit boards.

4. A circuit board packaging structure according to claim 3, wherein the electric circuit parts exhibiting the larger exothermic quantity are electric circuit parts constituting said common unit.

5. A circuit board packaging structure according to claim 4, further comprising another common unit, said two common units each having the same construction and provided respectively for active operation and standby operation.

6. A circuit board packaging structure according to claim 5, wherein said two common units are respectively packaged on separate circuit boards of said plurality of circuit boards, and said circuit boards packaged with said common units are disposed at both ends of said plurality of circuit boards.

7. A circuit board packaging structure according to claim 6, wherein said plurality of circuit boards are connected to a same connecting board, and an outer surface of said connecting board is provided with wires for connecting said common unit to each of said individual units.

8. A packaging structure of a circuit board according to claim 7, wherein said circuit boards packaged with said common units are connected to said connecting board in a rotationally symmetrical arrangement about an axis orthogonal to said connecting board, and said wires provided on the outer surface of said connecting board having the same rotational symmetry as that of said respective common units.

9. A circuit board packaging comprising:

a plurality of circuit boards each packaged with electric circuit parts and disposed in parallel to each other, wherein a circuit board packaged with electric circuit parts exhibiting a larger exothermic quantity than those of the electric circuit parts packaged on other circuit boards of said plurality of circuit board is disposed outermost among said plurality of circuit boards and, at the same time, disposed so that the surface of the circuit board packed with the electric circuit parts exhibiting the larger exothermic quantity is directed outside;

a first cooling fan for flowing cooling air along said plurality of circuit boards to cool off the electric circuit parts packaged on said plurality of circuit boards;

a plate for collecting cooling air from said first cooling fan, bended to gather air, disposed outside of said circuit board packed with the electric circuit parts exhibiting the larger exothermic quantity; and a second cooling fan for blowing said cooling air from said first cooling fan against said circuit board disposed outermost among said plurality of circuit boards from a direction perpendicular to said circuit board to cool off said electric circuit parts exhibiting the larger exothermic quantity, mounted on said plate.

* * * * *